US008895406B2

(12) United States Patent
Rogers et al.

(10) Patent No.: US 8,895,406 B2
(45) Date of Patent: Nov. 25, 2014

(54) RELEASE STRATEGIES FOR MAKING TRANSFERABLE SEMICONDUCTOR STRUCTURES, DEVICES AND DEVICE COMPONENTS

(75) Inventors: John A. Rogers, Champaign, IL (US);
Ralph G. Nuzzo, Champaign, IL (US);
Matthew Meitl, Raleigh, NC (US);
Heung Cho Ko, Urbana, IL (US);
Jongseung Yoon, Urbana, IL (US);
Etienne Menard, Durham, NC (US);
Alfred J. Baca, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 81 days.

(21) Appl. No.: 13/071,027

(22) Filed: Mar. 24, 2011

(65) Prior Publication Data

US 2011/0171813 A1   Jul. 14, 2011

Related U.S. Application Data

(63) Continuation of application No. 11/858,788, filed on Sep. 20, 2007, now Pat. No. 7,932,123.

(60) Provisional application No. 60/826,354, filed on Sep. 20, 2006, provisional application No. 60/944,653, filed on Jun. 18, 2007.

(51) Int. Cl.
*H01L 21/30* (2006.01)
*H01L 21/302* (2006.01)
(Continued)

(52) U.S. Cl.
CPC ............. *H01L 29/20* (2013.01); *H01L 33/0079* (2013.01); *Y02E 10/547* (2013.01);
(Continued)

(58) Field of Classification Search
USPC ........... 438/455, 585, 689, 761; 257/E21.214
See application file for complete search history.

(56) References Cited

U.S. PATENT DOCUMENTS

| 4,663,828 A | 5/1987 | Hanak |
| 4,761,335 A | 8/1988 | Aurichio et al. |

(Continued)

FOREIGN PATENT DOCUMENTS

| DE | 4241045 C1 | 5/1994 |
| JP | 2005-311333 | 11/2005 |

(Continued)

OTHER PUBLICATIONS

Ahn et al. (Jun. 2006) "High-Speed Mechanically Flexible Single-Crystal Silicon Thin-Film Transistors on Plastic Substrates," *IEEE Electron Dev. Lett.* 27(6):460-462.

(Continued)

*Primary Examiner* — Julio J Maldonado
*Assistant Examiner* — Cory Eskridge
(74) *Attorney, Agent, or Firm* — Lathrop & Gage LLP

(57) ABSTRACT

Provided are methods for making a device or device component by providing a multilayer structure having a plurality of functional layers and a plurality of release layers and releasing the functional layers from the multilayer structure by separating one or more of the release layers to generate a plurality of transferable structures. The transferable structures are printed onto a device substrate or device component supported by a device substrate. The methods and systems provide means for making high-quality and low-cost photovoltaic devices, transferable semiconductor structures, (opto-)electronic devices and device components.

22 Claims, 59 Drawing Sheets

Step 1: Define devices in multilayer structure (e.g. by photolithography and etching)

Step 2: Deposit and define devices lateral etch stops / posts (e.g. by CVD, photolithography, and etching)

Step 3: Release devices by selectively removing release layers e.g. by etching

Step 4: Sequentially remove layers of devices, e.g. using a rubber stamp, or relase into solution for printing.

Step 5: Apply a combination of etching and scrubbing (optionally polishing or grinding) to remove lateral etch stop/ anchoring posts from substrate.

Step 6 (optional): Grow multilayer on substrate; repeat steps 1 through 5

(51) Int. Cl.

| | | |
|---|---|---|
| *H01L 21/469* | (2006.01) | |
| *B82Y 10/00* | (2011.01) | |
| *B82Y 20/00* | (2011.01) | |
| *H01L 29/15* | (2006.01) | |
| *H01L 31/0687* | (2012.01) | |
| *H01L 31/0725* | (2012.01) | |
| *B81C 1/00* | (2006.01) | |
| *H01L 29/20* | (2006.01) | |
| *H01L 21/78* | (2006.01) | |
| *H01L 31/072* | (2012.01) | |
| *H01L 31/068* | (2012.01) | |
| *H01L 33/00* | (2010.01) | |

(52) U.S. Cl.
CPC .............. *B82Y 10/00* (2013.01); *B82Y 20/00* (2013.01); *H01L 29/155* (2013.01); *H01L 31/0687* (2013.01); *Y02E 10/544* (2013.01); *H01L 31/0725* (2013.01); *B81C 1/0046* (2013.01); *B81C 2201/0191* (2013.01); *H01L 21/7813* (2013.01); *H01L 31/072* (2013.01); *H01L 31/068* (2013.01)
USPC ............ 438/455; 438/689; 438/761; 438/584

(56) References Cited

U.S. PATENT DOCUMENTS

| | | | |
|---|---|---|---|
| 4,784,720 A | 11/1988 | Douglas | |
| 4,855,017 A | 8/1989 | Douglas | |
| 5,434,751 A | 7/1995 | Cole, Jr. et al. | |
| 5,501,893 A | 3/1996 | Laermer et al. | |
| 5,599,616 A | 2/1997 | Mack | |
| 6,057,212 A | 5/2000 | Chan et al. | |
| 6,277,712 B1 | 8/2001 | Kang et al. | |
| 6,316,283 B1 | 11/2001 | Saurer | |
| 6,569,701 B2 * | 5/2003 | Knieser et al. | 438/48 |
| 6,661,037 B2 | 12/2003 | Pan et al. | |
| 6,784,450 B2 | 8/2004 | Pan et al. | |
| 6,787,052 B1 | 9/2004 | Vaganov | |
| 6,858,518 B2 * | 2/2005 | Kondo | 438/458 |
| 6,900,094 B2 | 5/2005 | Hammond et al. | |
| 6,917,061 B2 | 7/2005 | Pan et al. | |
| 7,033,961 B1 | 4/2006 | Smart et al. | |
| 7,118,861 B1 | 10/2006 | Naaman et al. | |
| 7,169,546 B2 | 1/2007 | Suzuki et al. | |
| 7,186,624 B2 | 3/2007 | Welser et al. | |
| 7,195,733 B2 | 3/2007 | Rogers et al. | |
| 7,255,919 B2 | 8/2007 | Sakata et al. | |
| 7,399,693 B2 | 7/2008 | Sekiguchi et al. | |
| 7,425,523 B2 | 9/2008 | Ikemizu et al. | |
| 7,462,891 B2 | 12/2008 | Brar et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,700,402 B2 | 4/2010 | Wild et al. | |
| 7,704,684 B2 | 4/2010 | Rogers et al. | |
| 7,705,280 B2 | 4/2010 | Nuzzo et al. | |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 8,039,847 B2 | 10/2011 | Nuzzo et al. | |
| 8,242,025 B2 | 8/2012 | Kawashima et al. | |
| 2002/0020053 A1 * | 2/2002 | Fonash et al. | 29/623.1 |
| 2002/0115265 A1 * | 8/2002 | Iwafuchi et al. | 438/458 |
| 2003/0082485 A1 * | 5/2003 | Bulthaup et al. | 430/312 |
| 2003/0087476 A1 | 5/2003 | Oohata et al. | |
| 2003/0170946 A1 | 9/2003 | Kondo | |
| 2004/0012057 A1 * | 1/2004 | Bennett et al. | 257/414 |
| 2004/0014253 A1 | 1/2004 | Gupta et al. | |
| 2004/0099928 A1 * | 5/2004 | Nunan et al. | 257/640 |
| 2004/0252559 A1 | 12/2004 | Gupta | |
| 2005/0082526 A1 | 4/2005 | Bedell et al. | |
| 2005/0145596 A1 | 7/2005 | Metz et al. | |
| 2005/0167747 A1 | 8/2005 | Apel et al. | |
| 2005/0233546 A1 | 10/2005 | Oohata et al. | |
| 2005/0238967 A1 | 10/2005 | Rogers et al. | |
| 2006/0038182 A1 | 2/2006 | Rogers et al. | |
| 2006/0049485 A1 | 3/2006 | Pan et al. | |
| 2006/0063351 A1 | 3/2006 | Jain | |
| 2006/0085976 A1 | 4/2006 | Eldridge et al. | |
| 2006/0115917 A1 | 6/2006 | Linden | |
| 2006/0286488 A1 | 12/2006 | Rogers et al. | |
| 2006/0286785 A1 | 12/2006 | Rogers et al. | |
| 2007/0032089 A1 | 2/2007 | Nuzzo et al. | |
| 2008/0055581 A1 | 3/2008 | Rogers et al. | |
| 2008/0108171 A1 | 5/2008 | Rogers et al. | |
| 2008/0157235 A1 | 7/2008 | Rogers et al. | |
| 2008/0212102 A1 | 9/2008 | Nuzzo et al. | |
| 2009/0199960 A1 | 8/2009 | Nuzzo et al. | |
| 2009/0289246 A1 | 11/2009 | Schneider et al. | |
| 2009/0294803 A1 | 12/2009 | Nuzzo et al. | |
| 2010/0002402 A1 | 1/2010 | Rogers et al. | |
| 2010/0052112 A1 | 3/2010 | Rogers et al. | |
| 2010/0059863 A1 | 3/2010 | Rogers et al. | |
| 2010/0072577 A1 | 3/2010 | Nuzzo et al. | |
| 2010/0147370 A1 | 6/2010 | He et al. | |
| 2010/0317132 A1 | 12/2010 | Rogers et al. | |
| 2010/0317156 A1 * | 12/2010 | Tsurume et al. | 438/118 |
| 2011/0147715 A1 | 6/2011 | Rogers et al. | |
| 2011/0170225 A1 | 7/2011 | Rogers et al. | |
| 2011/0187798 A1 | 8/2011 | Rogers et al. | |
| 2011/0220890 A1 | 9/2011 | Nuzzo et al. | |
| 2011/0230747 A1 | 9/2011 | Rogers et al. | |
| 2011/0316120 A1 | 12/2011 | Rogers et al. | |

FOREIGN PATENT DOCUMENTS

| | | | |
|---|---|---|---|
| TW | 200710562 | 3/2007 | |
| TW | 200838553 | 10/2007 | |
| WO | WO 02/092778 | 11/2002 | |
| WO | WO 2005/054119 | 6/2005 | |
| WO | WO 2005/091370 | 9/2005 | |
| WO | WO2005/091370 A1 * | 9/2005 | ............ H01L 27/12 |
| WO | WO 2005/104756 | 11/2005 | |
| WO | WO 2005/122285 | 12/2005 | |
| WO | 2006/001285 | 1/2006 | |
| WO | WO 2006/130721 | 12/2006 | |
| WO | 2007/083570 | 7/2007 | |
| WO | WO 2007/126412 | 11/2007 | |
| WO | WO 2008/030666 | 3/2008 | |
| WO | WO 2008/030960 | 3/2008 | |
| WO | WO 2008/036837 | 3/2008 | |
| WO | WO 2008/055054 | 5/2008 | |
| WO | WO 2008/143635 | 11/2008 | |
| WO | WO 2009/011709 | 1/2009 | |
| WO | WO 2009/111641 | 9/2009 | |
| WO | WO 2010/005707 | 1/2010 | |
| WO | WO 2010/036807 | 4/2010 | |

OTHER PUBLICATIONS

Arnold et al. (2003) "Field-Effect Transistors Based on Single Semiconducting Oxide Nanobelts," *J. Phys. Chem. B* 107(3):659-663.
Ayón et al. (Jan. 1999) "Characterization of a Time Multiplexed Inductively Coupled Plasma Etcher," *J. Electrochem. Soc.* 146(1):339-349.
Bae et al. (Jul. 1, 2002) "Single-Crystalline Gallium Nitride Nanobelts," *Appl. Phys. Lett.* 81(1):126-128.
Bao et al. (1999) "Printable Organic and Polymeric Semiconducting Materials and Devices," *J. Mater. Chem.* 9:1895-1904.
Bett et al. (Aug. 1999) "III-V Compounds for Solar Cell Applications," *Appl. Phys. A. Mater. Sci.* 69(2):119-129.
Bhushan et al. (Nov. 2004) "Multiwalled Carbon Nanotube AFM Probes for Surface Characterization of Micro/Nanostructures," *Microsyst. Technol.* 10(8-9):633-639.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.

(56) References Cited

OTHER PUBLICATIONS

Cao et al. (2006) "Highly Bendable, Transparent Thin-Film Transistors That Use Carbon-Nanotube-Based Conductors and Semiconductors with Elastomeric Dielectrics," *Adv. Mater.* 18(3):304-309.
Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-275.
Choi et al. (2007) "Biaxially Stretchable 'Wavy' Silicon Nanomembranes," *Nano Lett.* 7(6):1655-1663.
Chou et al. (Jun. 8, 1999) "Micromachining on (111)-Oriented Silicon," *Sens. Actuators A* 75(3):271-277.
Dai et al. (2002) "Gallium Oxide Nanoribbons and Nanosheets," *J. Phys. Chem. B* 106(5):902-904.
Desai et al. (Feb. 1999) "Nanopore Technology for Biomedical Applications," *Biomed. Microdevices* 2(1):11-40.
Dimroth et al. (Mar. 2007) "High Efficiency Multijunction Solar Cells," *MRS Bull.* 32:230-235.
Ding et al. (Oct. 4, 2004) "Self Catalysis and Phase Transformation in the Formation of CdSe Nanosaws," *Adv. Mater.* 16(19):1740-1743.
English Translation (with attached original Chinese language version) of First Office Action for Chinese Patent Application No. 200780034881.7, issued Jul. 7, 2010, (foreign counterpart to U.S. Appl. No. 11/858,788).
Ensell, G. (1995) "Free Standing Single-Crystal Silicon Microstructures," *J. Micromech. Microeng.* 5:1-4.
Garcia et al. (2004) "Etchant Anisotropy Controls the Step Bunching Instability in KOH Etching of Silicon," *Phys. Rev. Lett.* 93(16):166102.
Holmes et al. (Feb. 25, 2000) "Control of Thickness and Orientation of Solution-Grown Silicon Nanowires," *Science* 287:1471-1473.
Hsia et al. (2005) "Collapse of Stamps for Soft Lithography Due to Interfacial Adhesion," *Appl. Phys. Lett.* 86:154106.
Hsu et al. (2003) "Nature of Electrical Contacts in a Metal—Molecule—Semiconductor System," *J. Vac. Sci. Technol. B* 21(4):1928-1935.
Huang et al. (2001) "Directed Assembly of One-Dimensional Nanostructures into Functional Networks," *Science* 291:630-633.
Huang et al. (2005) "Nanomechanical Architecture of Strained Bilayer Thin Films: From Design Principles to Experimental Fabrication," *Adv. Mater.* 17(23):2860-2864.
Huang et al. (2005) "Stamp Collapse in Soft Lithography," *Langmuir* 21:8058-8068.
Huie et al. (2003) "Guided Molecular Self-Assembly: A Review of Recent Efforts," *Smart Mater. Struct.* 12:264-271.
Hur et al. (2005) "Organic Nanodielectrics for Low Voltage Carbon Nanotube Thin Film Transistors and Complementary Logic Gates," *J. Am. Chem. Soc.* 127:13808-13809.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-.
Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
International Search Report and Written Opinion, Corresponding to International Application No. PCT/US07/79070, Mailed Apr. 23, 2008.
Jeon et al. (2004) "Fabricating Complex Three-Dimensional Nanostructures with High Resolution Conformable Phase Masks," *Proc. Natl. Acad. Sci. USA* 101:12428-12433.
Jeon et al. (Aug. 4, 2004) "Three Dimensional Nanofabrication with Rubber Stamps and Conformable Photomasks," *Adv. Mater.* 16(15):1369-1375.
Joo et al. (2006) "Low-Temperature Solution-Phase Synthesis of Quantum Well Structures CdSe Nanoribbons," *J. Am. Chem. Soc.* 128(17):5632-5633.
Kang et al. (2007) "High-Performance Electronics Using Dense, Perfectly Aligned Arrays of Single-Walled Carbon Nanotubes," *Nat. Nanotechnol.* 2:230-236.
Kar et al. (2005) "Controlled Synthesis and Photoluminescence Properties of ZnS Nanowires and Nanoribbons," *J. Phys. Chem. B* 109(8):3298-3302.
Kar et al. (2005) "Synthesis and Optical Properties of CdS Nanoribbons," *J. Phys. Chem B.* 109(41):19134-19138.
Kar et al. (2006) "Shape Selective Growth of CdS One-Dimensional Nanostructures by a Thermal Evaporation Process," *J. Phys. Chem. B.* 110(10):4542-4547.
Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.
Kendall, D.L. (1979) "Vertical Etching of Silicon at Very High Aspect Ratios," *Ann. Rev. Mater. Sci.* 9:373-403.
Khang et al. (2006) "A Stretchable Form of Single-Crystal Silicon for High-Performance Electronics on Rubber Substraights," *Science* 311:208-212.
Ko et al. (2006) "Bulk Quantities of Single-Crystal Silicon Micro-/Nanoribbons Generated from Bulk Wafers," *Nano Lett.* 6(10):2318-2324.
Kocabas et al. (2005) "Guided Growth of Large-Scale, Horizontally Aligned Arrays of Single-Walled Carbon Nanotubes and Their Use in Thin-Film Transistors," *Small* 1(11):1110-1116.
Kocabas et al. (2006) "Spatially Selective Guided Growth of High-Coverage Arrays and Random Networks of Single-Walled Carbon Nanotubes and Their Integration into Electronic Devices," *J. Am. Chem. Soc.* 128:4540-4541.
Konagai et al. (1978) "High Efficiency GaAs Thin Film Solar Cells by Peeled Film Technology," *J. Cryst. Growth* 45:277-280.
Kong et al. (Oct. 2003) "Structure of Indium Oxide Nanobelts," *Solid State Commun.* 128(1):1-4.
Lee et al. (2004)"Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexible Optoelectronic Systems," *Small* 1:1164-1168.
Lee et al. (2005) "Large-Area, Selective Transfer of Microstructured Silicon (μs-Si): A Printing-Based Approach to High-Performance Thin0Film Transistors Supported on Flexible Substraights," *Adv. Mater.* 17:2332-2336.
Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.
Létant et al. (Jun. 2003) "Functionalized Silicon Membranes for Selective Bio-Organisms Capture," *Nat. Mater.* 2:391-395.
Li et al. (2006) "Catalyst-Assisted Formation of Nanocantilever Arrays on ZnS Nanoribbons by Post-Annealing Treatment," *J. Phys. Chem. B* 110(13):6759-6762.
Li et al. (Jul. 1, 2002) "ZnO Nanobelts Grown on Si Substrate," *Appl. Phys. Lett.* 81:144-146.
Loo et al. (2002) "Additive, Nanoscale Patterning of Metal Films with a Stamp and a Surface Chemistry Mediated Transfer Process: Applications in Plastic Electronics," *Appl. Physics Lett.* 81:562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Loo et al. (2003) "Electrical Contacts to Molecular Layers by Nanotransfer Printing," *Nano Lett.* 3(7):913-917.
Lu et al. (Jul. 19, 2005) "One Dimensional Hole Gas in Germanium/Silicon Nanowire Heterostructures," *Proc. Nat. Acad. Sci. USA* 102(29):10046-10051.
Ma et al. (2004) "Single-Crystal CdSe Nanosaws," *J. Am. Chem. Soc.* 126(3):708-709.
Mack et al. (2006) "Mechanically Flexible Thin-Film Transistors that Use Ultrathin Ribbons of Silicon Derived from Bulk Wafers," *Appl. Phys. Lett.* 88:213101.

(56) References Cited

OTHER PUBLICATIONS

Madou, M. (1997) "Etch-Stop Techniques," In; *Fundamentals of Microfabrication*, CRC Press, New York, pp. 177-187.
Meitl et al. (2004) "Solution Casting and Transfer Printing Single-Walled Carbon Nanotube Films," *Nano Lett.* 4(9):1643-1947.
Meitl et al. (2006) "Transfer Printing by Kinetic Control of Adhesion to an Elastomeric Stamp," *Nat. Mater.* 5:33-38.
Menard et al. (2004) "A Printable Form of Silicon for High Performance Thin Film Transistors on Plastic Substrates," *Appl. Phys. Lett.* 84:5398-5400.
Menard et al. (2004) "High-Performance n- and p-Type Single-Crystal Organic Transistors with Free-Space Gate Dielectrics," *Adv. Mat.* 16:2097-2101.
Menard et al. (2004) "Improved Surface Chemistries, Thin Film Deposition Techniques, and Stamp Designs for Nanotransfer Printing," *Langmuir* 20:6871-6878.
Menard et al. (2005) Bendable Single Crystal Silicon Thin Film Transistors Formed by Printing on Plastic Substrates *Appl. Phys. Lett.* 86:093507.
Mirkin et al. (Jul. 2001) "Emerging Methods for Micro- and Nanofabrication," *MRS Bull.* 26(7):506-507.
Pan et al. (Mar. 9, 2001) "Nanobelts of Semiconducting Oxides," *Science* 291:1947-1949.
Podzorov et al. (2005) "Hall Effect in the Accumulation Layers on the Surface of Organic Semiconductors," *Phys. Rev. Lett.* 95:226601.
Razouk et al. (Sep. 1979) "Dependence of Interface State Density on Silicon Thermal Oxidation Process Variables," *J. Electrochem. Soc.* 126(9):1573-1581.
Roberts et al. (Mar. 2006) "Elastically Relaxed Free-Standing Strained-Silicon Nanomembranes," *Nat. Mater.* 5:388-393.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) Printing Process Suitable for Reel-to-Reel Production of High-Performance Organic Transistors and Circuits, *Adv. Mater.* 11(9):741-745.
Rogers et al. (2000) "Organic Smart Pixels and Complementary Inverter Circuits Formed on Plastic Substrates by Casting and Rubber Stamping," *IEEE Electron Dev. Lett.* 21(3):100-103.
Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Schermer et al. (Web Release Apr. 28, 2005) "Thin-Film GaAs Epitaxial Lift-Off Solar Cells for Space Applications," *Prog. Photovoltaics: Res. Applic.* 13:587-596.
Schermer et al. (Web Release Jan. 19, 2006) "Photon Confinement in High-Efficiency, Thin-Film III-V Solar Cells Obtained by Epitaxial Lift-Off," *Thin Solid Films* 511-512:645-653.
Search Report and Written Opinion Corresponding to Singapore Application No. 200901451-5, Mailed Dec. 22, 2010.
Shan et al. (2004) "From Si Source Gas Directly to Positioned, Electrically Contained Si Nanowires: The Self-Assembling 'Grow-in-Place' Approach," *Nano Lett.* 4(11):2085-2089.
Shi et al. (2001) "Free-Standing Single Crystal Silicon Nanoribbons," *J. Am. Chem. Soc.* 123(44):11095-11096.
Shi et al. (Sep. 2000) "Synthesis of Large Areas of Highly Oriented, Very Long Silicon Nanowires," *Adv. Mater.* 12(18):1343-1345.
Smith et al. (2000) "Electric-Field Assisted Assembly and Alignment of Metallic Nanowires," *Appl. Phys. Lett.* 77(9):1399-1401.
Storm et al. (Aug. 2003) "Fabrication of Solid-State Nanopores with Single-Nanometre Precision," *Nat. Mater.* 2:537-540.
Streetman et al. (2000) *Solid State Electronic Devices*, $5^{th}$ Ed., Prentice Hall; Upper Saddle River, NJ; pp. 274-275.
Sun et al. (2004) "Fabricating Semiconductor Nano/Microwires and Transfer Printing Ordered Arrays of them onto Plastic Substrates," *Nano Lett.* 4:1953-1959.
Sun et al. (2005) "Bendable GaAs Metal-Semiconductor Field-Effect Transistors Formed with a Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Funct. Mater.* 15:30-40.
Sun et al. (2007) "Controlled Buckling of Semiconductor Nanoribbons for Stretchable Electronics," *Nat. Nanotechnol.* 1:201-207.
Sun et al. (Nov. 2006) "Buckled and Wavy Ribbons of GaAs for High-Performance Electronics on Elastomeric Substrates," *Adv. Mater.* 18(21):2857-2862.
Sundar et al. (2004) "Elastomeric Transistor Stamps: Reversible Probing of Charge Transport in Organic Crystals," *Science* 303:1644-1646.
Takamoto et al. (Jan. 20, 1997) "Over 30% Efficient InGaP/GaAs Tandem Solar Cells," *Appl. Phys. Lett.* 70(3):381-383.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Wagner et al. (Mar. 1, 1964) "Vapor-Liquid-Solid Mechanism of Single Crystal Growth," *Appl. Phys. Lett.* 4(5):89-90.
Wang et al. (2006) "Direct Synthesis and Characterization of CdS Nanobelts," *Appl. Phys. Lett.* 89:033102.
Wen et al. (Web Release Dec. 4, 2004) "Controlled Growth of Large-Area, Uniform, Vertically Aligned Arrays of $\alpha$-$Fe_2O_2$ Nanobelts and Nanowires," *J. Phys. Chem. B* 109(1):215-220.
Whang et al. (2003) "Large-Scale Hierarchial Organization of Nanowire Arrays for Integrated Nanosystems," *Nano Lett.* 3(9):1255-1259.
Wu et al. (2001) "Direct Observation of Vapor-Liquid-Solid Nanowire Growth," *J. Am. Chem. Soc.* 123(13):3165-3166.
Wu et al. (2002) "Block-by-Block Growth of Single-Crystalline Si/SiGe Superlattice Nanowires," *Nano Lett.* 2(2):83-86.
Wu et al. (Jul. 1, 2004) "Single-Crystal Metallic Nanowires and Metal/Semiconductor Nanowire Heterostructures," *Nature* 430:61-65.
Xia et al. (1999) "Unconventional Methods for Fabricating and Patterning Nanostructures," *Chem. Rev.* 99:1823-1848.
Xiang et al. (May 25, 2006) "Ge/Si Nanowire Heterostructures as High-Performance Field-Effect Transistors," *Nature* 441:489-493.
Xie et al. (May 2003) "Polymer-Controlled Growth of $Sb_2Se_3$ Nanoribbons Via a Hydrothermal Process," *J. Cryst. Growth* 252(4):570-574.
Yu et al. (2000) "Silicon Nanowires: Preparation, Device Fabrication, and Transport Properties," *J. Phys. Chem. B* 104(50):11864-11870.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (Jul. 2003) "Three-Dimensional and Multilayer Nanostructures Formed by Nanotransfer Printing," *Nano Lett.* 3(9):1223-1227.
Zhang et al. (2005) "Low-Temperature Growth and Photoluminescence Property of ZnS Nanoribbons," *J. Phys. Chem. B* 109(39):18352-18355.
Zhang et al. (2006) "Anomalous Coiling of SiGe/Si and SiGe/Si/Cr Helical Nanobelts," *Nano Lett.* 6(7):1311-1317.
Zhang et al. (Apr. 2003) "Oxide-Assisted Growth of Semiconducting Nanowires," *Adv. Mater.* 15(7-8):635-640.
Zhang et al. (Apr. 5, 2004) "Structure and Photoluminescence of ZnSe Nanoribbons Grown by Metal Organic Chemical Vapor Deposition," *Appl. Phys. Lett.* 84(14):2641-2643.

(56) References Cited

OTHER PUBLICATIONS

Zhang et al. (Feb. 9, 2006) "Electronic Transport in Nanometre-Scale Silicon-on-Insulator Membranes," *Nature* 439:703-706.

Zhou et al. (2004) "p-Channel, n-Channel Thin Film Transistors and p-n Diodes Based on Single Wall Carbon Nanotube Networks," *Nano Lett.* 4:2031-2035.

Zhu et al. (2005) "Spin on Dopants for High-Performance Single-Crystal Silicon Transistors on Flexible Plastic Substrates," *Appl. Phys. Lett.* 86:133507.

Office Action corresponding to USPTO Office Action for U.S. Appl. No. 13/228,041 issued Apr. 19, 2013.

Office Action corresponding to Chinese Patent Application No. 200780034881.7 issued Feb. 16, 2012; includes English Translation.

Notice of Reasons for Rejection corresponding to Japanese Patent Application No. P2009-529401, dispatched Jan. 15, 2013; includes English Translation.

Search Report corresponding to European Patent Application No. 07 84 2903.2, dispatched Feb. 24, 2014.

Notice of Reasons for Rejection corresponding to Japanese Patent Application No. P2013-144886, Dispatched Jul. 8, 2014 (includes English translation).

\* cited by examiner

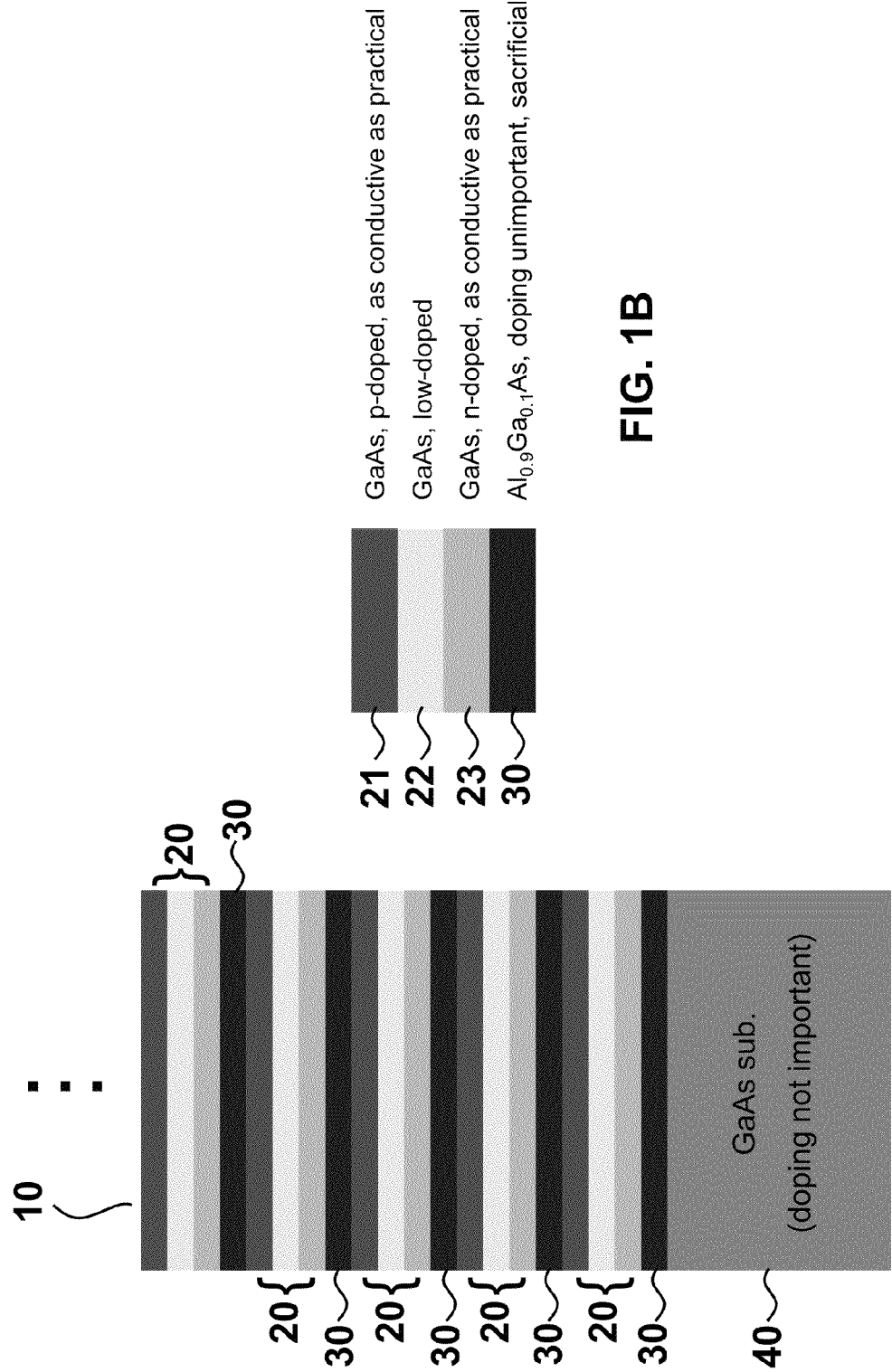

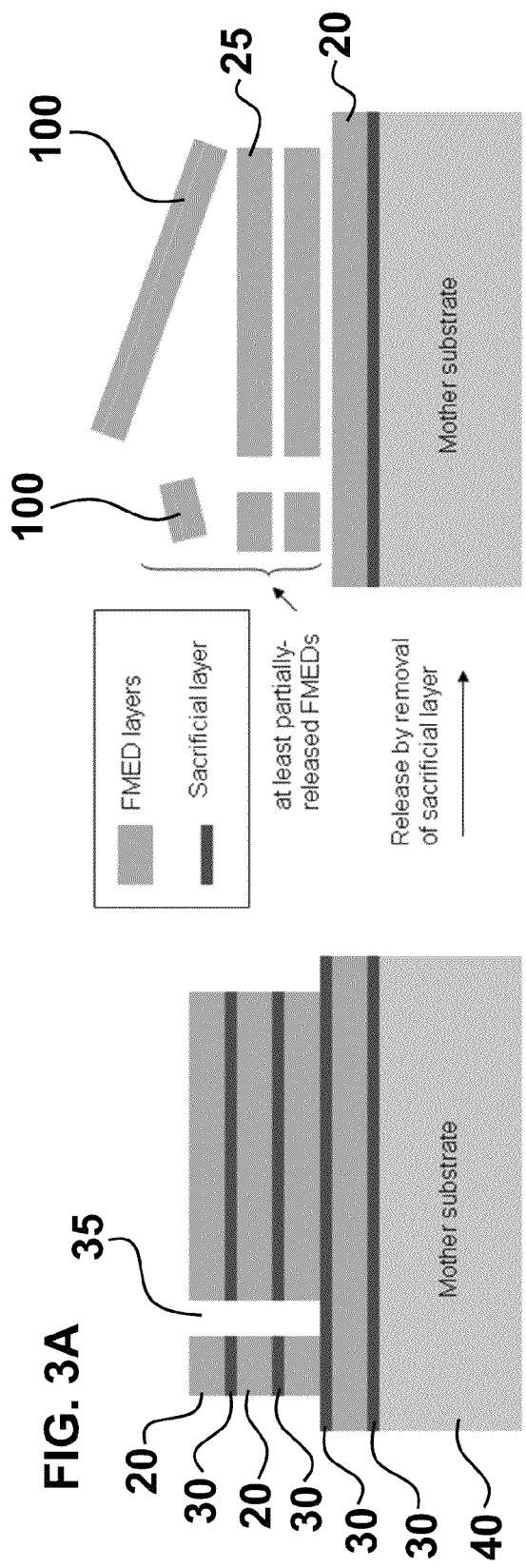
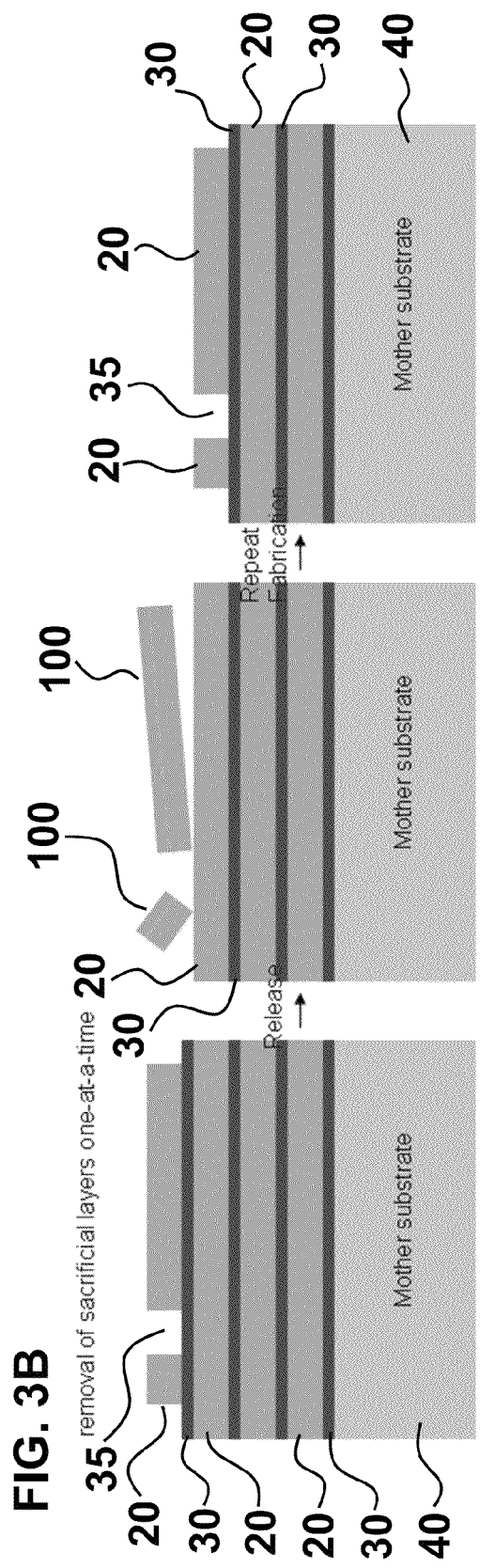

Process flow 1: release of FMEDs for photovoltaics, "multiple-layers-at-a-time" with optional re-use of substrate

See also FIG. 3A

Here shown for epitaxially grown semiconductors. Also works for amorphous or polycrystalline materials similar to what's described in FIG. 12 (process flow 6)

1. obtain GaAs substrate

2. Grow epilayers described by FIG. 3C on GaAs substrate by MOCVD, MBE, etc. (similar process for FIGs 3D and 3E for transistors, LEDs, respectively). Pre-treat substrate prior to growth as needed (CMP may be required, but not likely. Likely will need to grow ~200 nm buffer layer of GaAs adjacent to substrate before functional and sacrificial layers).

3. mask portion of the surface of the top epilayer with $SiO_2$ by Plasma-Enhanced Chemical Vapor Deposition (PECVD) and some form of lithography for patterning.

4. Etch unmasked regions of epilayers using Cl/Ar/H plasma from surface to some distance into any $Al_{0.96}Ga_{0.04}As$ sacrificial layer (for example, into the sacrificial layer closest to the substrate). The sacrificial layer should not be the one farthest from the substrate (in that case, the release would happen "one-at-a-time" as in FIG. 5 (process flow 2)).

5. Expose the substrate to concentrated HF to at least partially remove the exposed sacrificial layers and release the functional epilayers above the sacrificial layers by lateral undercutting. (HF attacks the functional epilayers more slowly (less than 1/10 etch rate) than it does the sacrificial layer.)

6. Separate the released FMEDs from substrate by stamping or do solvent exchange for fluidic assembly or ink jet printing, electrospinning, etc.

7. use HF to remove any remaining portions of the sacrificial layers; wash/rub away any remaining portions of the overlying functional epilayers (anchoring structures, etc.) the Functional layers that were originally directly underneath the first sacrificial layer are now exposed and on the surface of the substrate 8. Repeat steps 3 through 7, releasing sets of functional layers (each set separated by sacrificial layers) one set at a time until no sacrificial layers remain on the substrate.

9. (optional, for re-use of substrate) Repeat steps 2 through 8 as desired.

FIG. 4

Process flow 2: release of FMEDs for photovoltaics, "one-layer-at-a-time" with optional re-use of substrate
See also FIG. 3B.
Here shown for epitaxially grown semiconductors. Also works for amorphous or polycrystalline materials similar to what's described in process flow 6

1. obtain GaAs substrate

2. Grow epilayers described by FIG. 3C on GaAs substrate by MOCVD, MBE, etc. (similar process for FIGs 3D and 3E for transistors, LEDs, respectively) Pre-treat substrate prior to growth as needed (CMP may be required, but not likely. Likely will need to grow ~200 nm buffer layer of GaAs adjacent to substrate before functional and sacrificial layers).

3. mask portion of the surface of the top epilayer with ~500 nm of $SiO_2$ by Plasma-Enhanced Chemical Vapor Deposition (PECVD) and some form of lithography for patterning.

4. Etch unmasked regions of epilayers using Cl/Ar/H plasma from surface to some distance into the first $Al_{0.96}Ga_{0.04}As$ sacrificial layer.

5. Expose the substrate to concentrated HF to at least partially remove the exposed sacrificial layer (one) and release the epilayers above the sacrificial layer (functional layers) by lateral undercutting. (HF attacks the functional epilayers more slowly (less than 1/10 etch rate) than it does the sacrificial layer.)

6. Separate the released FMEDs from substrate by stamping or do solvent exchange for fluidic assembly or ink jet printing, electrospinning, etc.

7. use HF to remove any remaining portions of the sacrificial layer; wash/rub away any remaining portions of the overlying functional epilayers (anchoring structures, etc.) the Functional layers that were originally directly underneath the first sacrificial layer are now exposed and on the surface of the substrate 8. Repeat steps 3 through 7, releasing individual functional layers (each layer separated by sacrificial layers) one layer at a time until no sacrificial layers remain on the substrate.

9. (optional, for re-use of substrate) Repeat steps 2 through 8 as desired.

FIG. 5

Process flow 4: release of FMEDs for LEDs by laser ablation
See also FIG. 6 (from: Tan, B. S., Yuan, S. & Kang, X. J. Performance enhancement of InGaN light-emitting diodes by laser lift-off and transfer from sapphire to copper substrate. Applied Physics Letters 84, 2757-2759 (2004)).

1. obtain GaN/InGaN on sapphire substrate similar to that shown in FIG. 6B.

2. mask portion of the surface of the top epilayer with $SiO_2$ by Plasma-Enhanced Chemical Vapor Deposition (PECVD) and some form of lithography for patterning.

3. Etch unmasked regions of epilayers using $BCl_3$/Cl/Ar/H plasma from surface through epilayers 4. Expose some portion of the epilayers through sapphire substrate with KrF laser (248 nm) to decompose the GaN adjacent to the sapphire to Ga (metal) and $N_2$ (gas).

5. Heat the substrate to 30°C, thereby (combined with step 4) releasing at least a portion of the epilayers from the substrate.

6. Separate the released FMEDs from substrate by stamping or perform solvent exchange for fluidic assembly or ink jet printing, electrospinning, etc.

FIG. 6C

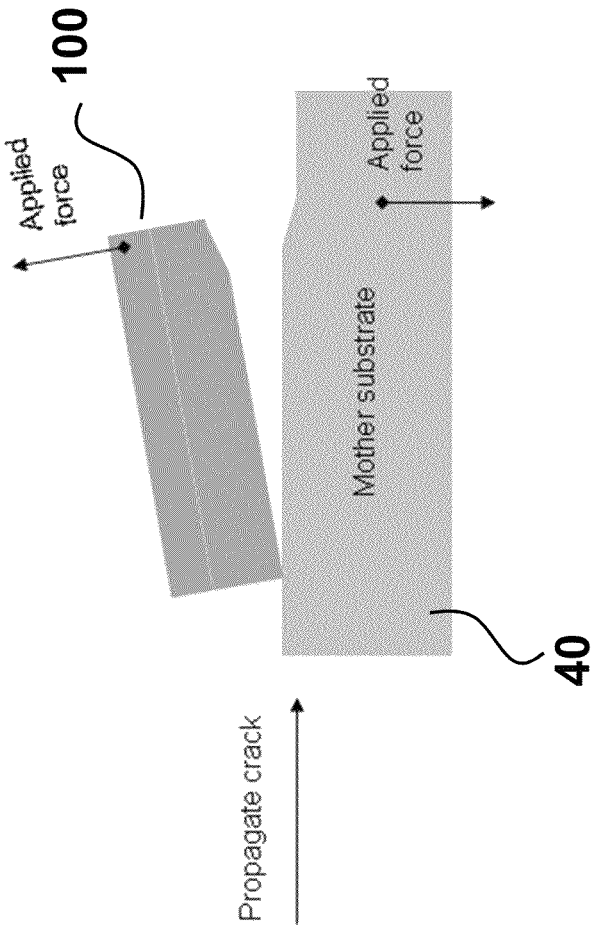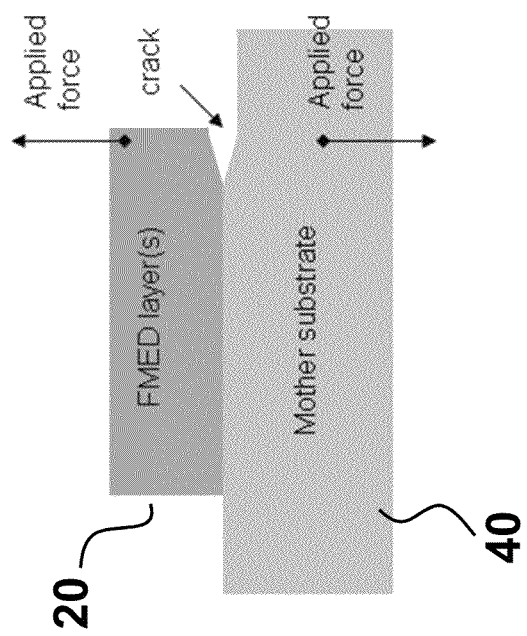
FIG. 7A

Process flow 7: release of FMEDs by propagating a crack introduced by chemical means.
See also FIG. 7A 1. obtain silicon substrate 2. deposit $SiO_2$ by PECVD on substrate 3. do photolithography and wet etching in buffered oxide etch (BOE) to generate sloped sidewalls in $SiO_2$ features (see FIG. 11)

4. do photolithography and evaporation (lift-off) to deposit about 100 nm of gold across gaps between $SiO_2$ features, overlapping them, as shown in FIG. 11.

5. remove remaining $SiO_2$ using BOE or HF to introduce cracks chemically.

6. apply mechanical force to gold film (with stamps, tweezers, etc.) to separate gold film from substrate

FIG. 7B

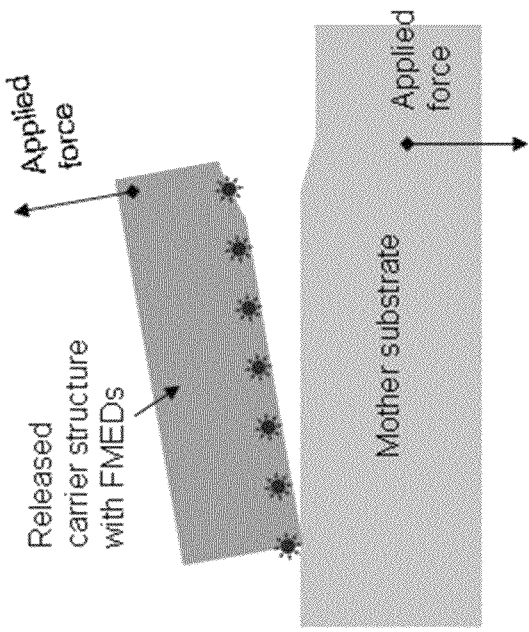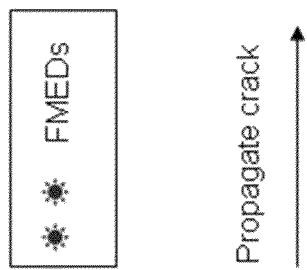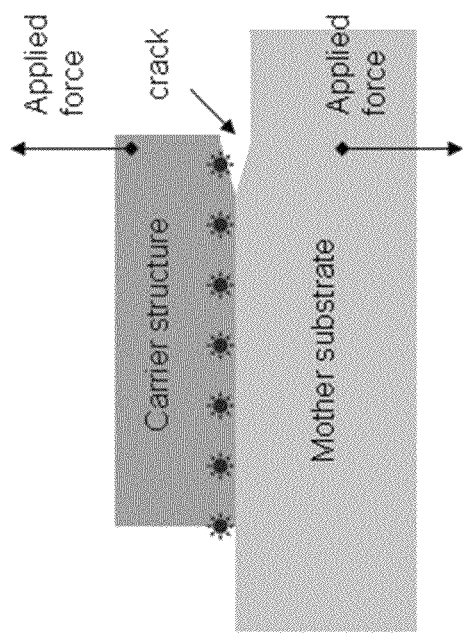
FIG. 8A

Process flow 5: release of FMEDs (array of SWNTs) using a carrier film and the separation of a crack introduced mechanically
See FIGs 7A and 8A 1. obtain substrate with structure described by FIG. 8B by growing SWNTs on quartz by CVD, then evaporating Au, then spinning on polymer. The polymer and the gold make-up the carrier film for the FMEDs (SWNTs).

2. use a razor blade to cut a line through the polymer and gold film to the quartz substrate, thereby introducing a crack 3. separate the carrier film and the SWNT array by applying a mechanical force via a PDMS stamp, tweezers, etc.

FIG. 8C

Process flow 6: release of amorphous or polycrystalline FMED structures by removal of sacrificial layers. See also FIG. 3B.

Can be done multiple layers at a time similar to FIG. 4 (process flow 1); here described as "one-layer-at-a time" similar to FIG. 5 (process flow 2).

1. obtain Si substrate
2. Grow layers described by FIG. 10 by sequential evaporation or CVD.
3. mask portion of the surface of the top layer with photoresist and some form of lithography for patterning.
4. Etch unmasked regions of top layer using the appropriate wet or dry etching to etch the functional material (e.g. KI/I$_2$/H$_2$O for Au, oxygen plasma for diamond).
5. Expose the substrate to concentrated HF to at least partially remove the exposed sacrificial layer (SiO$_2$) and release the functional materials above the sacrificial layer (functional layers) by lateral undercutting. (HF attacks the functional functional materials (noble metals, diamond, silicon) more slowly (less than 1/10 etch rate) than it does the sacrificial layer.)
6. Separate the released FMEDs from substrate by stamping or do solvent exchange for fluidic assembly or ink jet printing, electrospinning, etc.
7. use HF to remove any remaining portions of the sacrificial layer; wash/rub away any remaining portions of the overlying functional epilayers (anchoring structures, etc.) the Functional layers that were originally directly underneath the first sacrificial layer are now exposed and on the surface of the substrate
8. Repeat steps 3 through 7, releasing sets of functional layers (each set separated by sacrificial layers) one at a time until no sacrificial layers remain on the substrate.
9. (optional, for re-use of substrate) Repeat steps 2 through 8 as desired.

FIG. 12

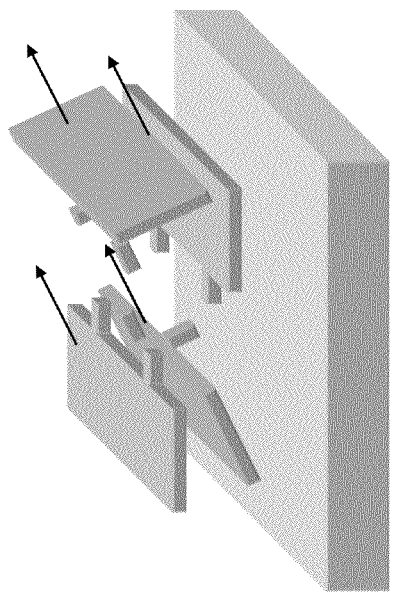
Step 5: Apply a combination of etching, scrubbing, and optionally polishing, to remove anchoring structures from substrate
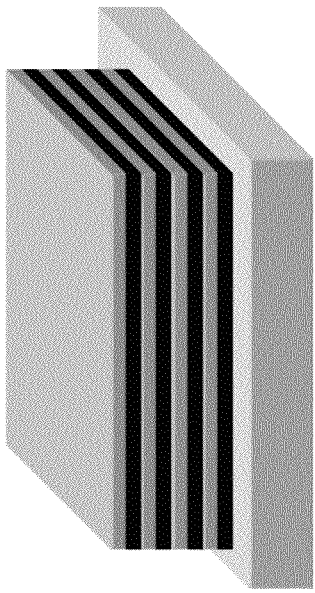
Step 6: *(optional)* Re-grow multilayer stack. The system is now ready for repetition of steps 1 through 5
FIG. 19 (cont'd)

Step 5: Repeat steps 1 through 4 until all functional layers and release layers are removed from substrate
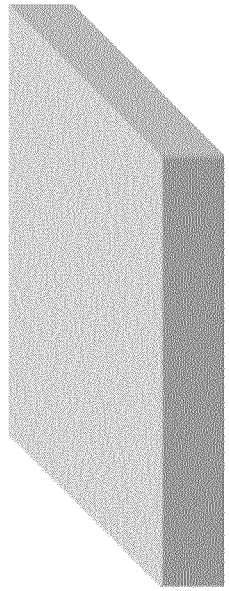
Step 6: *(optional)* Re-grow multilayer stack. The system is now ready for repetition of steps 1 through 5
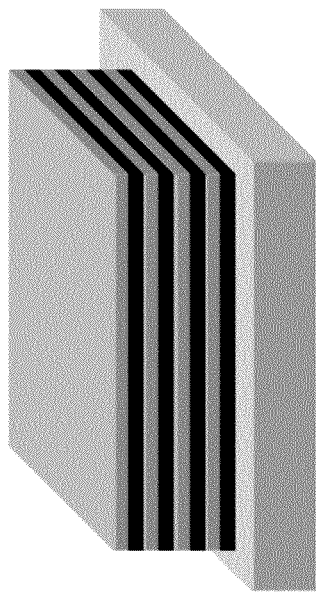
FIG. 20 (cont'd)

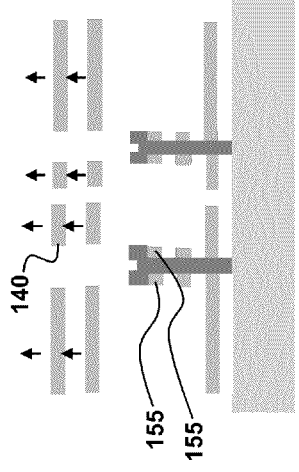
Step 4: Sequentially remove layers of devices, e.g. using a rubber stamp, or release into solution for printing.
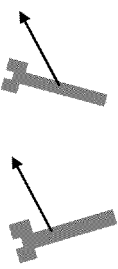
Step 5: Apply a combination of etching and scrubbing (optionally polishing or grinding) to remove lateral etch stop/ anchoring posts from substrate.
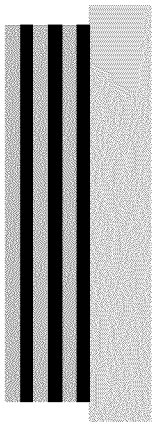
Step 6 (optional): Grow multilayer on substrate; repeat steps 1 through 5
FIG. 21 (cont'd)

Step 4: Remove released devices, e.g. using a rubber stamp, or relase into solution for printing.
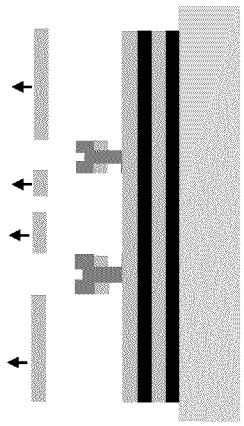
Step 5: Apply a combination of etching and scrubbing to remove lateral etch stop/ anchoring posts from substrate.
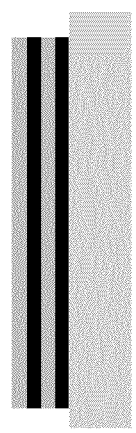
Step 6 : repeat steps 1 through 5 until multilayer is entirely removed from substrate; optionally grow new multilayer stack and repeat steps.
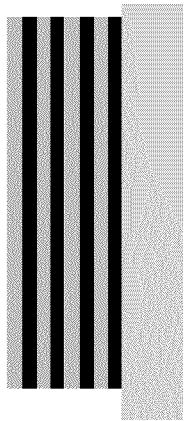
FIG. 22 (cont'd)

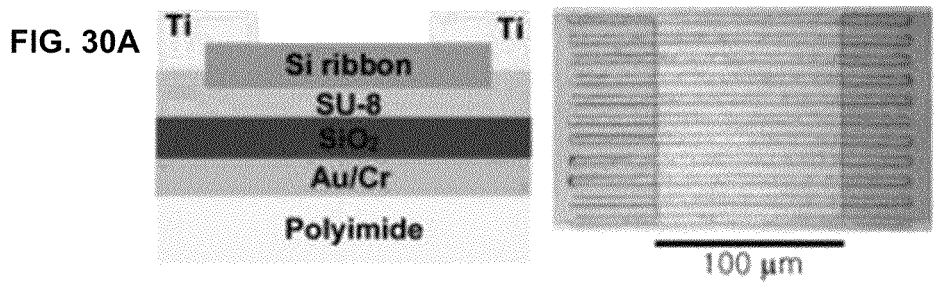
FIG. 30A  FIG. 30B
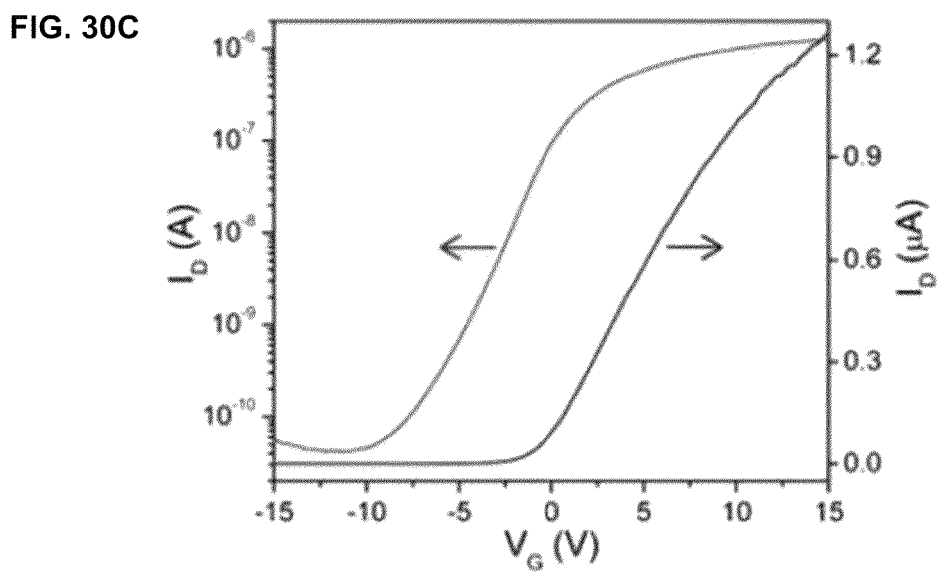
FIG. 30C
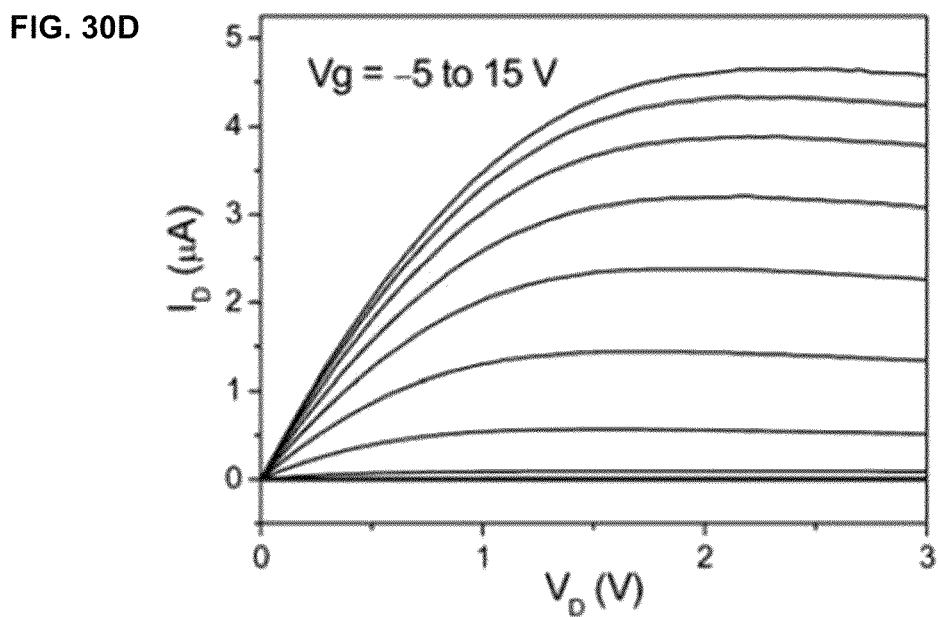
FIG. 30D
FIG. 30

Anchored release using patterned sacrificial structures example: Au released from PECVD SiO$_x$ Functional layer (150 nm Au mesh, 1.5 nm Ti adhesion layer) on a patterned SiO$_x$ (300 nm) sacrificial layer (blue).

Retrieval of mesh overlying sacrificial layer using PDMS stamp after 15 sec. of HF exposure to substrate to remove sacrificial PECVD SiO$_x$. Where no sacrificial layer was present (right), the mesh remains anchored to the substrate.

Mesh printed onto PET substrate coated with PDMS (1-2 microns) as an adhesive layer

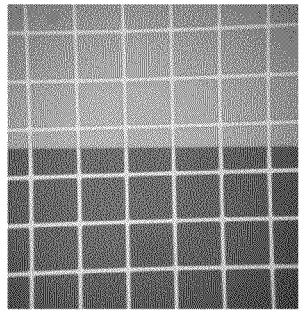 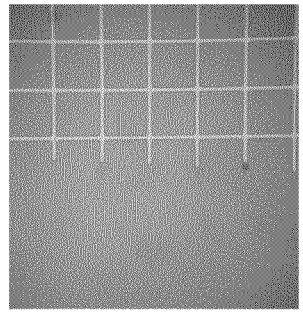 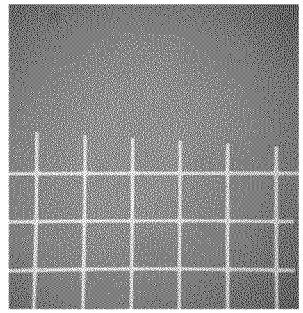

FIG. 36

RELEASE STRATEGIES FOR MAKING TRANSFERABLE SEMICONDUCTOR STRUCTURES, DEVICES AND DEVICE COMPONENTS

CROSS-REFERENCE TO RELATED APPLICATIONS

This application is a continuation of U.S. patent application Ser. No. 11/858,788, filed Sep. 20, 2007, which claims the benefit of U. S. Provisional Application Nos. 60/826,354, filed Sep. 20, 2006 and 60/944,653 filed Jun. 18, 2007, all of which are incorporated by reference to the extent they are not inconsistent with the present disclosure.

STATEMENT REGARDING FEDERALLY SPONSORED RESEARCH OR DEVELOPMENT

This invention was made with government support under Grant DEFG02-91-ER45439 awarded by Department of Energy. The government has certain rights in the invention.

BACKGROUND OF THE INVENTION

A variety of platforms are available for printing structures on device substrates and device components supported by device substrates, including nanostructures, microstructures, flexible electronics, and a variety of other patterned structures. For example, a number of patents and patent applications describe different methods and systems for making and printing a wide range of structures, including U.S. patent application Ser. No. 11/115,954, now U.S. Pat. No. 7,195,733 (18-04 filed Apr. 27, 2005); Ser. No. 11/145,574, now U.S. Pat. No. 7,622,367 (38-04A filed Jun. 2, 2005); Ser. No. 11/145,542, now U.S. Pat. No. 7,557,367 (38-04B filed Jun. 2, 2005); Ser. No. 11/423,287, now U.S. Pat. No. 7,521,292 (38-04C filed Jun. 9, 2006); Ser. No. 11/423,192, now U.S. Pub. No. US-2009-0199960-A1 (41-06 filed Jun. 9, 2006); Ser. No. 11/421,654, now U.S. Pat. No. 7,799,699 (43-06 filed Jun. 1, 2006); 60/826,354 (151-06P filed Sep. 20, 2006), each hereby incorporated by reference to the extent not inconsistent herewith. A need currently exists for methods and structures for generating transferable semiconductor elements. There is a particular need for low cost methods and structures compatible with high-throughput processing to make device and device components.

SUMMARY OF THE INVENTION

Methods and related systems are provided to facilitate low-cost generation of structures capable of printing on device substrates or device components on device substrates. This is accomplished by providing stacks of multilayer structures configured to provide access to individual layers. Of particular use are individual layers that are functional layers, where the functional layers are subsequently incorporated into device and device components. Individual layers are accessed by release strategies that provide sequential layer-by-layer access or access to two or more layers simultaneously. Those functional layers are capable of being printed onto, or incorporated into, devices or device components, by a wide range of printing methods and systems. These multilayer stack systems provide a capability to generate multiple printable or transferable functional structures contained in multiple layers in a single process, thereby decreasing the cost per printable or transferable structure or layer and decreasing the final cost of the end device or device component.

In an aspect, the invention provides methods for making low-cost and/or high performance photovoltaics by multilayer structures having a plurality of functional layers that can be incorporated into a solar cell of the photovoltaic. This multilayer approach is advantageous for a number of reasons. For example, multiple solar cells may be grown in a single deposition run, thereby avoiding loading and unloading of growth chambers, growth substrate surface preparation, and the deposition of buffer layers currently required by single layer fabrication approaches. This results in a significant decrease in manufacturing cost per solar cell layer, thereby decreasing the cost to the solar cell device component. In addition, the capability of lifting-off fully functional layers from a mother substrate provides the ability to reuse the mother substrate by constructing additional multilayer structures on the same mother substrate. Furthermore, the multilayer configuration is easily heat sunk and can provide transferable structures that may be readily printed to plastics and other substrates having a wide range of form factors.

In an embodiment, a method is provided for making a device or device component by providing a multilayer structure having a plurality of functional layers and a plurality of release layers. In this configuration, at least a portion of the release layers are positioned between the functional layers to provide access to the functional layers. At least a portion of the functional layers are released from the multilayer structure by separating one or more of the release layers or a portion thereof from one or more of the functional layers. This functional layer release generates a structure capable of being printed onto a substrate. A device or device component is made by printing one or more of these transferable structures onto a device substrate or device component supported by a device substrate by any printing means known in the art (e.g., contact printing, liquid printing, dry transfer contact printing, soft lithographic microtransfer printing and soft lithographic nanotransfer printing, solution printing, fluidic self assembly, ink jet printing, thermal transfer printing, and screen printing), such as by contact printing.

Release is used broadly and refers to any means for separating at least a portion of a layer from other layers in the multilayer structure. For example, the step of releasing at least a portion of a functional layer from a multilayer substructure may be by physically separating at least one pair of adjacent layers. The adjacent layers may be a release layer that is adjacent to a functional layer in the multilayer structure. The release layer is constructed to facilitate release of at least a portion of a functional layer in response to a release stimulus. For example, the release stimulus may comprise a chemical or physical stimulus that removes at least a portion of the release layer, thereby facilitating release of an adjacent functional layer. Any stimulus, however, capable of affecting a targeted release layer may be used. Other examples of releasing steps include, but are not limited to, etching one or more release layers, thermally shocking one or more release layers, ablating one or more release layers by exposure of the release layers to electromagnetic radiation from a laser source, and decomposing one or more release layers by contacting the release layers with a chemical agent. In an aspect, functional layers are connected to adjacent layers by anchoring means located at the ends of the layer, and so release is achieved by undercutting at those ends to lift-off the functional layer. Alternatively, anchors are provided as patterns in a sacrificial layer or release layer, thereby providing anchors fixed to an adjacent layer or a substrate. These anchors provide further flexibility in the design of breakable tether points to facilitate controlled lift-off of functional layer portions. Optionally, in any of the methods disclosed herein, layers that remain attached to the lifted-off functional layer are removed. In an aspect, lift-off is accomplished by contacting the multilayer structure with a stamp, such as an elastomeric stamp. Optionally, a stamp is used to facilitate contact printing of the lift-off structure to a surface.

To facilitate transmission of a signal to a release layer, any one or more of the functional layers through which the signal passes, are capable of at least partially transmitting the signal. For example, for a signal that is electromagnetic radiation, the functional layers are at least partially transparent to electromagnetic radiation that is capable of ablating at least a portion of the release layers. Alternatively, if the electromagnetic radiation is transmitted from an opposite side, such as the other side of the substrate that supports the multilayer structure, the substrate is at least partially transparent to the electromagnetic radiation.

Another means for releasing is an interfacial crack located in a release layer. Such a crack facilitates lift off of one or more functional layers by applying a stress to the system, such as to the release layer. The crack may be introduced by any means known in the art including, but not limited to a mechanical, chemical or thermal-generated force.

In an aspect, any of the methods disclosed herein may further include masking at least a portion of the multilayer structure. For example, a mask layer that is in physical contact with one or more functional layers. Such masks are capable of at least partially preventing exposure of one or more functional layers to an etchant, solvent or chemical agent provided as a release signal to release at least a portion of the functional layers from the multilayer structure. Such a mask may be useful in applications where the functional layer is a high-quality layer that is expensive and prone to damage by the release signal, such as an etchant.

In another aspect, a carrier film is provided in contact with one or more of the functional layers to further facilitate the step of releasing at least a portion of said functional layers from the multilayer substructure.

The methods and systems provided herein are useful for generating a wide range of transferable structures having a wide range of geometry. Accordingly, the method is capable of incorporation into a number of device manufacturing processes for a wide range of device and device component manufacture. In an aspect, the transferable structure has a layer-type geometry. In another aspect, recessed features are provided by any method known in the art so that at least one of the functional layers generates transferable structures having one or more preselected microsized or nanosized physical dimensions. For example, generation of recessed features in at least one of the functional layers is optionally carried out using a patterning technique, such as a patterning technique that is photolithography, soft lithography, electron beam direct writing, or photoablation patterning.

A functional layer of the present invention is used broadly, and refers to material that is of use within a device or device component. A functional layer with wide application for a variety of devices and device components is a multilayer having a semiconductor or a sequence (e.g. plurality) of semiconductor layers. Functional layer composition and geometry is selected depending on the end use or function of that functional layer. For example, the sequence of semiconductor layers can be at least one semiconductor layer selected from the group consisting of: a single crystalline semiconductor layer, an organic semiconductor layer, an inorganic semiconductor layer, a III-V semiconductor layer; and a group IV elemental or compound semiconductor. In another aspect, the sequence of semiconductor layers is at least two semiconductor layers having different semiconductor materials. In an aspect, at least one of the functional layers is made from one or more dielectric layers or one or more conductor layers. In an embodiment, a functional layer in the multilayer may be different than other functional layers. In an embodiment, all the functional layers in the multilayer are the same. In an embodiment, a functional layer in the multilayer is a complex recipe of individual layers, such as a plurality of semiconductor layers. In the drawings included as a part of this application, the structures derived from these functional layers are referred to as "functional materials elements or devices" (FMEDs).

Other functional layers useful in certain methods described herein include, but are not limited to, functional layers that are an electronic, optical or electro-optic device or a component of an electronic, optical, electro-optic device, a component thereof that is a part of a P-N junction, a thin film transistor, a single junction solar cell, a multi-junction solar cell, a photodiode, a light emitting diode, a laser, a CMOS device, a MOSFET device, a MESFET device, or a HEMT device.

In an embodiment, any of the multilayer structures are generated on a substrate. In an aspect, at least one release layer is provided between the multilayer structure and the substrate, such as a release layer positioned between a functional layer and a substrate. In another aspect, a release layer is not provided between the multilayer structure and the substrate. In that case, the mother substrate and/or the adjacent functional layer provide the ability to release the functional layer from the substrate. In an aspect the mother substrate is itself a release layer.

The multilayer structure and specifically the individual layers of the multilayer structure, may be deposited or grown on the substrate surface as known in the art. For example, any one or more means for growing or depositing layers on a surface may be selected from various techniques including but not limited to: epitaxial growth, evaporation deposition, vapor-phase epitaxy, molecular-beam epitaxy, metalorganic chemical vapor deposition, chemical vapor deposition, physical vapor deposition, sputtering deposition, sol-gel coating, electron beam evaporation deposition, plasma-enhanced chemical vapor deposition; atomic layer deposition, liquid phase epitaxy, electrochemical deposition, and spin coating. In such a manner, multiple transferable structures are generated from a system and, upon release of the final functional layer (e.g., the layer closest to the substrate surface), the substrate is optionally reused again. Such reuse results in cost savings compared to manufacturing processes where the substrate itself is either damaged, destroyed, or incorporated into the final device or device component.

The multilayer structure optionally includes a functional layer and/or release layer having a preselected sequence of thin films epitaxially grown on a substrate, such as alternating release layers and functional layers. In an embodiment, the functional layers have thicknesses selected from the range of about 5 nm to about 50,000 nanometers. In an embodiment the multilayer structure has about 2 to about 200 functional layers and/or about 2 to about 200 release layers. The release layer, depending on the system configuration, may be as thin as 1 nm. In other embodiments the release layer may be thicker, for example between about 1 µm and 2 µm The actual selection of the composition of the release layer material is made based on a number of parameters, such as whether it is desired to grow high-quality functional layers (e.g., epitaxial growth). Release layer composition constraint may be relaxed if growth is not epitaxial. In addition, the release layer composition should be compatible with the release strategy for releasing functional layers from the multilayer structure. For example, if the release mechanism is by cracking, Young's modulus may be selected to facilitate optimal cracking.

Many different devices are capable of being made using any of the methods disclosed herein. In an aspect, the invention provides a method of making a photovoltaic device or device array, a transistor device or device array, a light emitting diode device or device array, a laser or array of lasers, a sensor or sensor array, an integrated electronic circuit, a microelectromechanical device or a nanoelectromechanical device.

In an embodiment, any of the methods of the present invention are for making transferable semiconductor structures. For example, transferable semiconductor structures are made from at least a portion of a functional layer having one or more semiconductor thin films, and releasing at least a portion of the functional layers from the multilayer structure by separating one or more of the release layers or a portion thereof from one or more of the functional layers. Similarly, methods are provided for making a photovoltaic device or device array by providing at least a portion of a functional layer that is itself a photovoltaic cell, such as a photovoltaic cell having a preselected sequence of semiconductor thin films.

In another embodiment, the invention is a method for making a device or device component, where a sacrificial layer is provided on at least a portion of a substrate surface. Sacrificial layer is used broadly to refer to a material that facilitates removal of a functional layer from a substrate. The sacrificial layer has a receiving surface for receiving a functional layer material. The sacrificial layer is selectively patterned by any means known in the art to reveal the underlying substrate or film or coating on the substrate in a corresponding pattern. The pattern of exposed substrate corresponds to potential anchor regions of a functional layer when the functional layer is subsequently deposited. In particular, the deposited functional layer has two regions: an "anchor region" that corresponds to the patterned regions in the sacrificial layer and an "unanchored region" where there is a sacrificial layer that separates the functional layer from the underlying substrate. The anchors can function as bridge elements to facilitate controlled lift-off of functional layer in a pattern that corresponds to the unanchored region. A portion of the functional layer is released, wherein the pattern of functional layer anchors remain at least partially anchored to the substrate and at least a portion of the functional layer not anchored to the substrate is released, thereby generating a plurality of transferable structures. The transferable structures are optionally printed onto a device substrate or device component supported by a device substrate, thereby making the device or the device component. Any printing means known in the art may be used, such as contact printing or solution printing, as described herein.

In an embodiment, the releasing step comprises contacting an elastomeric stamp to at least a portion of the functional layer and removing the stamp from contact with the functional layer, thereby removing at least a portion of the functional layer that is not anchored to the substrate.

In another embodiment, the releasing step uses a technique selected from the group consisting of: etching the sacrificial layer, thermally shocking the sacrificial layer, ablating or decomposing by exposure of the sacrificial layer to radiation from a laser source; and decomposing the sacrificial layer by contacting the sacrificial layer with a chemical agent. The functional layer is then optionally removed or retrieved by any means known in the art, such as by a stamp that selectively breaks functional structures from anchors, thereby providing printed functional structures that may correspond to the pattern that was originally applied to the sacrificial layer.

In an embodiment, any of the patterning processes disclosed herein to provide anchors that are incorporated into the multilayer processes of the present invention. For example, the patterning may be applied to one or more release layers of the present invention that separates functional layers to provide additional means for controllably releasing a plurality of functional materials and/or functional layers.

In another embodiment, the invention is a method for fabricating a plurality of transferable semiconductor elements provided in a multilayer array. Such processes provide for manufacture of a large number of elements from a single layer and/or from multiple layers with each layer capable of generating a plurality of elements, as well as providing capability for additional element processing, including processing of elements that are attached to an underlying surface. For example, the method can comprise the steps of providing a wafer having an external surface, such as a wafer comprising an inorganic semiconductor. Selected regions of the external surface are masked by providing a first mask to the external surface, thereby generating masked regions and unmasked regions of the external surface. A plurality of relief features extending from the external surface into the wafer are generated by etching the unmasked regions of the external surface of the wafer. In this manner, at least a portion of the relief features each have at least one contoured side surface having a contour profile that varies spatially along the length of the at least one side. Another masking step, wherein a second mask masks the contoured side surfaces, wherein the contoured side surface is only partially masked by the second mask. This generates masked and unmasked regions provided along the length of the side surfaces. The unmasked regions are etched to generate a plurality of transferable semiconductor elements provided in the multilayer array.

Any of these methods optionally use a wafer that is a bulk semiconductor wafer, for example a silicon wafer having a (111) orientation.

In an aspect, the step of etching the unmasked regions of the external surface of the wafer is carried out by cyclic exposure of the side surfaces of the recessed features to etchants and etch resist materials, such as by cyclic exposure of the side surfaces of the recessed features to reactive ion etchants and etch resist materials. In another aspect, the etching step is carried out using Inductively Coupled Plasma Reactive Ion Etching, Buffered Oxide Etchant or a combination of both Inductively Coupled Plasma Reactive Ion Etching and Buffered Oxide Etchant etching techniques.

In an embodiment, the contour profiles of the contoured side surfaces have a plurality of features extending lengths that intersect a longitudinal axis of the lengths of said side surfaces. For example, the contour profiles may be ridges, ripples and/or scalloped shaped recessed features provided on said side surfaces. Any of the ridges, ripples or scalloped shaped recessed features function as shadow masks during the step of masking the contoured side surfaces by providing the second mask, thereby generating the unmasked regions of the side surfaces.

In an aspect of the invention, the step of masking the contoured side surfaces by providing a second mask is carried out via angled vapor deposition of a mask material.

In an aspect, the step of etching the unmasked regions of side surfaces is carried out via anisotropic etching, such as with a wafer that is a silicon wafer having an (111) orientation, and etching the unmasked regions of the side surfaces is carried out via anisotropic etching preferentially along <110> directions of the silicon wafer. The anisotropic etching is optionally provided by exposing the unmasked regions of said side surface to a strong base.

In an embodiment, the etching of the unmasked regions of the side surfaces generates the transferable semiconductor elements, wherein each of the elements are connected to the wafer via a bridge element.

Any of the systems described optional have a mask that is an etch resistant mask, such as first and second masks that are etch resistant masks.

In another aspect the invention is a method of assembling a plurality transferable semiconductor elements on a substrate by providing a plurality of transferable semiconductor elements by any of the processes disclosed herein and then printing the transferable semiconductor elements on the substrate. For example provided are methods of making an electronic device or component of an electronic device, the method comprising the steps of providing the plurality of transferable semiconductor elements provided in a multilayer array by a process of the present invention. The transferable semiconductor elements are printed on a substrate, thereby making the electronic device or component of the electronic device. Any of the methods disclosed herein use a printing step that is carried out by contact printing. Any of the methods disclosed herein have a printing step that is carried out by sequentially printing transferable semiconductor in different layers of the multilayer.

In an embodiment, the printing semiconductor elements in a first layer of the array expose one or more transferable semiconductor elements in a layer of the array positioned underneath the first layer.

Another embodiment of the present invention is methods of making transferable semiconductor elements by homogeneous and/or heterogeneous anchoring strategies. Such anchoring provides a number of advantages compared to non-anchored systems and processes, such as more efficient use of the wafer that supports the transferable elements, enhanced transfer control and enhanced registered transfer. In particular, the anchors or bridge elements provide localized control over the geometry of elements that are released or transferred.

"Homogeneous anchoring" (e.g., FIGS. 20, 35, 37A and 37B) refers to an anchor that is an integral part of the functional layer. In general, methods of making transferable elements by homogenous anchoring systems is optionally by providing a wafer, depositing a sacrificial layer on at least a portion of a wafer surface, defining semiconductor elements by any means known in the art, and defining anchor regions.

The anchor regions correspond to specific regions of the semiconductor element. The anchor regions can correspond to a geometrical configuration of a semiconductor layer, e.g., anchors defined by relatively large surface areas and are connected to transferable elements by bridge or tether elements (e.g., see FIGS. 19, 20, 37A and 37B). Such geometry provides a means for facilitating lift-off of specific non-anchored regions for either single-layer or multi-layer embodiments. Alternatively, anchors correspond to semiconductor regions that are attached or connected to the underlying wafer (e.g., FIG. 35). Removing the sacrificial layer provides a means for removing or transferring semiconductor elements while the portion of semiconductor physically connected to the underlying wafer remains.

"Heterogeneous anchoring" (e.g., FIGS. 21, 22) refers to an anchor that is not an integral part of the functional layer, such as anchors that are made of a different material than the semiconductor layer or is made of the same material, but that is defined after the transferable semiconductor elements are placed in the system. One advantage of heterogeneous anchoring compared to homogeneous anchoring relates to better transfer defining strategies and further improvement to the effective useable wafer footprint. In the heterogeneous strategy embodiment, a wafer is provided, the wafer is coated with a sacrificial layer, semiconductor elements are defined, and heterogeneous anchor elements are deposited that anchor semiconductor regions. In an aspect, the anchor is a resist material, such as a photoresist or SiN (silicon nitride), or other material that has a degree of rigidity capable of anchoring and resisting a lift-off force that is not similarly resisted by non-anchored regions. The anchor may span from the top-most semiconductor layer through underlying layers to the underlying wafer substrate. Removal of sacrificial layer provides a means for removing unanchored regions while the anchored regions remain connected to the wafer, such as by contact transfer, for example. In another embodiment, for a multi-layer system, the anchor provides anchoring of a top layer to an underlying semiconductor layer. Alternatively, the anchoring system is for single-layer semiconductor layer systems.

Any of the anchoring systems are optionally made by patterning one or more of a sacrificial layer, functional layer, and release layer, by any means known in the art to generate exposed wafer substrate and/or exposed underlying semiconductor layer.

These anchoring systems are useful for making a plurality of transferable semiconductor elements, as well as for making electronic devices or device components from the transferable semiconductor elements.

BRIEF DESCRIPTION OF THE DRAWINGS

FIGS. 1A and 1B is a schematic illustration of a multilayer structure on a substrate. FIG. 1B is a close-up view of a functional and release layer configuration.

FIG. 3A. is simultaneous removal of two or more release layers; FIG. 3B. is removal of release layers one-at-at-time. Multi-layer structures containing various functional layers (e.g., functional materials elements or devices (FMEDs)) and release layers are provided in FIG. 3C-3E. TABLE 2 reproduces the functional layer complex layered recipe provided in FIG. 3E.

FIG. 4 is a flow-chart of release of FMEDs for photovoltaics by a "multiple-layers-at-a-time" process with optional re-use of substrate.

FIG. 5 is a flow-chart release of FMEDs for photovoltaics by "one-layer-at-a-time" process with optional re-use of substrate.

FIG. 6A-6C summarizes use of laser ablation to separate a release layer. FIG. 6A illustrates the overall process. FIG. 6B provides an example of a structure for the release of FMEDs for LEDs by laser ablation. FIG. 6C is flow-chart summarizing one process for release of FMEDs for LEDs by laser ablation.

FIG. 7A-7B summarizes release by introducing a crack at an interface between FMEDs and the mother substrate and then pulling the FMEDs away from the mother substrate (e.g. using a rubber stamp) to propagate the crack. FIG. 7A illustrates the overall process. FIG. 7B is a flow-chart summarizing a process for release of FMEDs for LEDs by propagating a crack introduced by chemical means.

FIG. 8A-8C summarizes release using a carrier film by introducing a crack at an interface between FMEDs and the mother substrate and then pulling the FMEDs away from the mother substrate. FIG. 8A illustrates the overall process. FIG. 8B provides an example of a structure for the release of FMEDs by propagating a crack. FIG. 8C is flow-chart summarizing one process for release of FMEDs (array of SWNTs) using a carrier film and the separation of a crack introduced mechanically.

FIG. 9 illustrates the overall process. Flow-chart of a corresponding process are provided in FIGS. 4-5.

FIG. 12 is a process flow-chart for the release of amorphous or polycrystalline FMED structures by removal of sacrificial layers.

(FIGS. 26A and 26B) after vertical etching (ICPRIE) to produce trenches with rippled sidewalls; (FIGS. 26C and 26D) after shallow angle physical vapor deposition of metal masking layers; (FIG. 26E-26H) after anisotropic wet chemical etching (KOH) for 2 min (FIGS. 26E and 26F) and 5 min (FIGS. 26G and 26H) followed by removal of the metal.

FIG. 30A: Schematic cross sectional diagram of a transistor that uses silicon ribbons for the semiconductor. FIG. 30B: Optical micrograph top view of a device. Transfer curve (FIG. 30C) and full current/voltage characteristics (FIG. 30D) from a typical device.

FIG. 36 is one example of the process of FIG. 35 where Au is released from PECVD $SiO_x$.

FIG. 37A is a perspective view (scale bar 20 μm) and FIG. 37B is a front view (scale bar 2 μm).

DETAILED DESCRIPTION OF THE INVENTION

Figure 2A:
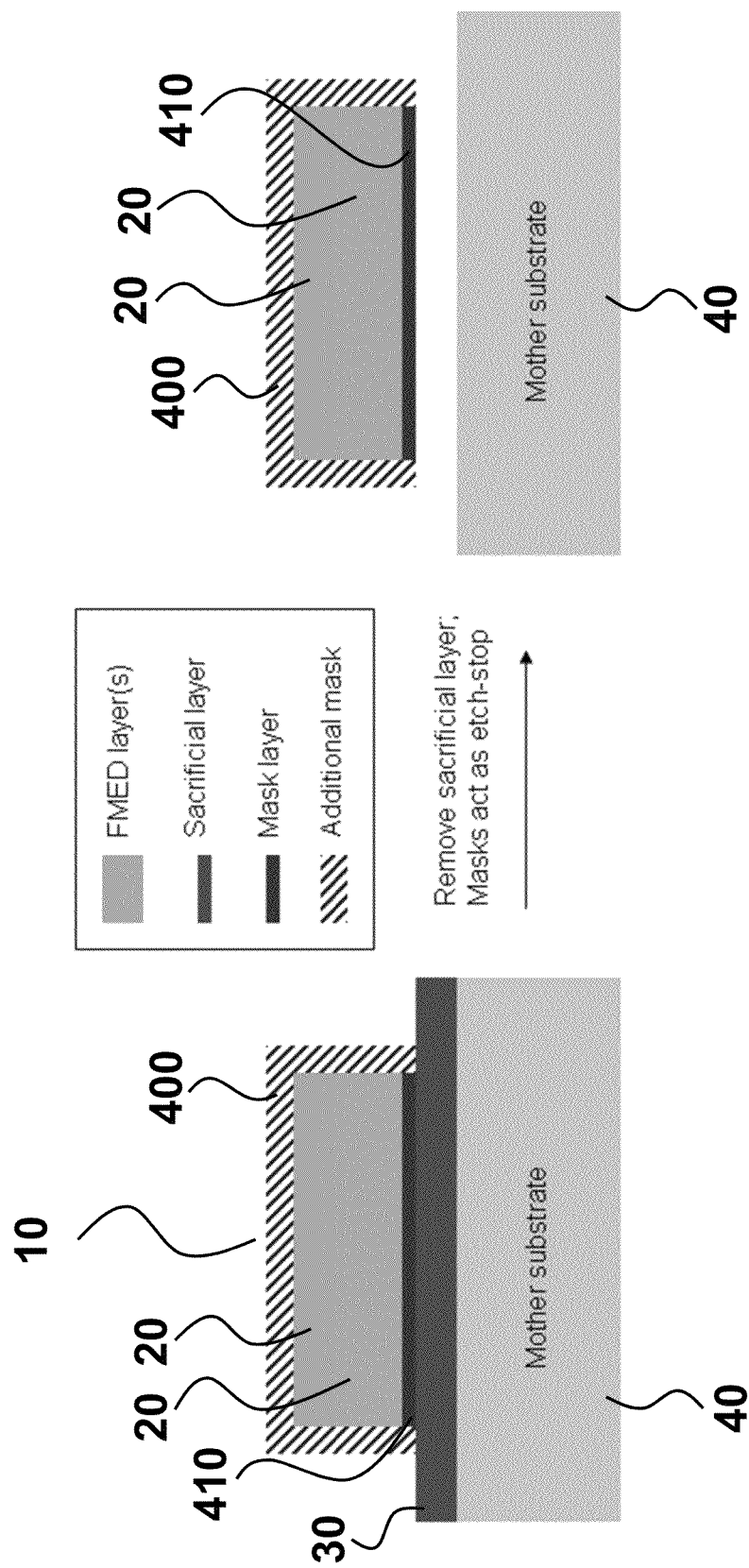
FIG. 2A illustrates release by removal of a sacrificial layer and masking structures.

Referring to the drawings, like numerals indicate like elements and the same number appearing in more than one drawing refers to the same element. In addition, hereinafter, the following definitions apply:

"Transferable" or "printable" are used interchangeably and relates to materials, structures, device components and/or integrated functional devices that are capable of transfer, assembly, patterning, organizing and/or integrating onto or into substrates. In an embodiment, transferable refers to the direct transfer of a structure or element from one substrate to another substrate, such as from the multilayer structure to a device substrate or a device or component supported by a device substrate. Alternatively, transferable refers to a structure or element that is printed via an intermediate substrate, such as a stamp that lifts-off the structure or element and then subsequently transfers the structure or element to a device substrate or a component that is on a device substrate. In an embodiment, the printing occurs without exposure of the substrate to high temperatures (i.e. at temperatures less than or equal to about 400 degrees Celsius). In one embodiment of the present invention, printable or transferable materials, elements, device components and devices are capable of transfer, assembly, patterning, organizing and/or integrating onto or into substrates via solution printing or dry transfer contact printing. Similarly, "printing" is used broadly to refer to the transfer, assembly, patterning, organizing and/or integrating onto or into substrates, such as a substrate that functions as a stamp or a substrate that is itself a target (e.g., device) substrate. Such a direct transfer printing provides low-cost and relatively simple repeated transfer of a functional top-layer of a multilayer structure to a device substrate. This achieves blanket transfer from, for example, a wafer to a target substrate without the need for a separate stamp substrate. "Target substrate" is used broadly to refer to the desired final substrate that will support the transferred structure. In an embodiment, the target substrate is a device substrate. In an embodiment, the target substrate is a device component or element that is itself supported by a substrate.

"Transferable semiconductor elements" of the present invention comprise semiconductor structures that are able to be assembled and/or integrated onto substrate surfaces, for example by dry transfer contact printing and/or solution printing methods. In one embodiment, transferable semiconductor elements of the present invention are unitary single crystalline, polycrystalline or microcrystalline inorganic semiconductor structures. In this context of this description, a unitary structure is a monolithic element having features that are mechanically connected. Semiconductor elements of the present invention may be undoped or doped, may have a selected spatial distribution of dopants and may be doped with a plurality of different dopant materials, including P and N type dopants. The present invention includes microstructured transferable semiconductor elements having at least one cross sectional dimension greater than or equal to about 1 micron and nanostructured transferable semiconductor elements having at least one cross sectional dimension less than or equal to about 1 micron. Transferable semiconductor elements useful in many applications comprises elements derived from "top down" processing of high purity bulk materials, such as high purity crystalline semiconductor wafers generated using conventional high temperature processing techniques. In one embodiment, transferable semiconductor elements of the present invention comprise composite structures having a semiconductor operational connected to at least one additional device component or structure, such as a conducting layer, dielectric layer, electrode, additional semiconductor structure or any combination of these. In one embodiment, transferable semiconductor elements of the present invention comprise stretchable semiconductor elements and/or heterogeneous semiconductor elements.

"Functional layer" refers to a layer capable of incorporation into a device or device component and that provides at least partial functionality to that device or device component. Depending on the particular device or device component, functional layer has a broad range of compositions. For example, a device that is a solar array can be made from a starting functional layer of III-V micro solar cells, including a functional layer that is itself made up a plurality of distinct layers as provided herein. Release and subsequent printing of such layers provides the basis for constructing a photovoltaic device or device component. In contrast, a functional layer for incorporation into electronics (MESFETs), LEDs, or optical systems may have a different layering configuration and/or compositions. Accordingly, the specific functional layer incorporated into the multilayer structure depends on the final device or device component in which the functional layer will be incorporated.

"Release layer" (sometimes referred to as "sacrificial layer") refers to a layer that at least partially separates one or more functional layers. A release layer is capable of being removed or providing other means for facilitating separation of the functional layer from other layers of the multi-layer structure, such as by a release layer that physically separates in response to a physical, thermal, chemical and/or electromagnetic stimulation, for example. Accordingly, the actual release layer composition is selected to best match the means by which separation will be provided. Means for separating is by any one or more separating means known in the art, such as by interface failure or by release layer sacrifice. A release layer may itself remain connected to a functional layer, such as a functional layer that remains attached to the remaining portion of the multilayer structure, or a functional layer that is separated from the remaining portion of the multilayer structure. The release layer is optionally subsequently separated and/or removed from the functional layer.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate.

"Solution printing" is intended to refer to processes whereby one or more structures, such as transferable semiconductor elements, are dispersed into a carrier medium and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. Solution printing methods useable in the present invention include, but are not limited to, ink jet printing, thermal transfer printing, and capillary action printing.

Useful contact printing methods for assembling, organizing and/or integrating transferable semiconductor elements in the present methods include dry transfer contact printing, microcontact or nanocontact printing, microtransfer or nanotransfer printing and self assembly assisted printing. Use of contact printing is beneficial in the present invention because it allows assembly and integration of a plurality of transferable semiconductor in selected orientations and positions relative to each other. Contact printing in the present invention also enables effective transfer, assembly and integration of diverse classes of materials and structures, including semiconductors (e.g., inorganic semiconductors, single crystalline semiconductors, organic semiconductors, carbon nanomaterials etc.), dielectrics, and conductors. Contact printing methods of the present invention optionally provide high precision registered transfer and assembly of transferable semiconductor elements in preselected positions and spatial orientations relative to one or more device components prepatterned on a device substrate. Contact printing is also compatible with a wide range of substrate types, including conventional rigid or semi-rigid substrates such as glasses, ceramics and metals, and substrates having physical and mechanical properties attractive for specific applications, such as flexible substrates, bendable substrates, shapeable substrates, conformable substrates and/or stretchable substrates. Contact printing assembly of transferable semiconductor structures is compatible, for example, with low temperature processing (e.g., less than or equal to 298K). This attribute allows the present optical systems to be implemented using a range of substrate materials including those that decompose or degrade at high temperatures, such as polymer and plastic substrates. Contact printing transfer, assembly and integration of device elements is also beneficial because it can be implemented via low cost and high-throughput printing techniques and systems, such as roll-to-roll printing and flexographic printing methods and systems. "Contact printing" refers broadly to a dry transfer contact printing such as with a stamp that facilitates transfer of features from a stamp surface to a substrate surface. In an embodiment, the stamp is an elastomeric stamp. Alternatively, the transfer can be directly to a target (e.g., device) substrate. The following references relate to self assembly techniques which may be used in methods of the present invention to transfer, assembly and interconnect transferable semiconductor elements via contact printing and/or solution printing techniques and are incorporated by reference in their entireties herein: (1) "Guided molecular self-assembly: a review of recent efforts", Jiyun C Huie Smart Mater. Struct. (2003) 12, 264-271; (2) "Large-Scale Hierarchical Organization of Nanowire Arrays for Integrated Nanosystems", Whang, D.; Jin, S.; Wu, Y.; Lieber, C. M. Nano Lett. (2003) 3(9), 1255-1259; (3) "Directed Assembly of One-Dimensional Nanostructures into Functional Networks", Yu Huang, Xiangfeng Duan, Qingqiao Wei, and Charles M. Lieber, *Science* (2001) 291, 630-633; and (4) "Electric-field assisted assembly and alignment of metallic nanowires", Peter A. Smith et al., *Appl. Phys. Lett.* (2000) 77(9), 1399-1401.

"Carrier film" refers to a material that facilitates separation of layers. The carrier film may be a layer of material, such as a metal or metal-containing material positioned adjacent to a layer that is desired to be removed. The carrier film may be a composite of materials, including incorporated or attached to a polymeric material or photoresist material, wherein a lift-off force applied to the material provides release of the composite of materials from the underlying layer (such as a functional layer, for example).

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Dielectric" and "dielectric material" are used synonymously in the present description and refer to a substance that is highly resistant to flow of electric current. Useful dielectric materials include, but are not limited to, $SiO_2$, $Ta_2O_5$, $TiO_2$, $ZrO_2$, $Y_2O_3$, $Si_3N_4$, STO, BST, PLZT, PMN, and PZT.

"Device field effect mobility" refers to the field effect mobility of an electronic device, such as a transistor, as computed using output current data corresponding to the electronic device.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

An aspect of the present invention is providing FMEDs that can be incorporated into a device or device component in a low-cast manner via multi-layer processing. One example of a multilayer structure 10 having a plurality of functional layers (FMEDs) 20 is provided in FIGS. 1A and 1B. Functional layers 20 are separated from adjacent functional layers by release layer 30. The plurality of functional layers 20 and release layers 30 are supported on substrate 40 and functional layer 20 is itself a composite of a plurality of layers. For example, functional layer 20 may comprise III-V epilayers as illustrated (e.g., p-doped GaAs top layer 21, a middle layer of low-doped GaAs 22, and a lower layer of n-doped GaAs 23), useful in solar cells. The lowest layer is supported on a release layer 30 that is $Al_{0.9}Ga_{0.1}As$, that may be doped or undoped. Release layer 30 facilitates access to one or more of functional layers 20 in the multilayer structure 10.

Examples of release by different kinds of stimuli include: Release by etching, dissolution, burning, etc. (any means of removal) of an embedded sacrificial layer or sacrificial layers (see Table 1). For example, the release layer(s) may be selectively etched/dissolved/burned/removed two or more times faster than the FMEDs, and/or masking of structures or layers may be employed to protect the FMEDs from exposure to the agent used for removal of the sacrificial layers. The release layer(s) are removed one-at-a-time or two or more sacrificial layers are removed simultaneously.

Figure 2B:
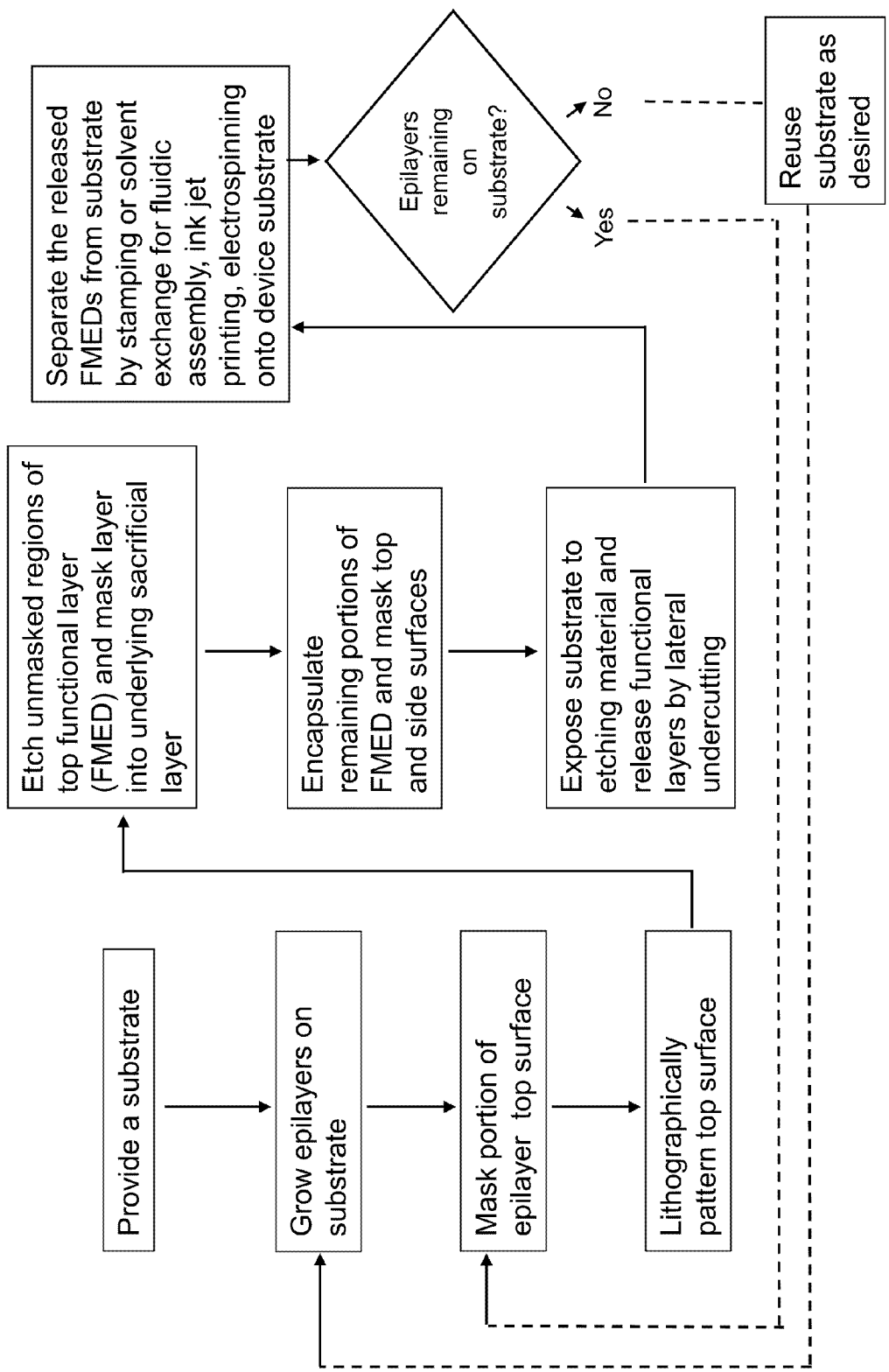
FIG. 2B is a flow-chart that summarizes steps involved in a process to release FMEDs using an encapsulating mask layer.

FIG. 2A illustrates a multilayer structure 10 with a mask layer 410 that coats at least a portion of the functional layer 20, such as between the functional layer 20 and release layer 30. Mask layer 410 optionally comprises an additional mask 400, such as mask 400 that surrounds the remaining portions not covered by mask 400. In FIG. 2A, release layer 30 is labeled as a sacrificial layer and functional layer 20 as FMED having two layers. Mask 400 and 410 may act as an etch-stop to protect functional layer 20 from etchent means that removes sacrificial layer 30, thereby facilitating lift-off of layers 20 from substrate 40. FIG. 2B is a flow-chart that summarizes a process for generating transferable FMEDs from a multilayer structure using an encapsulating mask (see also FIG. 2B).

Figure 2C:
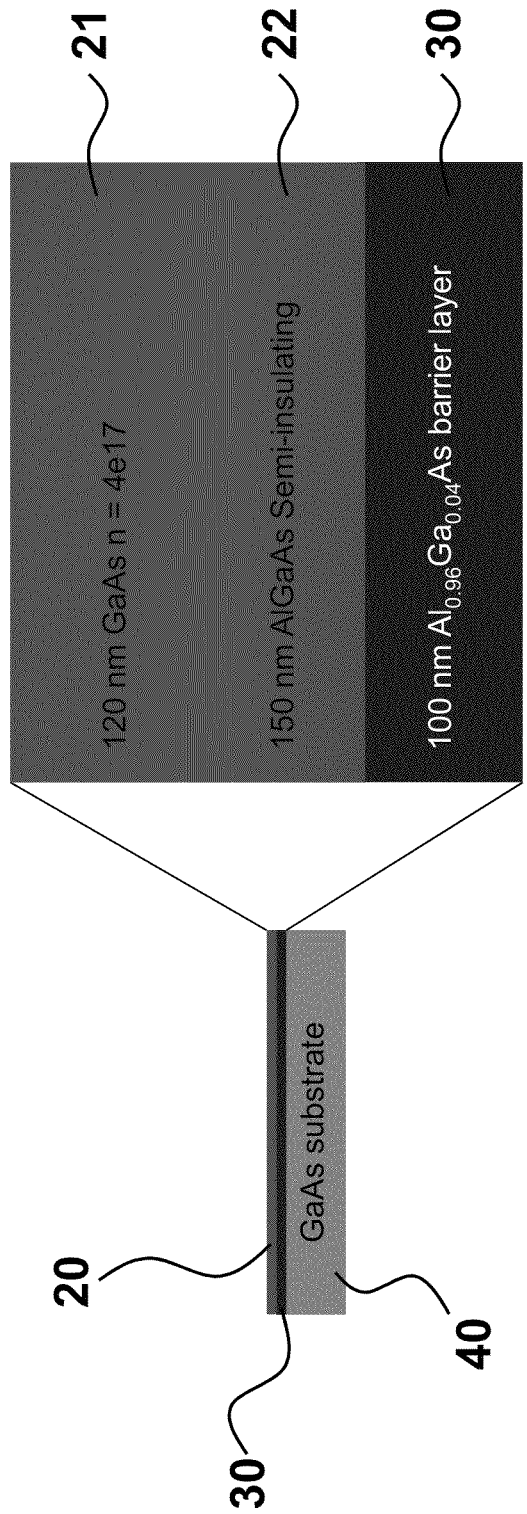
FIG. 2C is an example of a substrate for release of FMEDs for Metal-Semiconductor Field Effect Transistors (MESFETS).

A structure that is useful for use in MESFETs is provided in FIG. 2C, where the functional layer 20 comprises a 120 nm thick GaAs first layer 21 and a 150 nm thick AlGaAs semi-insulating second layer 22. The release layer 30 is a 100 nm thick $Al_{0.96}Ga_{0.04}$ barrier layer capable of facilitating separation of 30 from substrate 40.

EXAMPLE 1

Release of Transferable Structures for Photovoltaics, Electronics and LEDs

FIGS. 3A and 3B schematically illustrate methods and structures for simultaneous removal of multiple release layers (FIG. 3A) and sequential layer-by-layer removal of release layers (FIG. 3B). In FIG. 3A, a portion of the multilayer structure 10 is exposed to etchant means, thereby forming an etched access passage 35. Passage 35 provides simultaneous access to a plurality of release layers 30 (three, in this example). In this manner, a plurality of transferable structures 100 are available for printing to a surface of interest, such as a device substrate or device component supported by a substrate by any means known in the art (e.g., liquid printing, contact printing, etc.).

FIG. 3B summarizes layer-by-layer removal, where etchant access channel 35 spans only the top-most functional layer 20 so that only a single functional layer 20 is released to provide transferable structures 100 from one singly functional layer 20. If necessary, functional layer 20 may be protected by a mask (not shown) prior to introducing a chemical means for removing release layers 30. The process is repeated for each additional functional layer 20. For both of the process depicted in FIGS. 3A-3B, the mother substrate 40 upon which multilayer structure 10 is supported, may be reused.

Figure 3C:
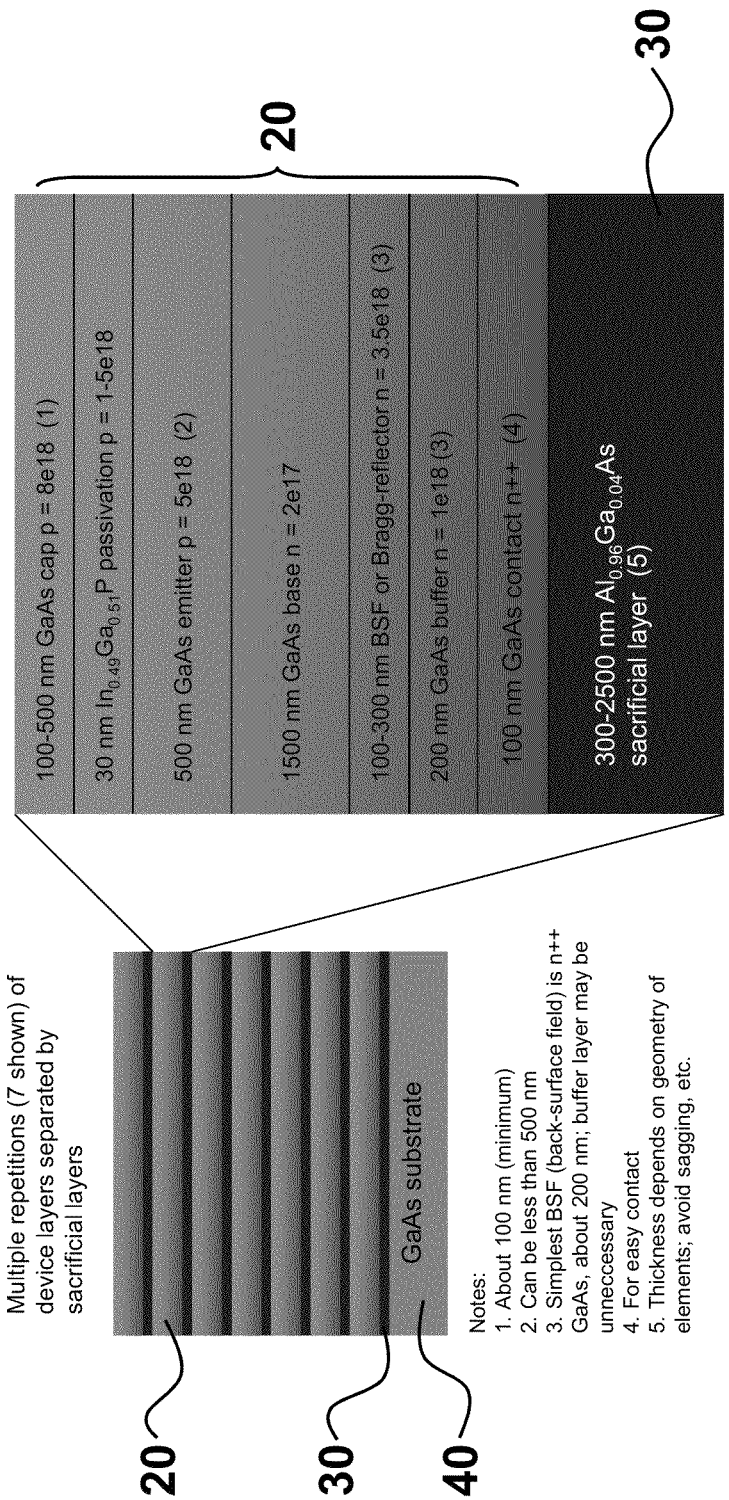
FIGS. 3A and 3B contrasts two different schemes for separating release layers from a multi-layer structure.
Figure 3D:
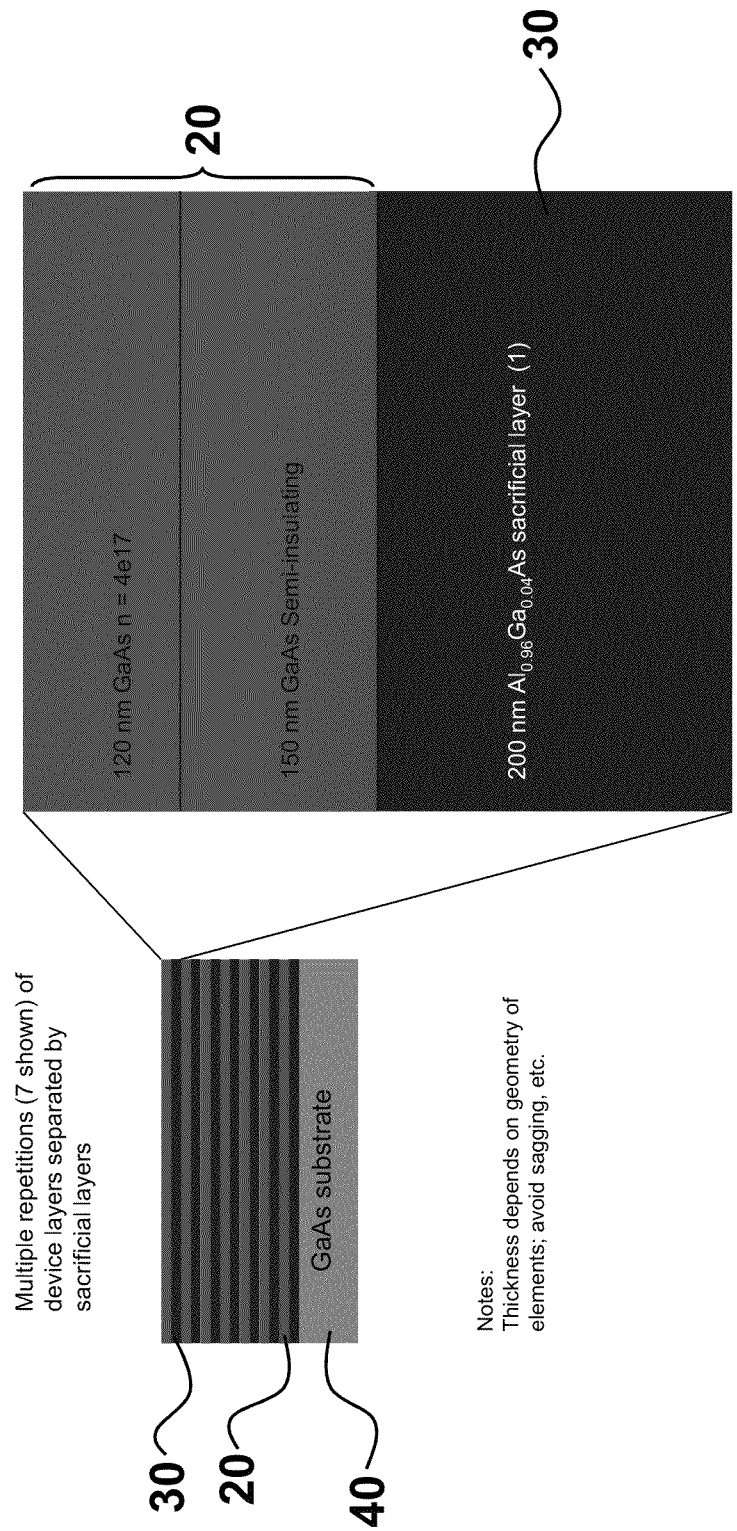
Figure 3E:
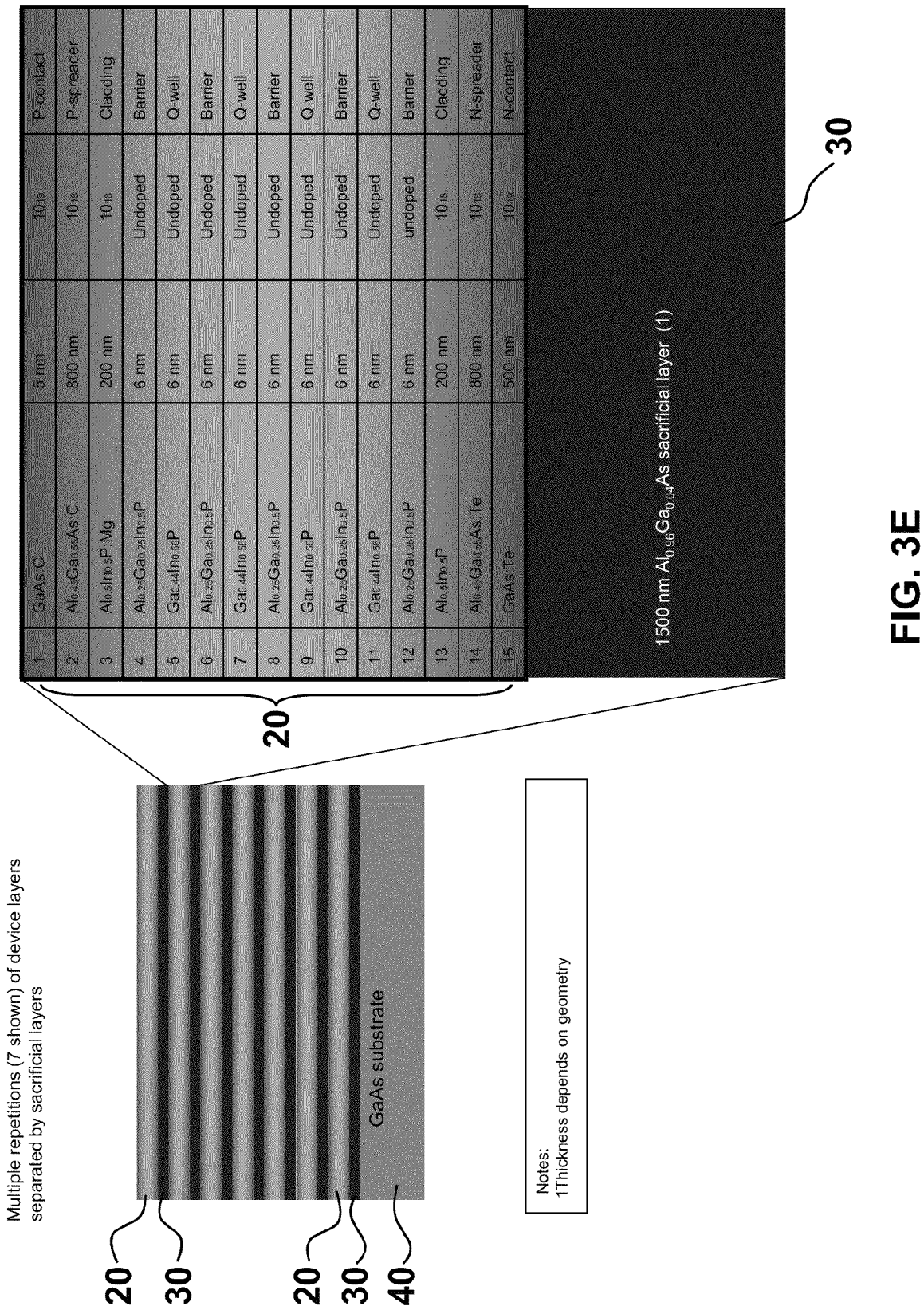

A number of examples of different functional/release layer compositions and geometry for making different devices or device components are provided in FIGS. 3C-3E. FIG. 3C provides an example of a structure having FMEDs for making photovoltaics, where AlGaAs is the release layer. FIG. 3D provides an example of a multilayer structure having FMEDs for making electronics (e.g., MESFETs). FIG. 3E provides an example of a multilayer structure having FMEDs for making LEDs. For clarity, the 15-layer structure of the functional layer 20 is reproduced in TABLE 2. FIGS. 4-5 summarize steps used in a process for releasing multiple functional layers (FIG. 4) or sequential layer-by-layer release of functional layers (FIG. 5).

Functional layers are released by any means known in the art, such as by undercutting, etching, dissolution, burning, etc. (any means of removal) of an embedded release layer or sacrificial layer. There are a variety of strategies for releasing functional layers that use a variety of stimuli, some are provided in TABLE 1. TABLE 1 also shows that the composition of the functional and release layers may be selected depending on the release strategy employed. The sacrificial layer(s) are selectively etched/dissolved/burned/removed about two or more times faster than the functional layers that make up the FMEDs. Optionally, a mask layer 400 is provided to protect the FMEDs 20 from exposure to the agent used for removal of the sacrificial layers (see FIG. 2A). Release layers may be removed one-at-a-time or a plurality of release layers may be removed simultaneously (compare FIGS. 3A and 3B and flow-charts in FIG. 4 and FIG. 5.

Simultaneous release of functional layers is outlined in FIGS. 3A and 4. FIG. 4 summarizes release of FMEDs for photovoltaics by multiple-layers-at-a-time" with optional re-use of substrate for subsequent generation of additional transferable FMEDS. The functional layers comprise epitaxially grown semiconductors. The process also works for amorphous or polycrystalline materials similar to the process described in FIG. 12. Briefly, a GaAs substrate is obtained. Grow epilayers shown in FIG. 3C, for example, on GaAs substrate by MOCVD, MBE, etc. (similar process for FIGS. 3D and 3E for transistors, LEDs, respectively). Pre-treat substrate prior to growth as needed (CMP is optionally required). Grow about ~200 nm buffer layer of GaAs adjacent to substrate before depositing or epitaxially growing functional and sacrificial layers. A portion of the surface of the top epilayer may be masked with $SiO_2$ by Plasma-Enhanced Chemical Vapor Deposition (PECVD) and a form of lithography for patterning. Etch unmasked regions of epilayers using Cl/Ar/H plasma from surface to a distance into any $Al_{0.96}Ga_{0.04}As$ sacrificial layer (for example, into the sacrificial layer closest to the substrate). The sacrificial layer should not be the one farthest from the substrate (in that case, the release would be in a "one-at-a-time" process as summarized in FIGS. 3B and 5). Expose the substrate to concentrated HF to at least partially remove the exposed sacrificial layers and release the functional epilayers above the sacrificial layers by lateral undercutting. (HF attacks the functional epilayers more slowly (less than 1/10 etch rate) than it does the sacrificial layer). Separate the released FMEDs from substrate by stamping or perform solvent exchange for fluidic assembly or ink jet printing, electrospinning, etc. Use HF to remove any remaining portions of the sacrificial layers; wash/rub away any remaining portions of the overlying functional epilayers (anchoring structures, etc.). The functional layers that were originally directly underneath layers that have since been removed are now exposed and on the surface of the substrate. Repeat steps between masking and HF removal, thereby releasing sets of functional layers (each set separated by sacrificial layers) until no sacrificial layers remain on the substrate. For optional re-use of the substrate, these steps are repeated as desired.

Release of a single functional layer is outlined in FIGS. 3B and 5. A substrate, such as a GaAs wafer provides support for growth of epilayers, such as the functional layer described in FIG. 3C, by MOCVD, MBE, etc. The substrate may be pre-treated prior to growth as needed (e.g., CMP). Likely will need to grow ~200 nm buffer layer of GaAs adjacent to substrate before deposition or epitaxial growth of the release and functional layers. Mask portion of the surface of the top epilayer with $SiO_2$ by Plasma-Enhanced Chemical Vapor Deposition (PECVD) and any form of lithography for patterning. Etch unmasked regions of epilayers using Cl/Ar/H plasma from surface to some distance into the first $Al_{0.96}Ga_{0.04}As$ sacrificial layer. Expose the substrate to concentrated HF to at least partially remove the exposed sacrificial layer (one) and release the epilayers above the sacrificial layer (functional layers) by lateral undercutting. (HF attacks the functional epilayers more slowly (less than 1/10 etch rate) than it does the sacrificial layer).

Referring to FIGS. 3B, 3C and 5, etch unmasked regions of epilayers using Cl/Ar plasma from surface through epilayers to some distance into substrate. Encapsulate the remaining portions of the epilayers with photoresist, covering the top and side surfaces. Expose the substrate to aqueous citric acid+ $H_2O_2$ to etch the GaAs substrate and release the functional epilayers above the sacrificial layers (functional layers) by lateral undercutting (the wet etchant attacks the barrier epilayer more slowly (less than 1/10 etch rate) than it does the GaAs substrate, and the functional GaAs layers are protected from the wet etchant by the photoresist that encapsulates them.) In FIG. 2A, the AlGaAs epilayer corresponds to the "mask" 400, and the photoresist encapsulation corresponds to the "additional mask" 410.

Any of the released FMEDs may be separated from substrate by stamping or do solvent exchange for fluidic assembly or ink jet printing, electrospinning, etc.

Release is also accomplished by directional etching (e.g. Si 111, Si 110) (see provisional U.S. Pat. App. 60/826,354, filed Sep. 20, 2006 for "Bulk Quantities of Single Crystal Silicon Micro-/Nanoribbons Generated from Bulk Wafers, Atty. ref. no. 151-06P, hereby incorporated by reference to the extent not inconsistent herewith) for anisotropic etching and/or mask layer to protect FMEDs from the etching.

EXAMPLE 2

Release of Transferable Structures by Laser Ablation

Figure 6A:
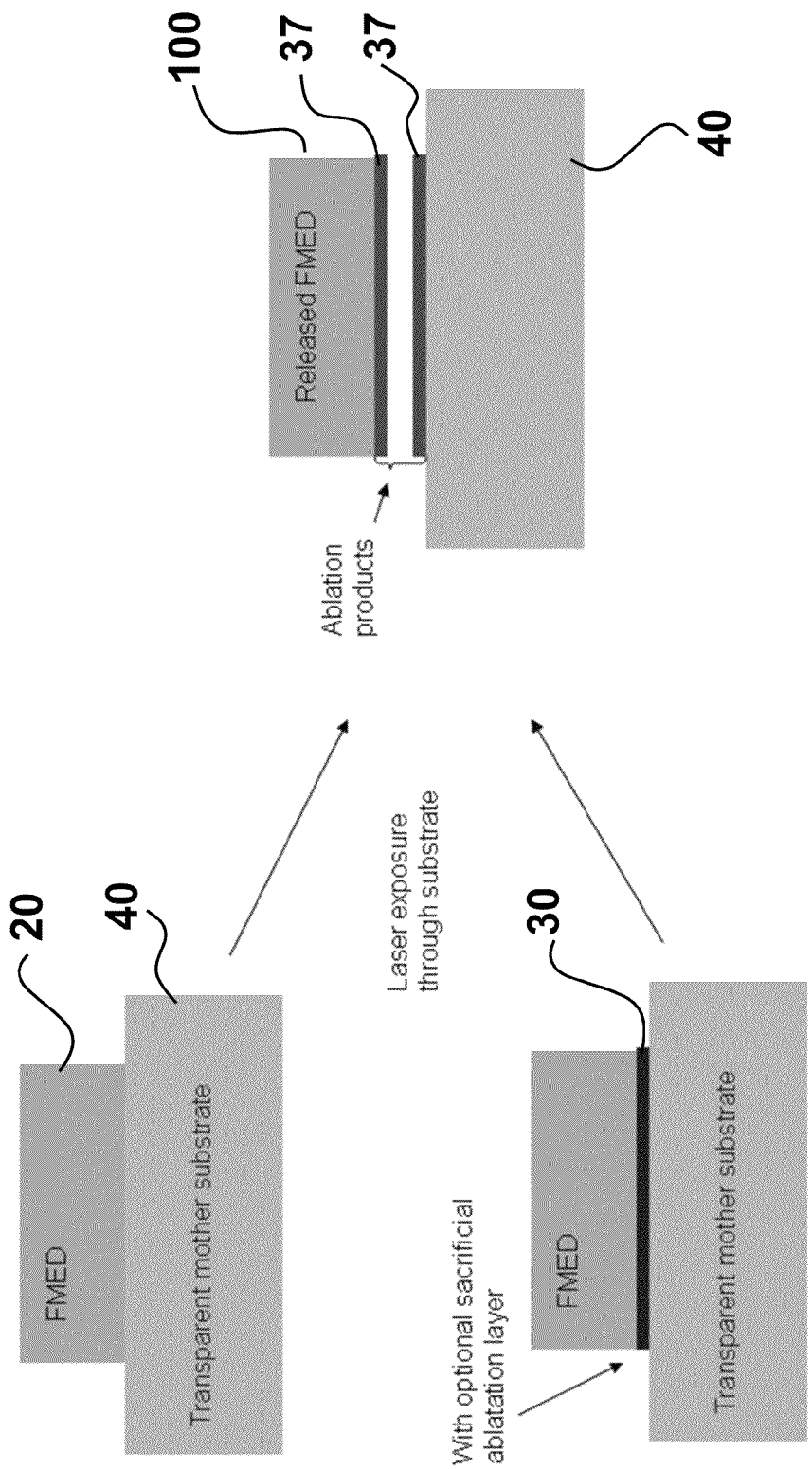
Figure 6B:
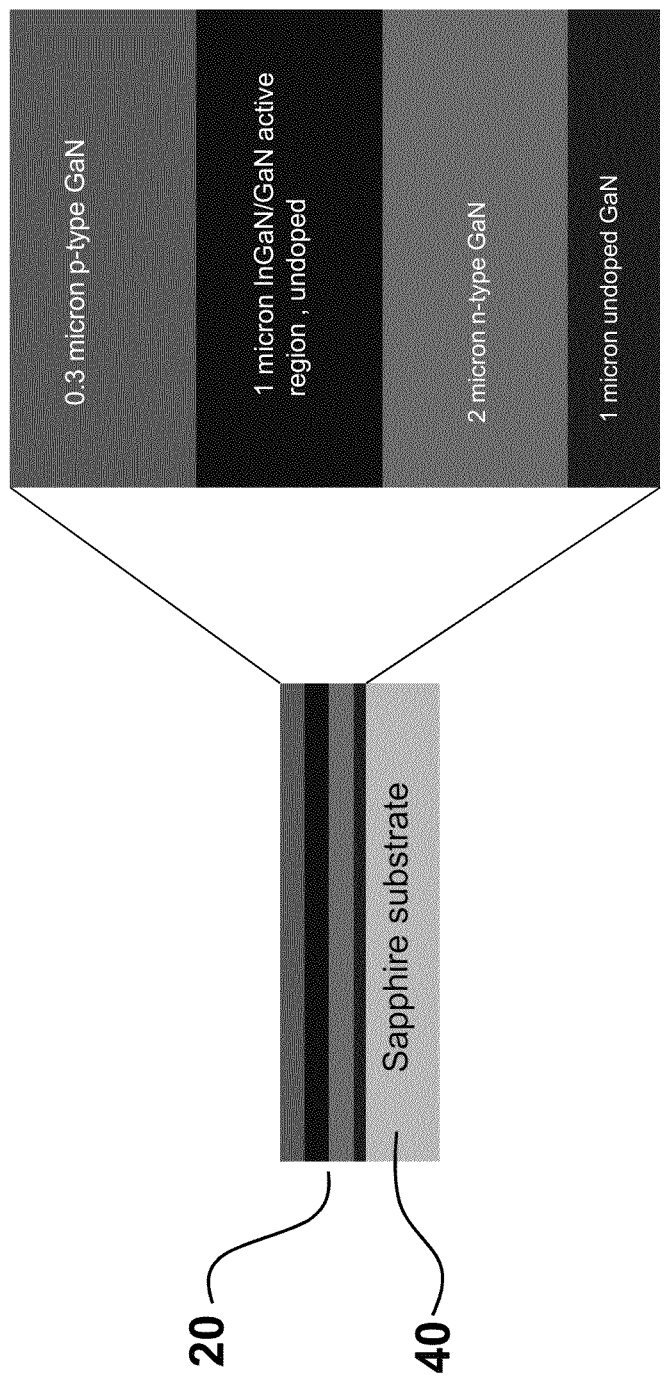
Figure 10:
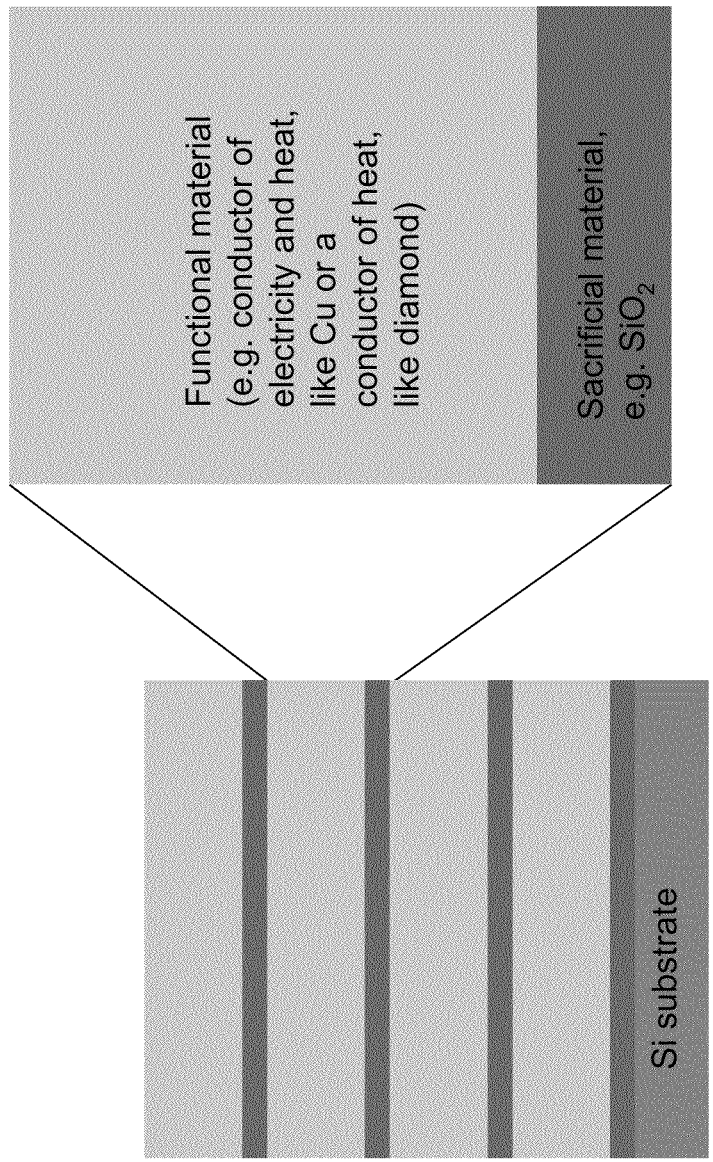
FIG. 10 is a structure illustration of a substrate for release of polycrystalline/amorphous FMED materials by selective removal of sacrificial layers, shown here in a multilayer geometry (4 sacrificial layers).

Other release methods include release by removal of the mother substrate by grinding/polishing/etching or release by thermal shock (e.g. by thermal expansion coefficient mismatch). Release may also be by ablation/decomposition/chemical reaction of embedded layers, such as ablation/decomposition/chemical reaction caused by laser-induced heating. FIG. 6A provides a schematic illustration of a laser ablation release method. Electromagnetic radiation is introduced through an at least partially transparent substrate 40 upon which functional layer 20 is supported, such as by a laser positioned on the side of substrate 40 that is opposite the surface upon which the multilayer structure rests. Laser-induced heating causes release of transferable FMED 100 either by failure of interfacial surface between 20 and 40 or by at least partial removal of a laser-ablating sensitive release surface 30. Release surface 30 may remain partially attached against one or both of structure 100 or substrate 40, as indicated by ablation products 37. Those products 37 are subsequently removed as desired. FIG. 6B is an example of a suitable substrate for the release of FMEDs for LEDs by laser ablation. Substrate 40 corresponds to a sapphire substrate. FIG. 6C summarizes release of FMEDs for LEDs by laser ablation or by ablation/decomposition/chemical reaction that is spontaneous at ambient conditions. FIG. 10 summarizes the basic strategy for release of polycrystalline/amorphous FMED materials by selective removal of release layers by different release signals (e.g., electricity and/or heat). FIG. 12 summarizes release of amorphous FMED structures by removal of sacrificial layers.

EXAMPLE 3

Figure 11:
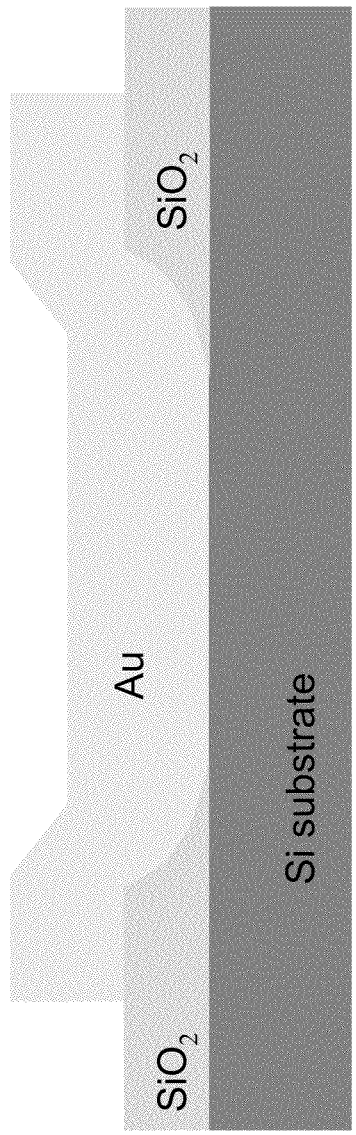
FIG. 11 is a structure illustration of a substrate for FMED removal by propagating a chemically introduced crack.
Figure 13A:
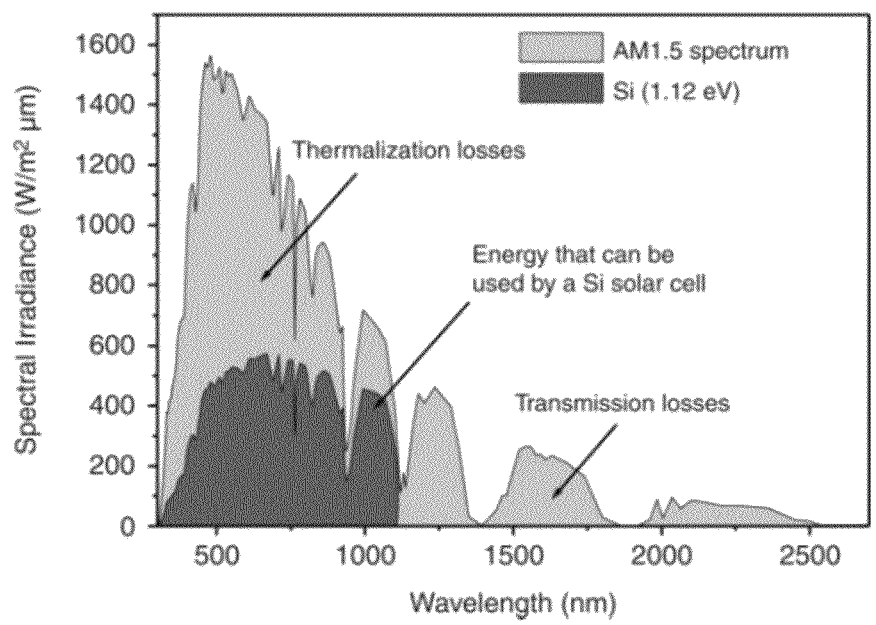
FIG. 13A is a graph of spectral irradiance as a function of wavelength illustrating thermalization and transmission loss by a Si solar cell.
Figure 13B:
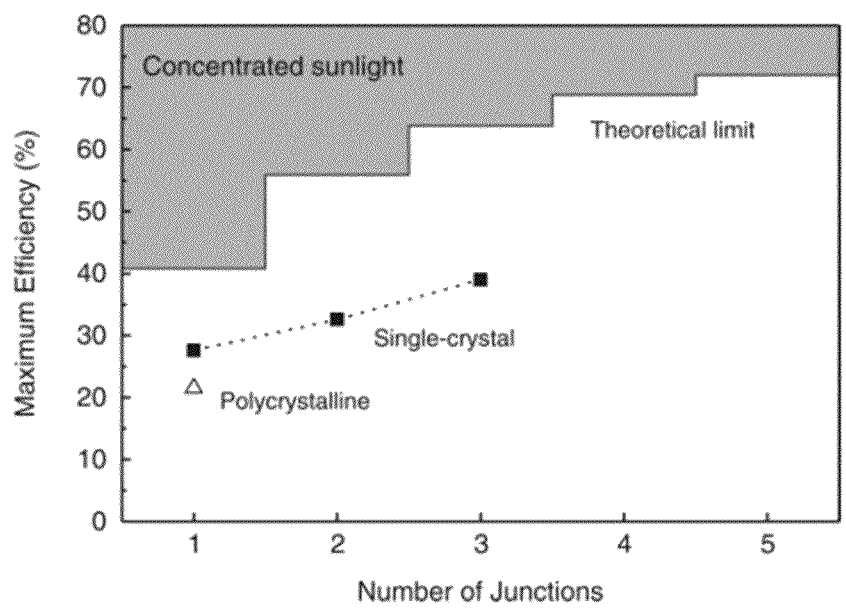
FIG. 13B is a plot of the theoretical limit of solar cells as a function of number of junctions. Also plotted are values achieved by single-crystal and polycrystalline solar cells. From Dimroth and Kurtz, "High Efficiency Multijunction Solar Cells" MRS Bull. 32:230 (2007).
Figure 14:
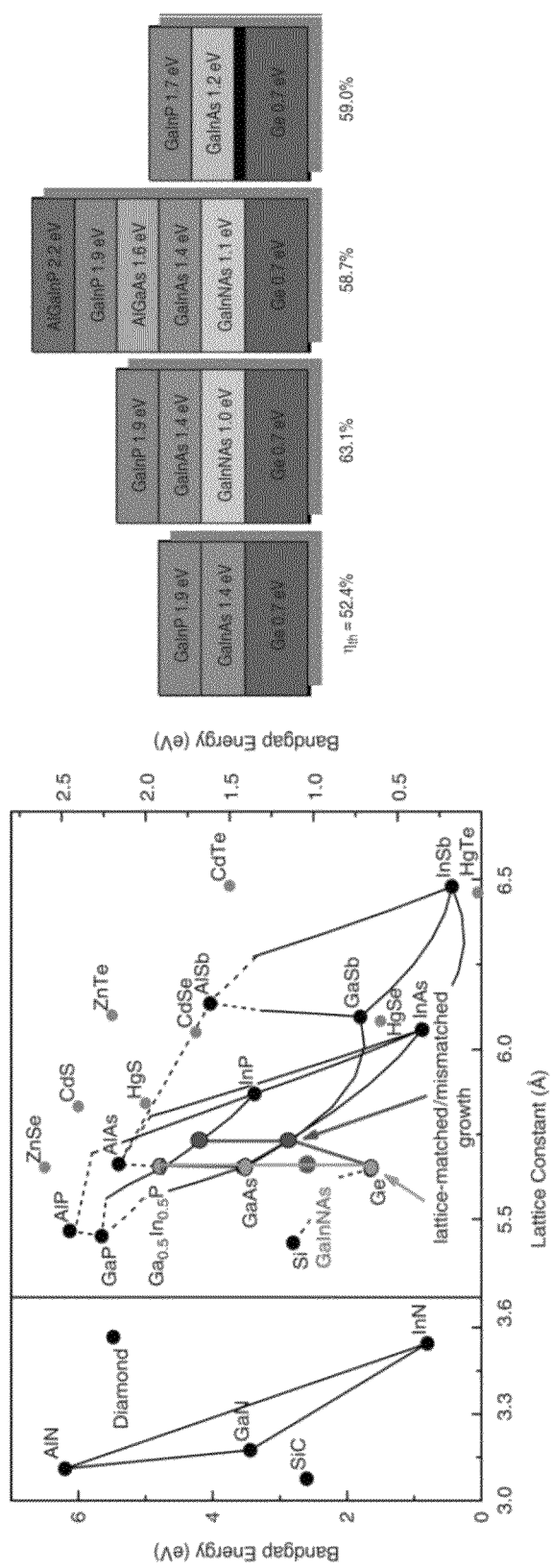
FIG. 14 illustrates that lattice and current matching provide a high quality device. From "High Efficiency Multijunction Solar Cells"Dimroth and Kurtz, MRS Bull. 32:230 (2007).
Figure 15:
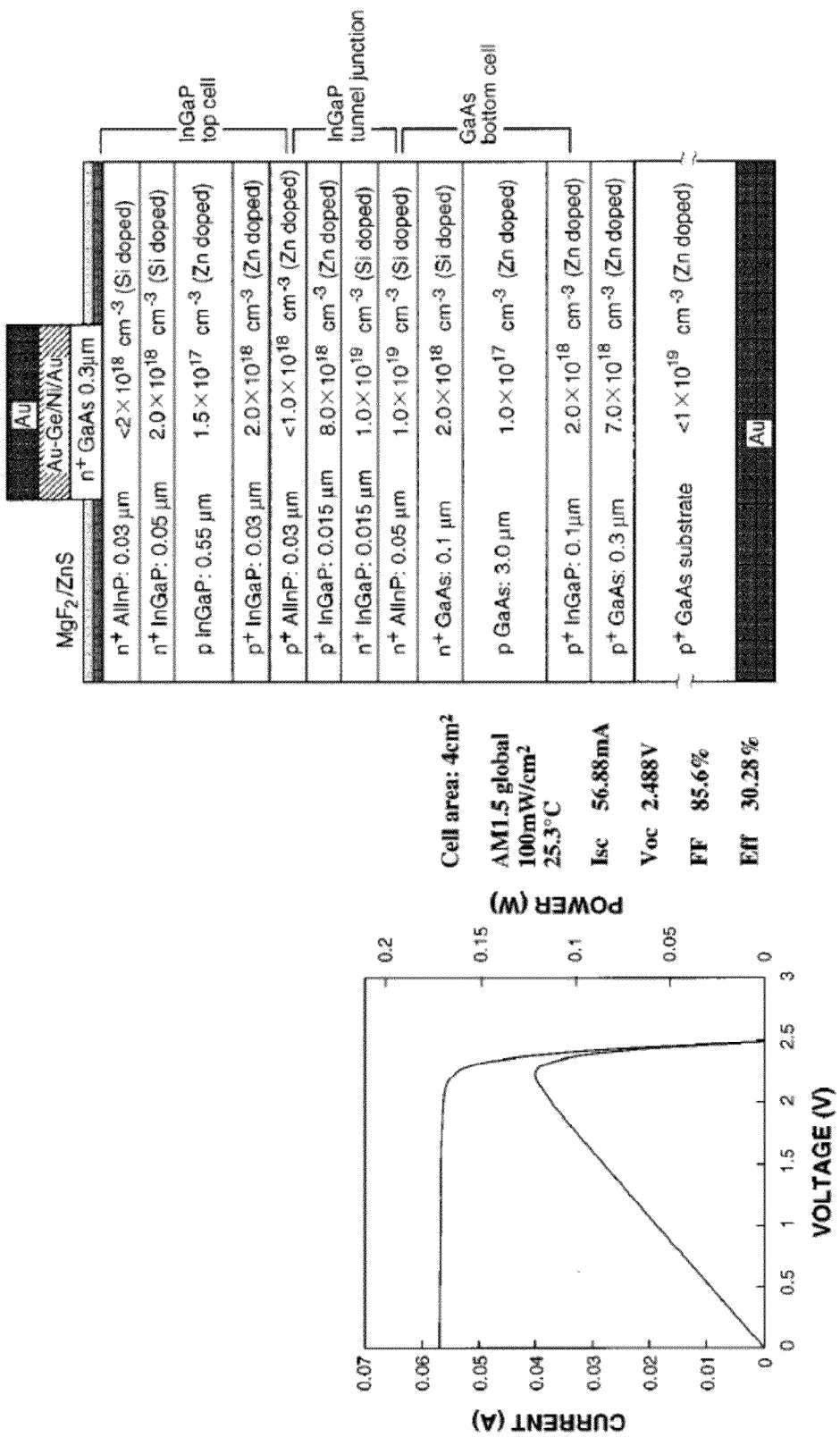
FIG. 15 summarizes the properties of an $In_{0.5}Ga_{0.5}P/GaAs$ device (left) and related structure (right) (from Takamoto et al. "Over 30% efficient InGaP/GaAs tandem solar cells" App. Phys. Letters 70:381 (1997)).
Figure 16:
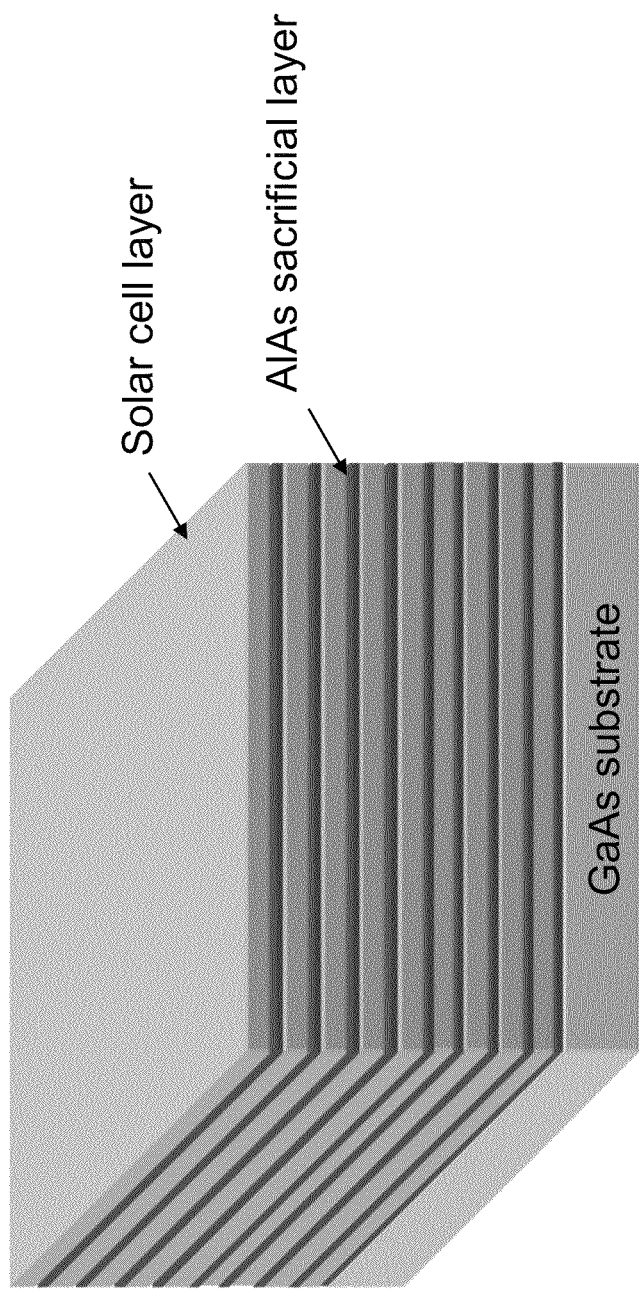
FIG. 16 is a schematic illustration of a multi-layer structure for providing low-cost high-performance solar cell layers.

Release of Transferable Structures by Propagation of an Induced Interfacial Crack Another release mechanism is by introducing a crack at an interface between FMEDs and the mother substrate and then pulling the FMEDs away from the mother substrate (e.g. using a rubber stamp) to propagate the crack (see FIG. 7A). The crack can be introduced in any number of manners, such as mechanically (e.g. by cutting; see FIGS. 8B-8C and 12), chemically (e.g. by etching) (see FIGS. 7B and 11), or thermally (e.g. by shock induced by thermal expansion coefficient mismatch).

Figure 8B:
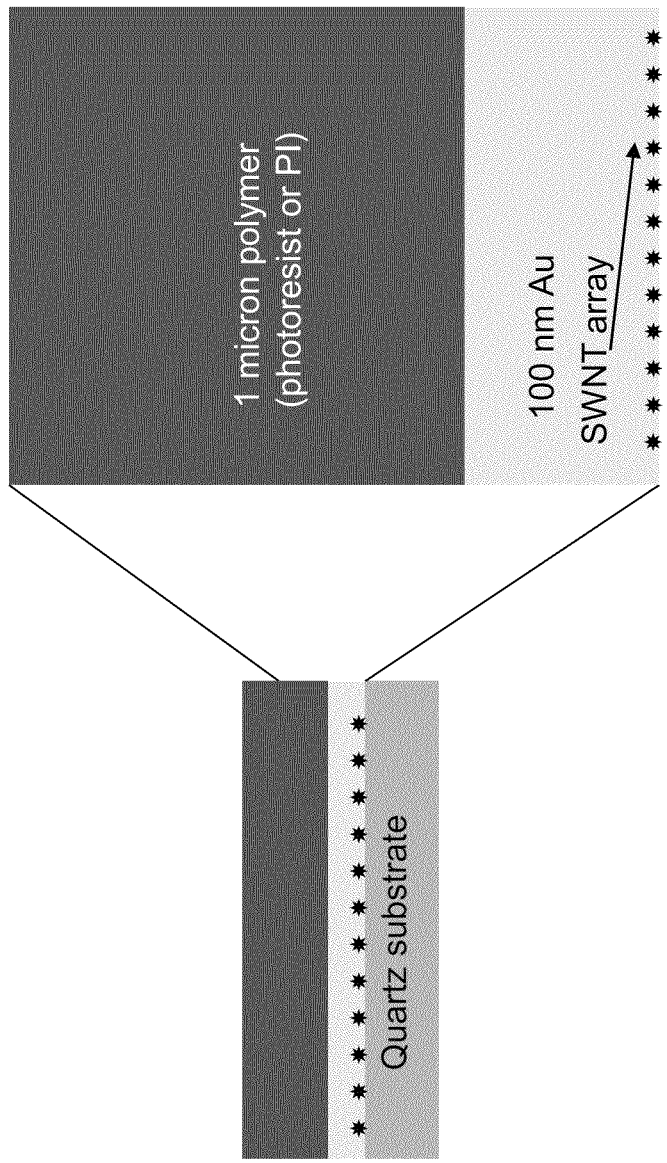

Optionally, any of the above means for releasing a transferable structure is combined with a carrier structure, for example a carrier film (FIG. 8A), such as a gold film as a carrier structure for printing carbon nanotubes (see Nature Nanotech. Vol 2, p.230). This process can be effective for FEMDs that are small (e.g., less than about 50 nm, e.g. molecules, SWNT, etc.) chemically fragile, mechanically fragile, mechanically soft, numerous and/or unwieldy to fabricate individually. FIGS. 8B and 8C provide examples of a structure and process, respectively, for inducing a crack mechanically between a substrate and a carrier film to release transferable FMEDs.

Figure 9:
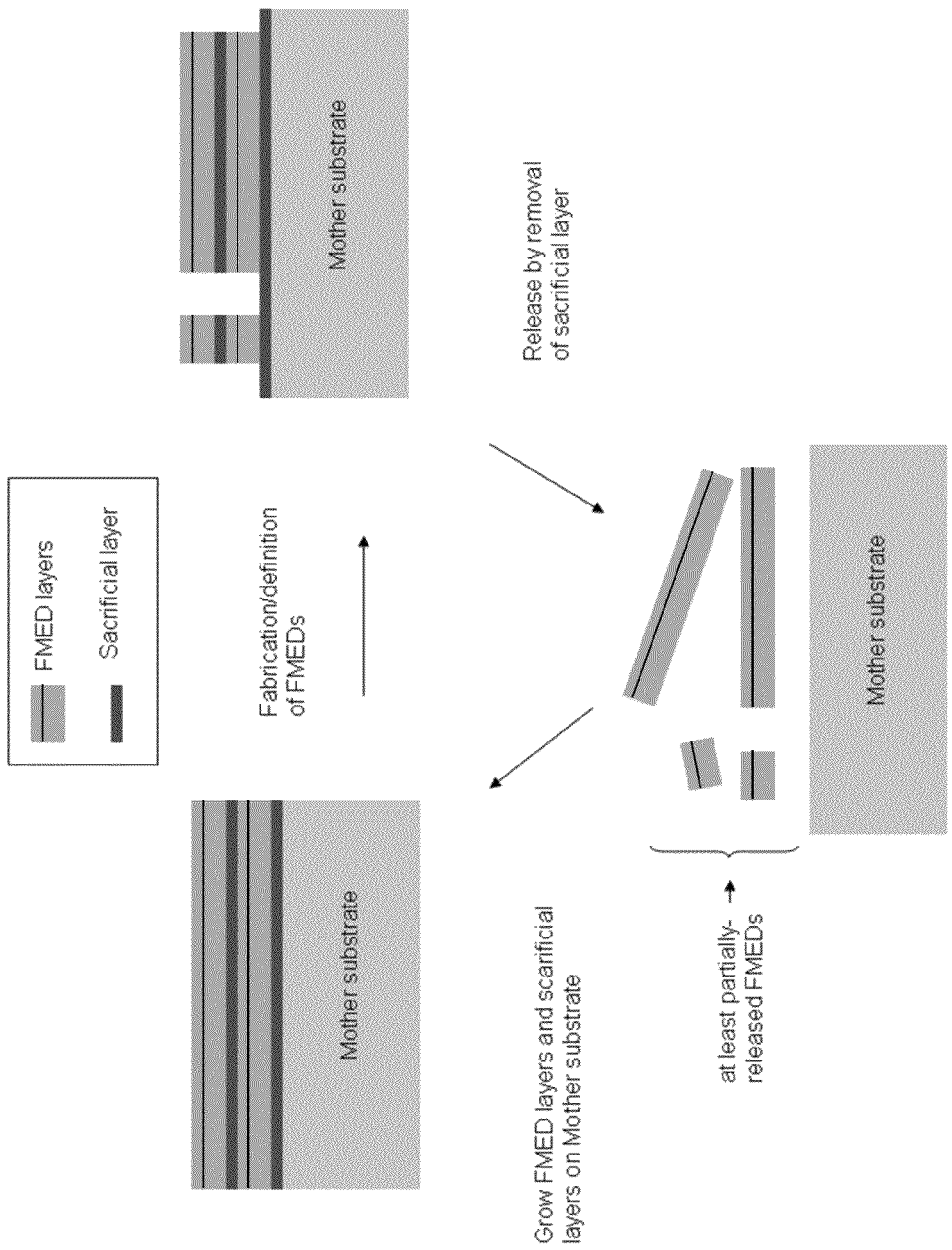
FIG. 9 illustrates a repeatable cycle combining simultaneous release of two or more release layers and reuseable use of the mother substrate. In this example, FMED layers and sacrificial layers are prepared on a mother substrate, FMEDs are fabricated, the sacrificial layers removed to release the FMEDs, and the process is repeated.

Release by any of the methods described herein is optionally incorporated into a process that reuses the mother substrate 40, as shown in FIG. 9A (and optionally provided in FIGS. 4 and 5), thereby providing improved manufacturing cost savings.

Figure 19:
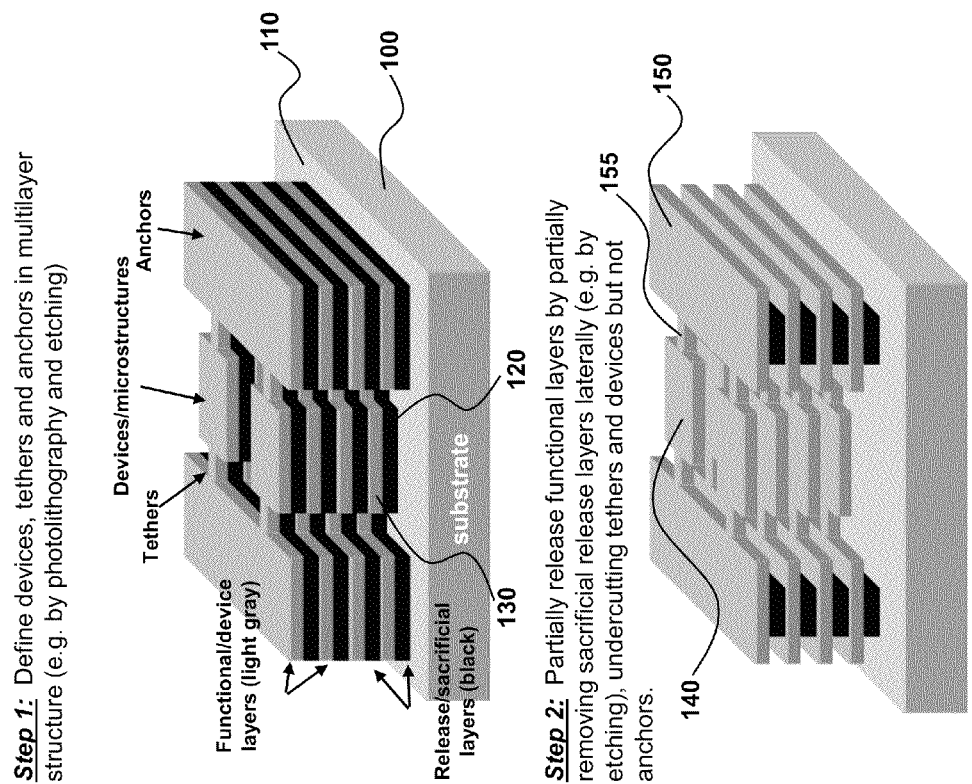
FIG. 19 is a schematic illustration of partial release of functional layers by partial removal of release layers (sacrificial layers), several release layers at a time (see also FIG. 3A). The release is referred to as "partial" because devices remain tethered to the substrate after the release layers are partially removed. Full release or separation of the devices occurs with their removal, for example, by fracture of tethering structures and retrieval using an elastomer stamp. Also outlined are the steps of removing the anchoring structures to prepare the substrate for re-deposition of multi-layer stacks.
Figure 19:
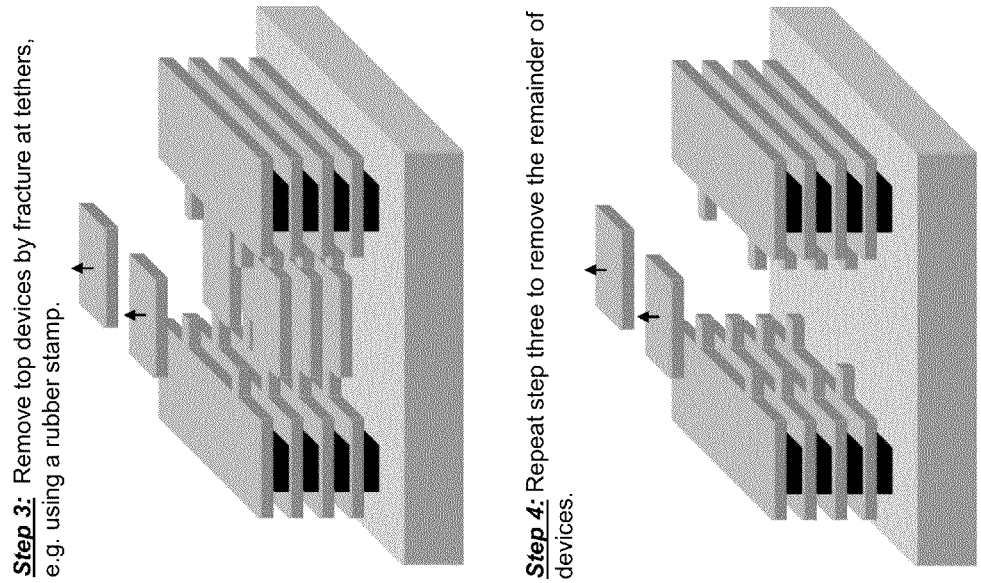

FIG. 19 is a schematic illustration of partial release of functional layers 130 by partial removal of release layers 120 (sacrificial layers), several release layers at a time (see also FIG. 3A). The release is referred to as "partial" because devices remain tethered to the substrate 100 after the release layers 120 are partially removed. Full release or separation of the devices happens upon their removal, for example, by fracture of tethering structures 155 and retrieval using an elastomer stamp. This figure also outlines the steps of removing the anchoring structures 150 to prepare the substrate for re-deposition of multi-layer stacks. Some examples of multi-layer structures that may yield printable devices according to the process outlined in FIG. 19 are shown in FIGS. 3C-3E. The details of the process are outlined in FIG. 4. FIG. 4 summarizes release of FMEDs for photovoltaics by "multiple-layers-at-a-time" with optional re-use of substrate for subsequent generation of additional transferable FMEDS. The functional layers comprise epitaxially grown semiconductors. The process also works for amorphous or polycrystalline materials similar to the process described in FIG. 12. Briefly, a GaAs substrate is obtained. Grow epilayers shown in FIG. 3C, for example, on GaAs substrate by MOCVD, MBE, etc. (similar process for FIGS. 3D and 3E for transistors, LEDs, respectively). Pre-treat substrate prior to growth as needed (CMP is optionally required). Grow about ~200 nm buffer layer of GaAs adjacent to substrate before depositing or epitaxially growing functional and sacrificial layers. A portion of the surface of the top epilayer may be masked with $SiO_2$ by Plasma-Enhanced Chemical Vapor Deposition (PECVD) and a form of lithography for patterning. Etch unmasked regions of epilayers using Cl/Ar/H plasma from surface to a distance into any $Al_{0.96}Ga_{0.04}As$ sacrificial layer (for example, into the sacrificial layer closest to the substrate). The sacrificial layer should not be the one farthest from the substrate (in that case, the release would be in a "one-at-a-time" process as summarized in FIGS. 3B and 5). Expose the substrate to concentrated HF to at least partially remove the exposed sacrificial layers and release the functional epilayers above the sacrificial layers by lateral undercutting. (HF attacks the functional epilayers more slowly (less than 1/10 etch rate) than it does the sacrificial layer). Separate the released FMEDs from substrate by stamping or perform solvent exchange for fluidic assembly or ink jet printing, electrospinning, etc. Use HF to remove any remaining portions of the sacrificial layers; wash/rub away any remaining portions of the overlying functional epilayers (anchoring structures, etc.). The functional layers that were originally directly underneath the layers that have since been removed are now exposed and on the surface of the substrate. Repeat steps between masking and HF removal, thereby releasing sets of functional layers (each set separated by sacrificial layers) until no sacrificial layers remain on the substrate. For optional re-use of the substrate, these steps are repeated as desired.

Figure 20:
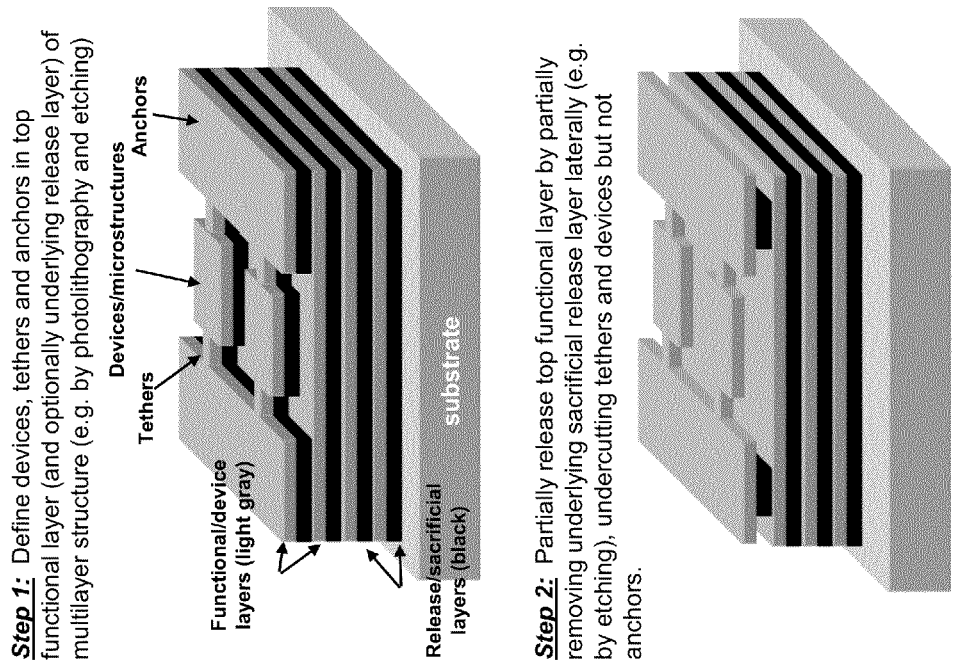
FIG. 20 is a schematic illustration of partial release of functional layers by partial removal of release layers (sacrificial layer), one release layer at a time (see also FIG. 3B). The release is referred to as "partial" because devices remain tethered to the substrate after the release layers are partially removed. Full release or separation of the devices happens upon their removal, for example, by fracture of tethering structures and retrieval using an elastomer stamp. This figure also outlines the steps of removing the anchoring structures to prepare the substrate for repeating the "one-layer-at-a-time release process" (as in FIG. 3B) and to prepare the substrate for re-deposition of multi-layer stacks.
Figure 20:
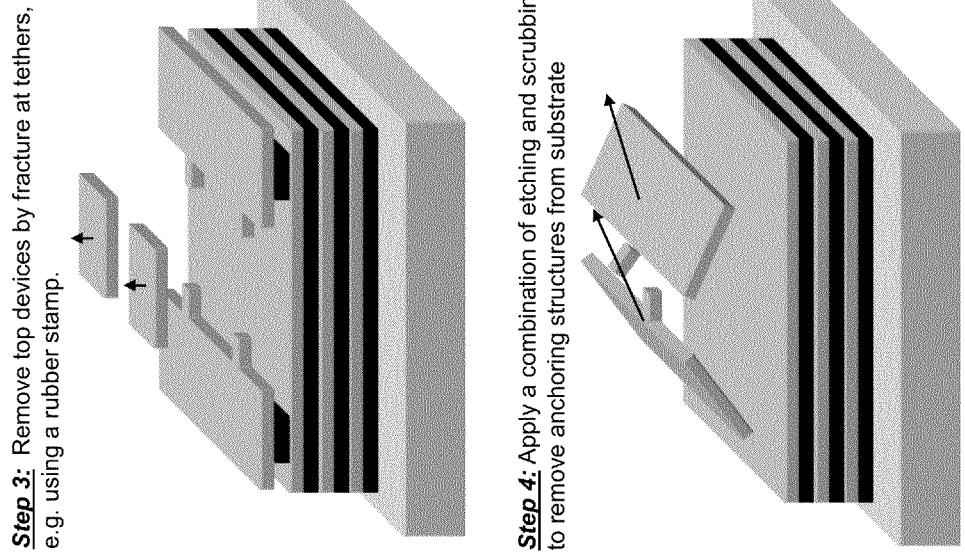

FIG. 20 is a schematic illustration of partial release of functional layers by partial removal of release layers (sacrificial layer), one release layer at a time (see also FIG. 3B). The release is referred to as "partial" because devices remain tethered to the substrate after the release layers are partially removed. Full release or separation of the devices happens upon their removal, for example, by fracture of tethering structures and retrieval using an elastomer stamp. This figure also outlines the steps of removing the anchoring structures to prepare the substrate for repeating the "one-layer-at-a-time release process" (as in FIG. 3B) and to prepare the substrate for re-deposition of multi-layer stacks. Some examples of multi-layer structures that may yield printable devices according to the process outlined herein are shown in FIGS. 3C-3E. The details of the process are outlined in FIG. 5. A substrate, such as a GaAs wafer provides support for growth of epilayers, such as the functional layer described in FIG. 3C, by MOCVD, MBE, etc. The substrate may be pre-treated prior to growth as needed (e.g., CMP). Likely will need to grow ~200 nm buffer layer of GaAs adjacent to substrate before deposition or epitaxial growth of the release and functional layers. Mask portion of the surface of the top epilayer with $SiO_2$ by Plasma-Enhanced Chemical Vapor Deposition (PECVD) and any form of lithography for patterning. Etch unmasked regions of epilayers using Cl/Ar/H plasma from surface to some distance into the first $Al_{0.96}Ga_{0.06}As$ sacrificial layer. Expose the substrate to concentrated HF to at least partially remove the exposed sacrificial layer (one) and release the epilayers above the sacrificial layer (functional layers) by lateral undercutting. (HF attacks the functional epilayers more slowly (less than 1/10 etch rate) than it does the sacrificial layer.) Separate the released FMEDs from substrate by stamping or do solvent exchange for fluidic assembly or ink jet printing, electrospinning, etc. Repeat steps between masking and HF removal, thereby releasing functional layers until no sacrificial layers remain on the substrate. For optional re-use of the substrate, these steps are repeated as desired.

Figure 21:
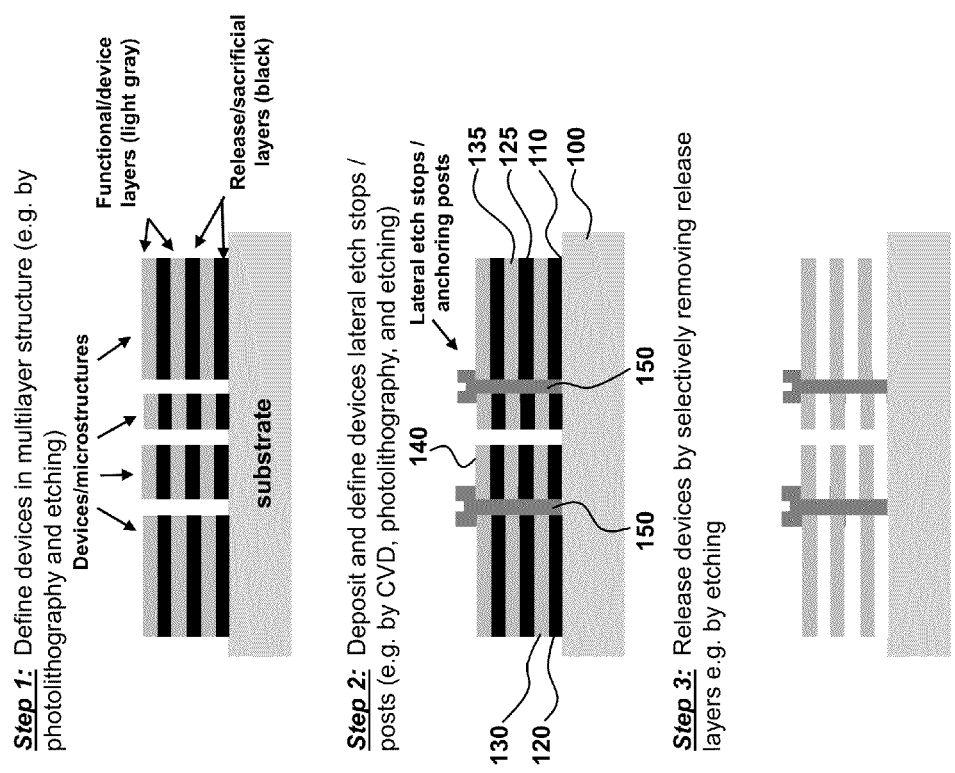
FIG. 21 is a schematic illustration of partial release of functional layers using lateral etch stops or anchoring posts by removing several release layers (sacrificial layers), at a time (see also FIG. 3A). The release is referred to as "partial" because devices remain tethered to the substrate via the lateral etch stops/anchoring posts after the release layers are removed. Full release or separation of the devices happens upon their removal, for example, by fracture of tethering structures and retrieval using an elastomer stamp. This figure also outlines the steps of removing the lateral etch stops/anchoring posts to prepare the substrate for re-deposition of multi-layer stacks.

FIG. 21 is a schematic illustration of partial release of functional layers using lateral etch stops or anchoring posts by removing several release layers (sacrificial layers), at a time (see also FIG. 3A). The release is referred to as "partial" because devices remain tethered to the substrate via the lateral etch stops/anchoring posts after the release layers are removed. Full release or separation of the devices happens upon their removal, for example, by fracture of tethering structures and retrieval using an elastomer stamp. This figure also outlines the steps of removing the lateral etch stops/anchoring posts to prepare the substrate for re-deposition of multi-layer stacks. Some examples of multi-layer structures that may yield printable devices according to the process outlined herein are shown in FIGS. 3C-3E. Referring to FIG. 21, Step 2, substrate 100 having external surface 110 supports first 120 and second 125 release layers. First 130 and second 135 functional layers are supported by first 120 and second 125 release layers, respectively. Anchor element 150 physically connects the functional layers with the substrate and provided breakable tether point 155 to facilitate controlled lift off of tranferable semiconductor element 140 (see step 4 and also FIG. 19). The details of the process are outlined in the following: The functional layers comprise epitaxially grown semiconductors. The process also works for amorphous or polycrystalline materials similar to the process described in FIG. 12. Briefly, a GaAs substrate is obtained. Grow epilayers shown in FIG. 3C, for example, on GaAs substrate by MOCVD, MBE, etc. (similar process for FIGS. 3D and 3E for transistors, LEDs, respectively). Pre-treat substrate prior to growth as needed (CMP is optionally required). Grow about ~200 nm buffer layer of GaAs adjacent to substrate before depositing or epitaxially growing functional and sacrificial layers. A portion of the surface of the top epilayer may be masked with $SiO_2$ by Plasma-Enhanced Chemical Vapor Deposition (PECVD) and a form of lithography for patterning. Etch unmasked regions of epilayers using Cl/Ar/H plasma from surface to a distance into any $Al_{0.96}Ga_{0.04}As$ sacrificial layer (for example, into the sacrificial layer closest to the substrate). The sacrificial layer should not be the one farthest from the substrate (in that case, the release would be in a "one-at-a-time" process as summarized in FIGS. 3B and 5). Deposit a conformal coating of silicon nitride by low-pressure chemical vapor deposition. Pattern the silicon nitride, for example by photolithography and etching using a fluorine plasma, to define lateral etch stops and/or anchoring posts. Expose the substrate to concentrated HF to at least partially remove the exposed sacrificial layers and release the functional epilayers above the sacrificial layers by lateral undercutting. (HF attacks the functional epilayers more slowly (less than 1/10 etch rate) than it does the sacrificial layer). Separate the released FMEDs from substrate by stamping or perform solvent exchange for fluidic assembly or ink jet printing, electrospinning, etc. Use HF to remove any remaining portions of the sacrificial layers. Use fluorine plasma to remove the silicon nitride; wash/rub away any remaining portions of the overlying functional epilayers (anchoring structures, etc.). Repeat HF, fluorine plasma and washing until the functional layers that were originally directly underneath the layers that have since been removed are cleanly exposed and on the surface of the substrate. Repeat steps between masking and cleaning, thereby releasing sets of functional layers (each set separated by sacrificial layers) until no sacrificial layers remain on the substrate. For optional re-use of the substrate, these steps are repeated as desired.

Figure 22:
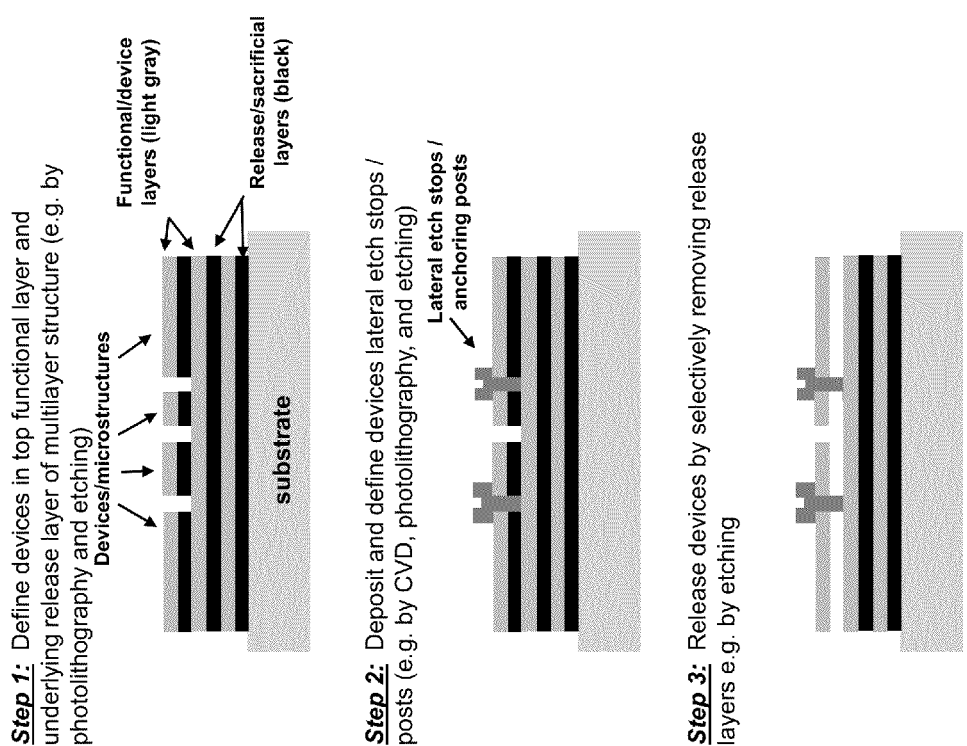
FIG. 22 is a schematic illustration of partial release of functional layers using lateral etch stops or anchoring posts by removing one release layer (sacrificial layer), at a time (see also FIG. 3B). The release is referred to as "partial" because devices remain tethered to the substrate via the lateral etch stops/anchoring posts after the release layers are removed. Full release or separation of the devices happens upon their removal, for example, by fracture of tethering structures and retrieval using an elastomer stamp. This figure also outlines the steps of removing the lateral etch stops/anchoring posts for repeating the "one-layer-at-a-time release process" (as in FIG. 3B) and to prepare the substrate for re-deposition of multi-layer stacks.

FIG. 22: schematic illustrations of partial release of functional layers using lateral etch stops or anchoring posts by removing one release layer (sacrificial layer), at a time (see also FIG. 3B). The release is referred to as "partial" because devices remain tethered to the substrate via the lateral etch stops/anchoring posts after the release layers are removed. Full release or separation of the devices happens upon their removal, for example, by fracture of tethering structures and retrieval using an elastomer stamp. This figure also outlines the steps of removing the lateral etch stops/anchoring posts for repeating the "one-layer-at-a-time release process" (as in FIG. 3B) and to prepare the substrate for re-deposition of multi-layer stacks. Some examples of multi-layer structures that may yield printable devices according to the process outlined in FIG. 22 are shown in FIGS. 3C-3E. The details of the process are as follows. A substrate, such as a GaAs wafer provides support for growth of epilayers, such as the functional layer described in FIG. 3C, by MOCVD, MBE, etc. The substrate may be pre-treated prior to growth as needed (e.g., CMP). Likely will need to grow ~200 nm buffer layer of GaAs adjacent to substrate before deposition or epitaxial growth of the release and functional layers. Mask portion of the surface of the top epilayer with $SiO_2$ by Plasma-Enhanced Chemical Vapor Deposition (PECVD) and any form of lithography for patterning. Etch unmasked regions of epilayers using Cl/Ar/H plasma from surface to some distance into the first $Al_{0.96}Ga_{0.04}As$ sacrificial layer. Deposit a conformal coating of silicon nitride by low-pressure chemical vapor deposition. Pattern the silicon nitride, for example by photolithography and etching using a fluorine plasma, to define lateral etch stops and/or anchoring posts. Expose the substrate to concentrated HF to at least partially remove the exposed sacrificial layer (one) and release the epilayers above the sacrificial layer (functional layers) by lateral undercutting. (HF attacks the functional epilayers more slowly (less than 1/10 etch rate) than it does the sacrificial layer.) Separate the released FMEDs from substrate by stamping or do solvent exchange for fluidic assembly or ink jet printing, electrospinning, etc. Use HF to remove any remaining portions of the sacrificial layers. Use fluorine plasma to remove the silicon nitride; wash/rub away any remaining portions of the overlying functional epilayers (anchoring structures, etc.). Repeat HF, fluorine plasma and washing until the functional layers that were originally directly underneath the first sacrificial layer are cleanly exposed and on the surface of the substrate. Repeat steps between masking and HF removal, thereby releasing functional layers until no sacrificial layers remain on the substrate. For optional re-use of the substrate, these steps are repeated as desired.

Figure 23:
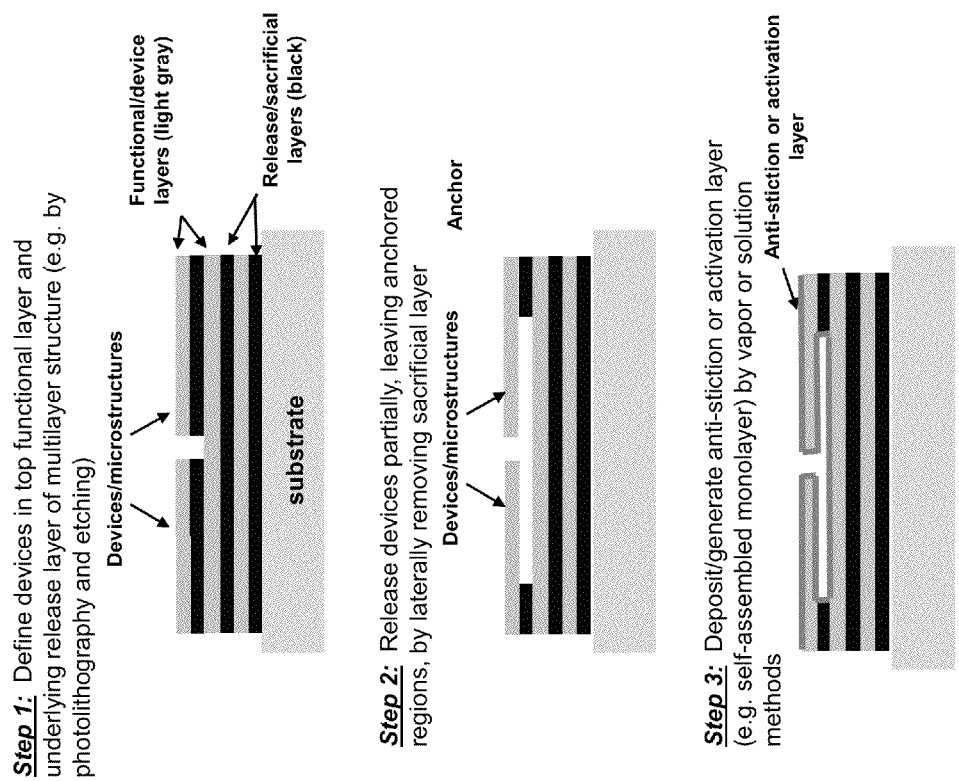
FIG. 23 is a schematic illustration of post-release treatment of functional layers with anti-stiction or activation layers after they have been partially released via a process similar to that described in FIG. 20. The anti-stiction or activation layers, often self-assembled monolayers (SAMs), serve to prevent adhesion between released layers and underlying layers (anti-stiction) or to promote adhesion (activation) between the released layers and a second material (e.g. elastomer stamps, nanoparticles, biological entities, etc.).
Figure 24:
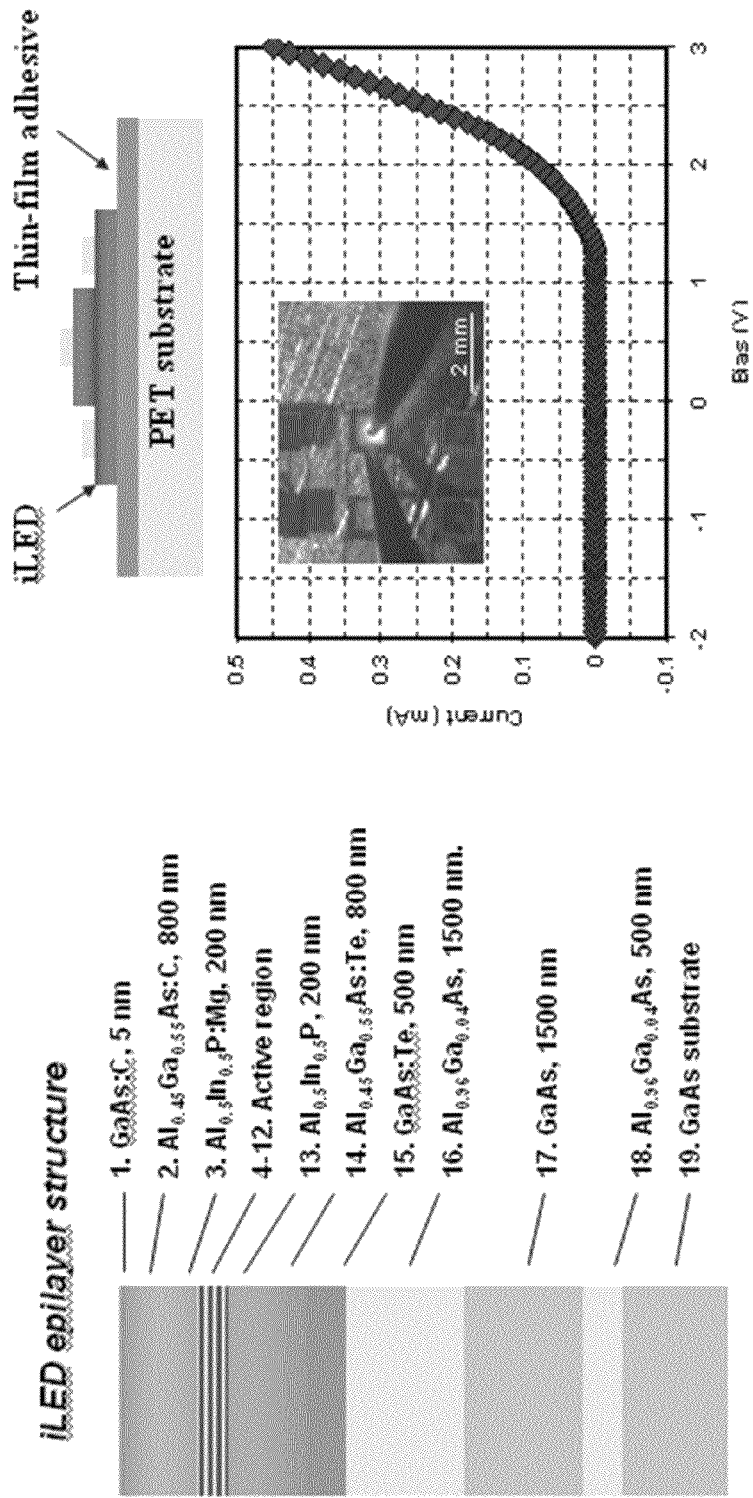
FIG. 24 illustrates a printed thin-film iLEDs on plastic. The iLED epilayer structural configuration is provided in the left figure. These LEDs are shown as being capable of release from a wafer, but not from a stacked configuration. These LEDs, however, are optionally released in a multilayer configuration, as disclosed herein.

FIG. 23: schematic illustrations of post-release treatment of functional layers with anti-stiction or activation layers after they have been partially released via a process similar to that described in FIG. 20. The anti-stiction or activation layers, often self-assembled monolayers (SAMs), serve to avoid adhesion between released layers and underlying layers (anti-stiction) or to promote adhesion (activation) between the released layers and some other entity (e.g. elastomer stamps, nanoparticles, biological entities, etc.). An example of a system to which the process outlined in FIG. 23 may be applied is described in FIG. 3D. After the definition of devices (e.g. by photolithography and chlorine plasma etching) and partial removal of the AlGaAs release layer by HF, an ethanolic solution of organic thiol-terminated molecule may be used to treat the exposed GaAs surfaces. For anti-stiction, this molecule may be an alkanethiol, for example, hexadecanethiol, or a perfluorinated alkanethiol. For activation, the thiol may be terminated additionally by reactive chemical groups, for example, octanedithiol.

Figure 35:
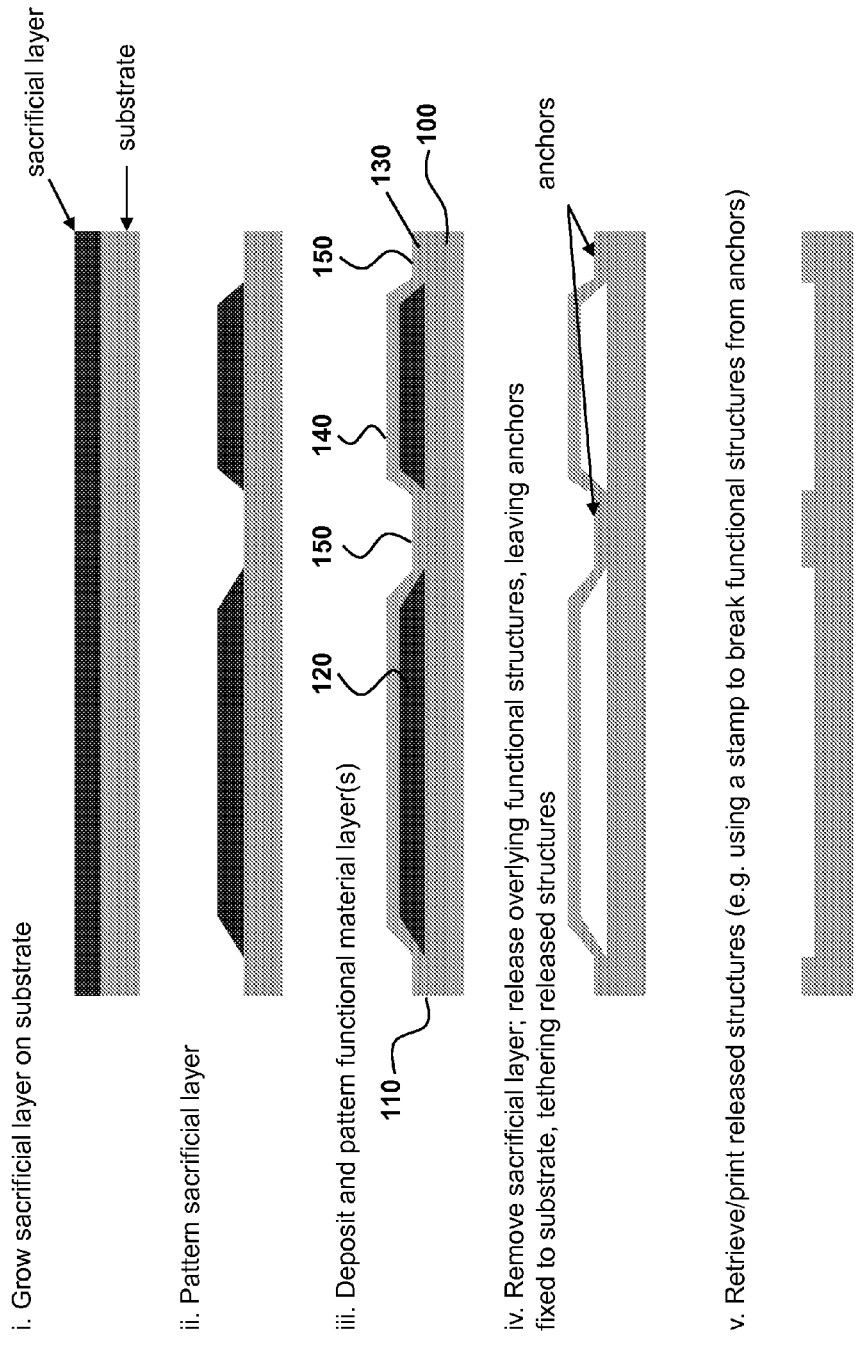
FIG. 35 is a schematic illustration of anchored release using patterned sacrificial structures.

FIGS. 35 and 36 provide a further example of an anchoring strategy that further improves generation of transferable structures that break from anchoring structures at well-defined positions, such as by a heterogeneous anchoring strategy (e.g., see FIG. 21). Referring to FIG. 35 panel iii., substrate 100 has an external surface 110 that supports a first sacrificial or release layer 120. A first functional layer 130 comprising a transferable semiconductor element 140 is supported by release layer 120, with the transferable semiconductor element 140 connected to substrate external surface 110 by anchor element 150. In particular, the advantages of the heterogeneous anchoring over homogeneous anchoring, (e.g. FIG. 20) include flexibility in designing breakable tether points, enhanced transfer control, and improvement of transfer registrability. In addition, various anchoring processes provide more efficient use of the wafer substrate area. Patterned sacrificial regions provide a capability to ensure that the transferable structures break from the anchoring structures at well-defined positions. In addition, patterned sacrificial increased increase area coverage. For example, because the anchoring structures are not undercut by the agent that removes the sacrificial layer, they need not be broader than perforations of the transferable structure. FIG. 36 illustrates the anchoring concept outlined in FIG. 35 and is an example of its practice: printing a mostly-transparent gold mesh from a silicon wafer to plastic.

Figure 37A:
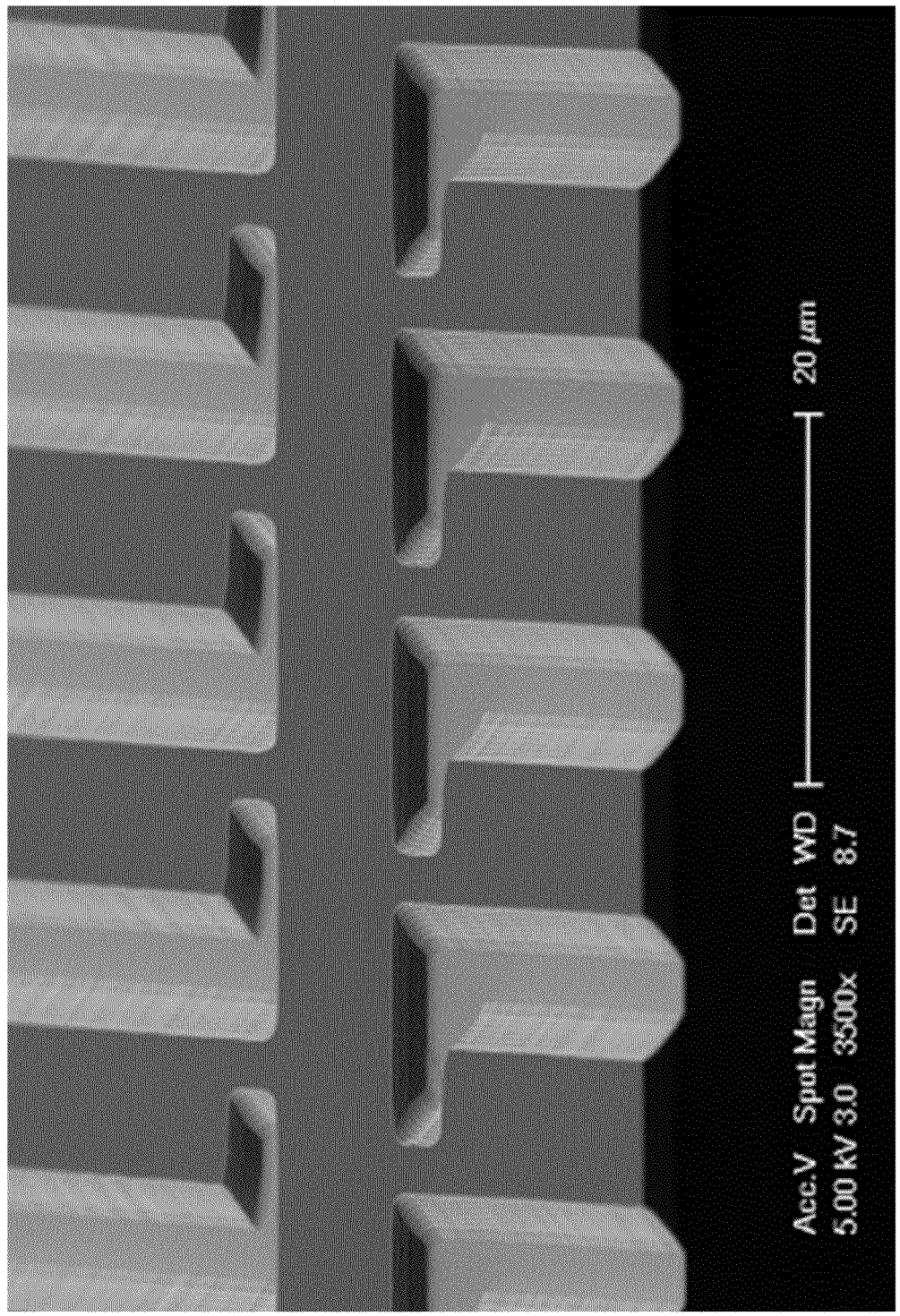
FIGS. 37A and 37B provides SEM images of a multilayer structure made of seven GaAs layers (each 200 nm thick) separated by $Al_{0.9}Ga_{0.1}As$ layers (each 100 nm thick) ready for release.
Figure 37B:
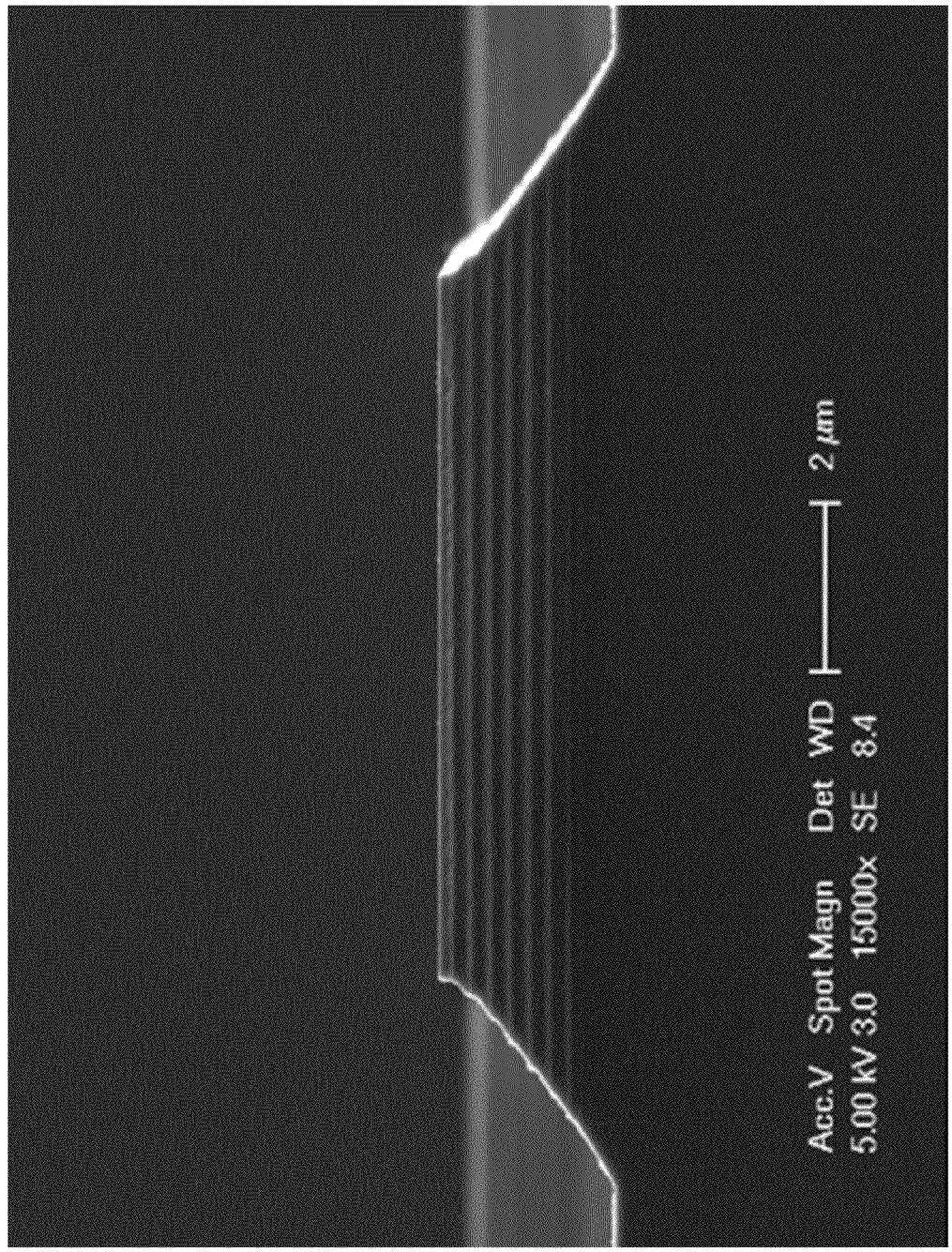

The processes disclosed herein are particularly suited for high-throughput printing of structures from a multilayer device to a substrate or component supported by a substrate, thereby decreasing manufacturing time and costs. For example, FIGS. 37A and 37B is an SEM of a seven-layer structure, where adjacent GaAs layers are separated by $Al_{0.09}Ga_{0.1}As$ layers. Epistructures are etched with phosphoric acid and hydrogen peroxide. The multilayer microstructures are machined from epilayers on a GaAs substrate by photolithography and wet etching.

Figure 38:
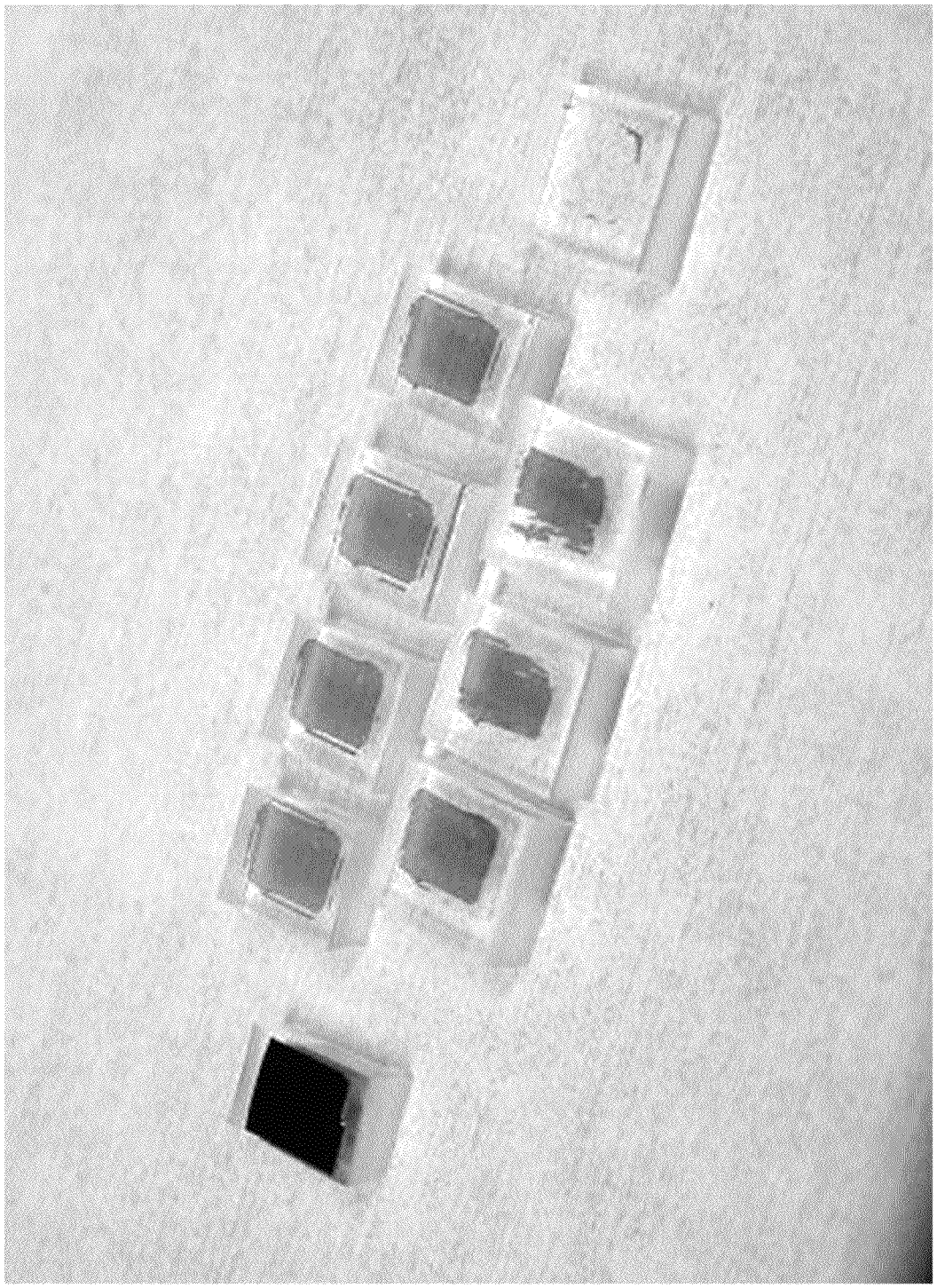
FIG. 38 is a photomicrograph of the seven layers of GaAs from FIGS. 37A and 37B retrieved onto PDMS stamps (labeled 1-7) after simultaneous release of the seven GaAs layers. A clean donor chip without any layers is labeled "donor chip." The stamp labeled "8" shows that no significant GaAs structures remain on the donor chip.
Figure 39A:
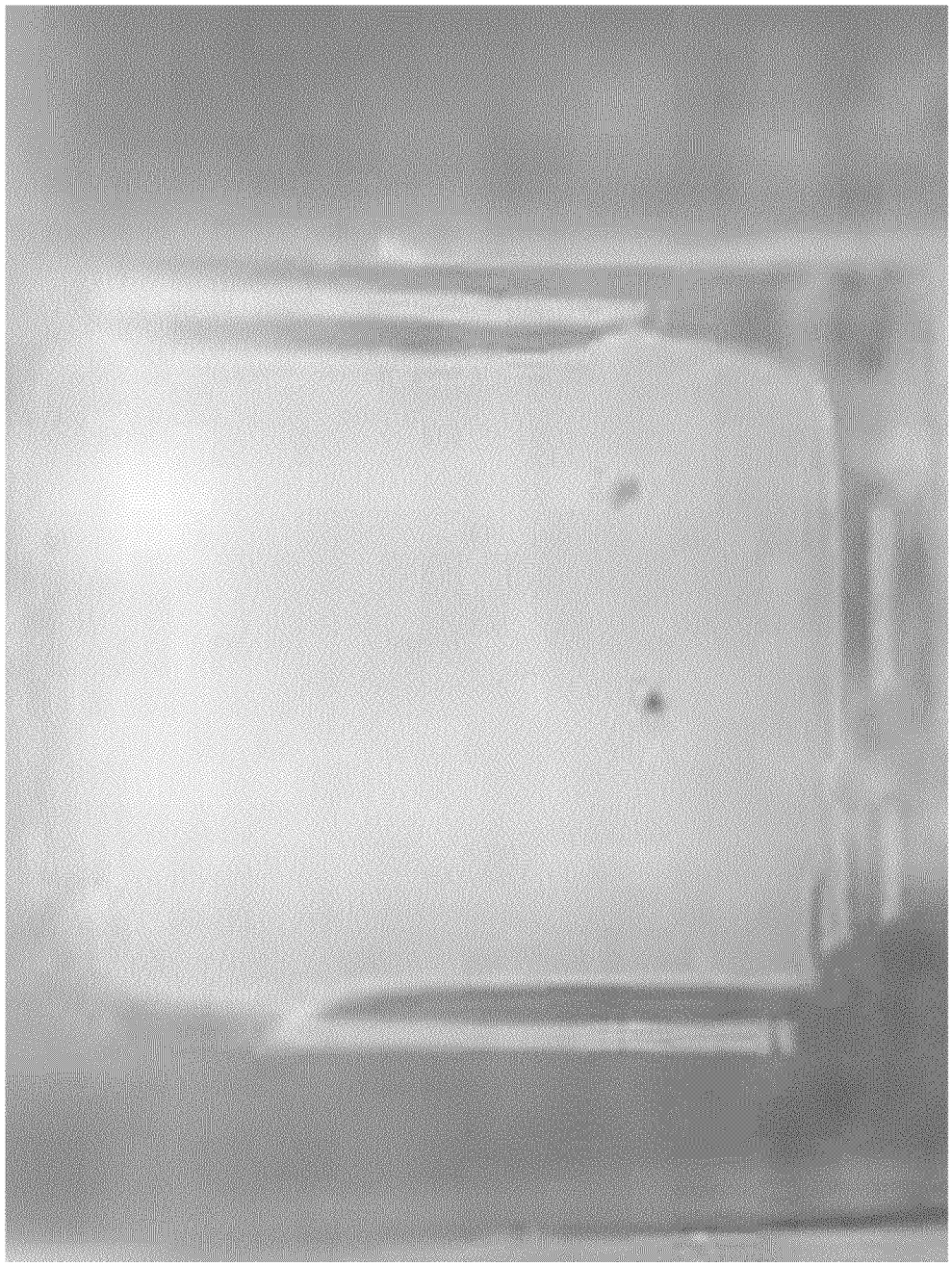
FIGS. 39A and 39B shows optical images of the GaAs layers exfoliated from a multilayer donor substrate via a PDMS stamp. The scale bars in FIG. 39A and FIG. 39B are 1 mm and 50 μm, respectively.
Figure 39B:
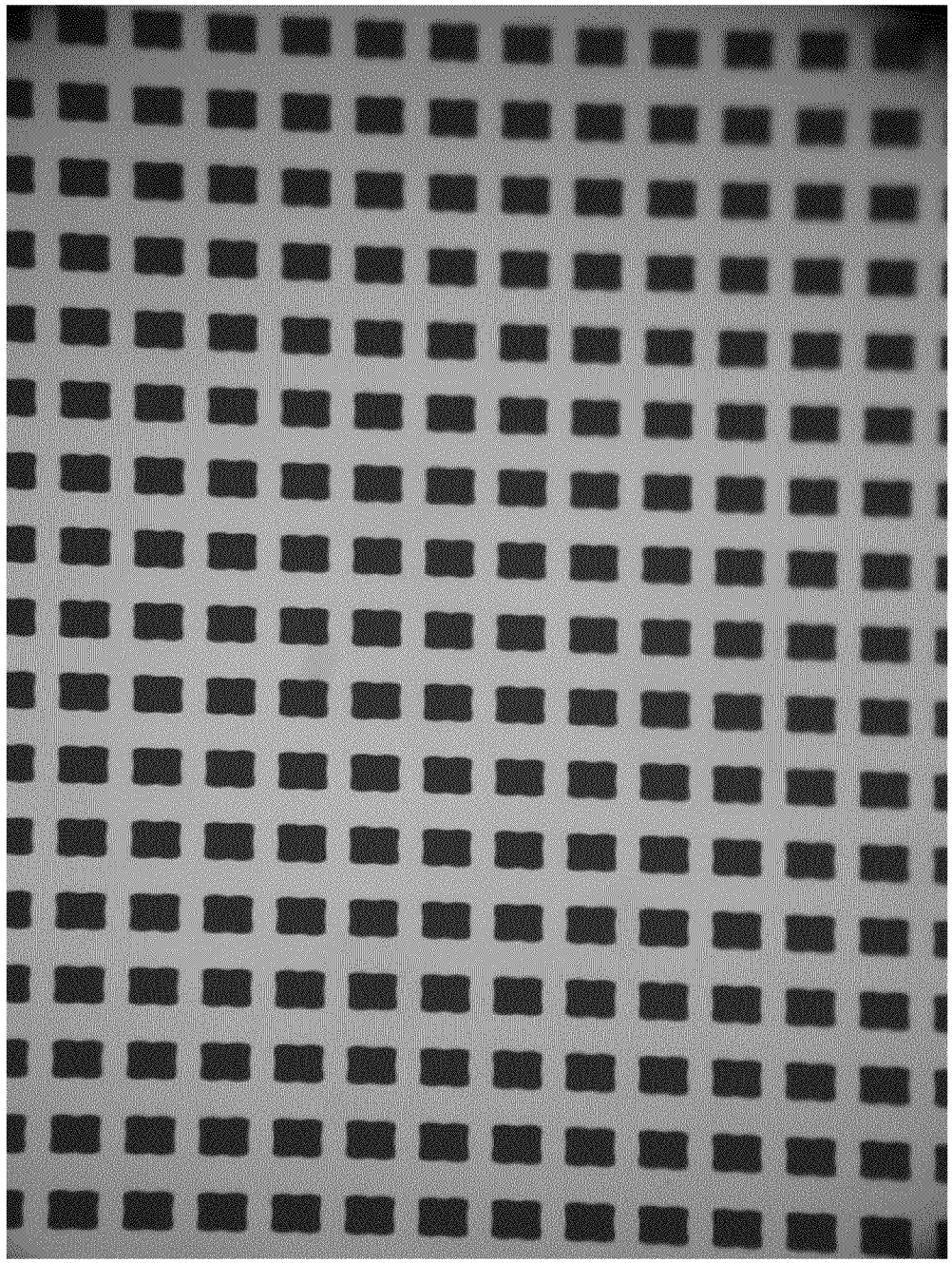

FIG. 38 is a photograph of the seven GaAs layers retrieved onto PDMS stamps after simultaneous release of the seven GaAs layers. Similar retrieval is expected for individual layer-by-layer release as disclosed herein. Briefly, the release procedure involves masking the epistructure with S1802 photoresist. The masked structure is etched with $H_3PO_4:H_2O_2$: DI, 1:13:12, for 1 min. The photoresist is stripped with acetone followed by chemical removal of the release layers with 49% HF for 35 seconds and dry rinsing with $N_2$. Layers are sequentially exfoliated (labeled in FIG. 38 as 1 through 8) using PDMS stamps. The 8th stamp is used to check for "left-overs." FIGS. 39A and 39B provides an optical image of a GaAs layer exfoliated from the multilayer donor substrate on the surface of a PDMS stamp. These layers are ready for printing to device substrate or to a component or a device substrate.

EXAMPLE 4

Bulk Quantities of Single-Crystal Silicon Micro-/Nanoribbons Generated from Bulk Wafers This Example demonstrates a strategy for producing bulk quantities of high quality, dimensionally uniform single-crystal silicon micro- and nanoribbons from bulk silicon (111) wafers. The process uses etched trenches with controlled rippled structures defined on the sidewalls, together with angled evaporation of masking materials and anisotropic wet etching of the silicon, to produce multilayer stacks of ribbons with uniform thicknesses and lithographically defined lengths and widths, across the entire surface of the wafer. Ribbons with thicknesses between tens and hundreds of nanometers, widths in the micrometer range, and lengths of up to several centimeters, are produced, in bulk quantities, using this approach. Printing processes enable the layer by layer transfer of organized arrays of such ribbons to a range of other substrates. Good electrical properties (mobilities ~190 $cm^2V^{-1}s^{-1}$, on/off >$10^4$) can be achieved with these ribbons in thin film type transistors formed on plastic substrates, thereby demonstrating one potential area of application.

Nanostructured elements of single-crystal silicon, in the form of wires, ribbons, and particles, are of interest for a number of applications in electronics, optoelectronics, sensing, and other areas. The ribbon geometry is important for certain devices because it provides, for example, large planar surfaces for chemical sensing and photodetection, and geometries that can efficiently fill the channel regions of transistors. Growth techniques related to the well-developed chemical synthetic approaches used for silicon nanowires[1] have been adapted and applied with some success to produce Si nanoribbons.[2] The levels of dimensional control and yields of ribbons provided by these procedures and similar ones for materials such as oxides (ZnO, $SnO_2$, $Ga_2O_3$, $Fe_2O_3$, $In_2O_3$, CdO, $PbO_2$, etc.),[3] sulfides (CdS, ZnS),[4] nitride (GaN),[5] and selenides (CdSe, ZnSe, $Sb_2Se_3$)[6] are, however, modest. By contrast, approaches that rely on the lithographic processing of top surfaces of semiconductor wafers enable well-controlled thicknesses, widths, lengths, crystallinity, and doping levels. These methods can form membranes, tubes, and ribbons, with thicknesses in the micrometer to nanometer range, composed of Si, SiGe, bilayered Si/SiGe, GaAs, GaN, and others.[7-12] Furthermore, various processes can transfer these elements, in organized arrays, to other substrates for device integration. This "top down" approach has three main disadvantages compared to the growth techniques. First, elements with widths less than ~100 nm are difficult to fabricate, due to practical limitations in the lithography. Second, only those materials that can be grown in thin film or bulk wafer form can be used. Third, and most significant for many applications, the production of bulk quantities of micro-/nanostructures requires large numbers of wafers, each of which can be expensive. The first disadvantage is irrelevant to the many applications that do not require structures with such small dimensions. The second does not, of course, apply to many important materials, including silicon. This Example presents results that address the third limitation. In particular, it introduces a simple method for generating large numbers of high-quality Si ribbons, with thicknesses down to tens of nanometers, from standard bulk Si wafers, in a single processing sequence. Briefly, the approach begins with controlled deep reactive ion etching of silicon wafers through an etch mask to produce trenches with well-defined rippled sidewall morphologies. A collimated flux of metal deposited at an angle onto these ripples creates isolated metal lines that act as masks for highly anisotropic wet etching of the silicon along planes parallel to the surface of the wafer. This single etching step creates bulk quantities of silicon ribbons in multilayer stacked geometries. These ribbons can be removed from the wafer and solution cast or dry transfer printed onto desired substrates, with or without preserving their lithographically defined spatial order, for integration into devices such as transistors. This approach relies only on standard cleanroom processing equipment. As a result, it can be useful to researchers with interest in silicon micro-/nanostructures but without the specialized growth chambers and recipes needed to create them in large quantities using direct synthetic techniques.

Figure 25:
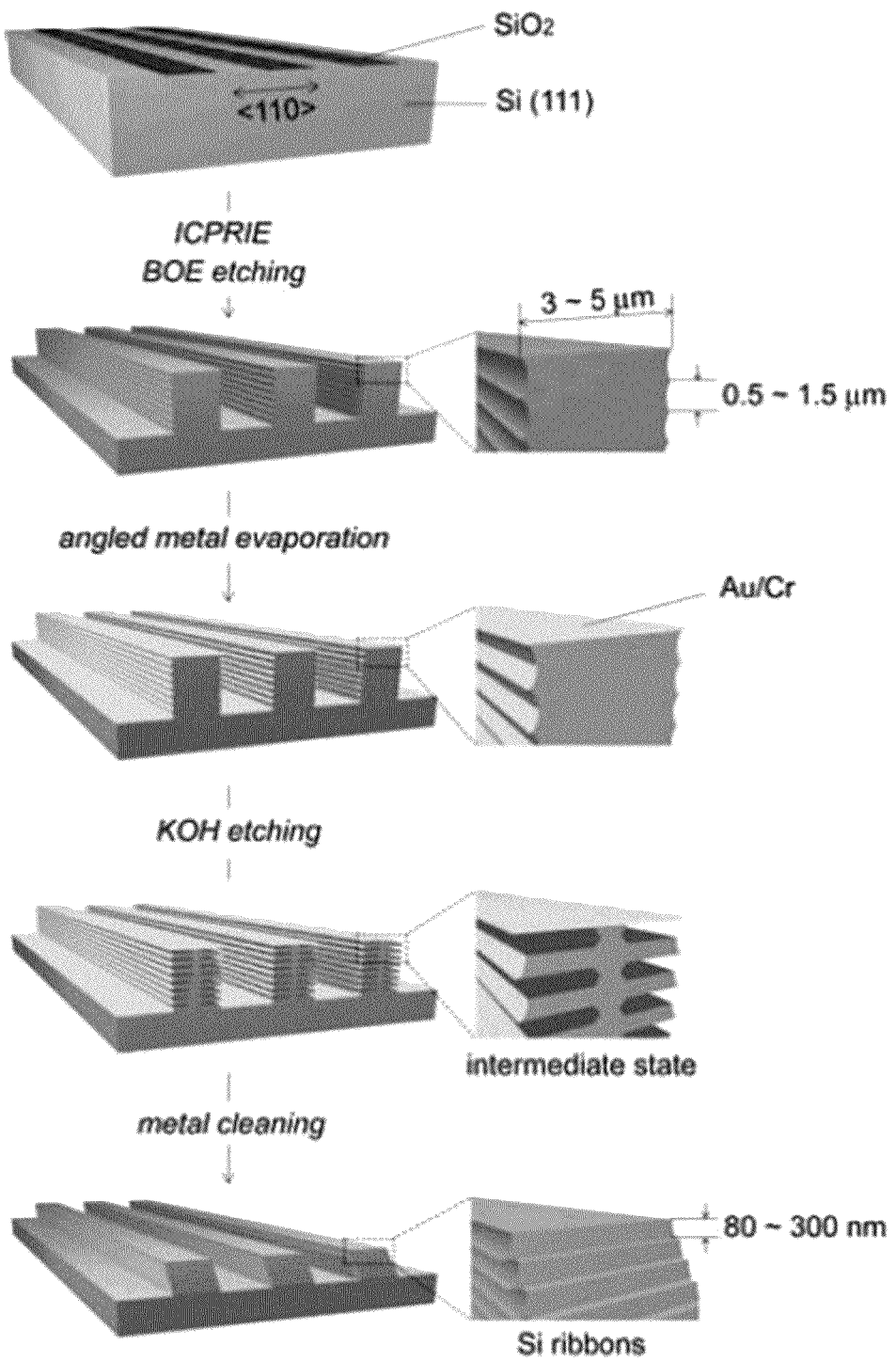
FIG. 25 is a schematic illustration of steps for fabricating bulk quantities of single-crystal silicon micro-/nanoribbons, in multilayer stacked configurations, from a conventional bulk Si(111) wafer. The process exploits the combined use of specialized etching procedures to generate trenches with sculpted sidewalls, shallow angle directional physical vapor deposition, and anisotropic wet chemical etching. The dashed boxes on the left illustrate the zoomed regions that appear on the right. BOE stands for buffered oxide etchant.
Figure 26:
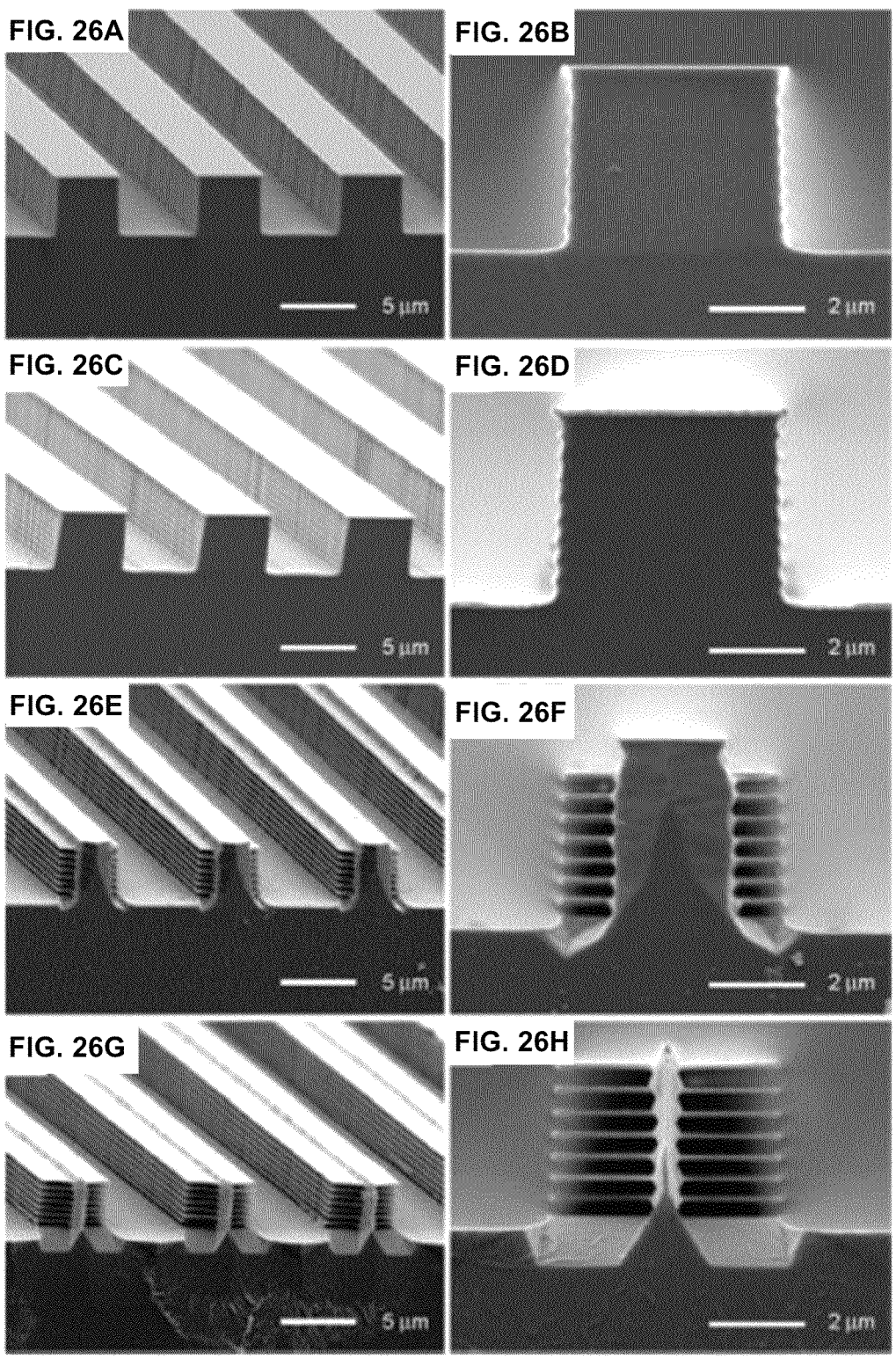
FIG. 26A-26H is a series of scanning electron micrographs of a Si(111) wafer in angled (FIGS. 26A, 26C, 26E, 26G) and cross-sectional (FIGS. 26B, 26D, 26F, 26H) views at various stages of fabrication of multilayer stacks of ribbons.

FIG. 25 presents a schematic illustration of the fabrication sequence. In the first step, dry thermal oxidation at 1100° C. for 2 h produced a thin (~150 nm) layer of $SiO_2$ on the surface of the wafer. After coating an adhesion promoter, 1,1,1,3,3, 3-hexamethyldidilazane (HMDS, Acros Organics), contact mode photolithography (Shipley 1805 photoresist (PR) and MF-26A developer) followed by annealing at 110° C. for 5 min provided a PR mask. Wet etching in a buffered oxide etchant (BOE, Transene Co.) solution for 1 min 30 s and cleaning the residual PR in acetone generated lines of $SiO_2$ on the wafer. These lines provided masking layers for inductively coupled plasma reactive ion etching of the silicon (STS-ICPRIE, STS Mesc Multiplex Advanced Silicon Etcher). The lines were oriented perpendicular to the <110> direction as shown in FIG. 25, such that the sidewalls of the etched trenches exposed the {110} planes. ICPRIE tools are principally designed to produce high aspect ratio structures and flat, vertical sidewalls by use of alternating cycles of etching the silicon and depositing a fluoropolymer to protect the sidewalls against the etch.[13] We instead modified the process cycles to sculpt well-controlled rippled structures of relief into these sidewalls, through suitable control of gas flow rate, electrode power, chamber pressure, and etching cycle duration. Ripples with periods and amplitudes in a range of 80 nm to 1.5 μm and 50-450 nm, respectively, could be achieved reproducibly and uniformly over the processed areas (4 in. wafer size). As an example, parameters that produced periods and amplitudes of 540 and 130 nm, respectively, were as follows: gas flow, $O_2/SF_6$=13/130 sccm (cubic centimeter per minute at STP) for etching and $C_4F_8$=110 sccm for deposition; gas pressure, 94 mTorr; etching power, 600/12 W for inductive coupled plasma (ICP)/platen (P); deposition power, 600/0 W for ICP/P; etching duration, 7 s; deposition duration, 5 s. The etching conditions between the deposition cycles define these ripple structures. Because the $SF_6/O_2$ mixture gives nearly isotropic etching, the amplitudes and periods of the ripples are related. The smallest ripple structure has a period of 80 nm with an amplitude of 50 nm; the largest has a period of 1.5 μm and an amplitude of 450 nm. Immersing the etched samples in $NH_4OH/H_2O_2/H_2O$=1:1:5 at 100° C. for 10 min removed the fluoropolymer on the sidewalls. Dipping the sample in a BOE solution for 2 min followed by rinsing in deionized water removed the residual $SiO_2$ layer. Next, angled electron beam evaporation (15° from the normal axis of a wafer) of Cr/Au (3/47 nm) with a collimated flux formed physical etch masks along the lower, but not upper regions, of all of the ripples, due to shadowing associated with the overhang relief. The evaporation angle controls the extent of this shadowing. Anisotropic wet chemical etching with a KOH solution (PSE-200, Transene Co., 110° C.) removed Si along the <110> direction, beginning in all regions of exposed Si along the sidewalls. The etching rate of KOH along the {110} planes is much faster, by up to several hundred times, than that along the {111} planes because the {110} planes have a lower density of atoms and higher density of dangling bonds than the {111} planes.[14] As a result, this etch proceeded completely from one side of each trench to the adjacent side in a direction parallel to the surface of the wafer, thereby releasing multilayer stacks of individual ribbons with thicknesses determined by the angled evaporation and the ripple structure (i.e., period and amplitude). Removing the Cr/Au with a $KI/I_2$(aq) solution (2.67/0.67 wt %) and further cleaning with $HCl/H_2O_2/H_2O$=1:1:1 by volume and HF(aq) completed the fabrication. Sonication released the ribbons into solution (e.g., $CH_3OH$) to prepare them for casting onto other substrates.

Figure 17:
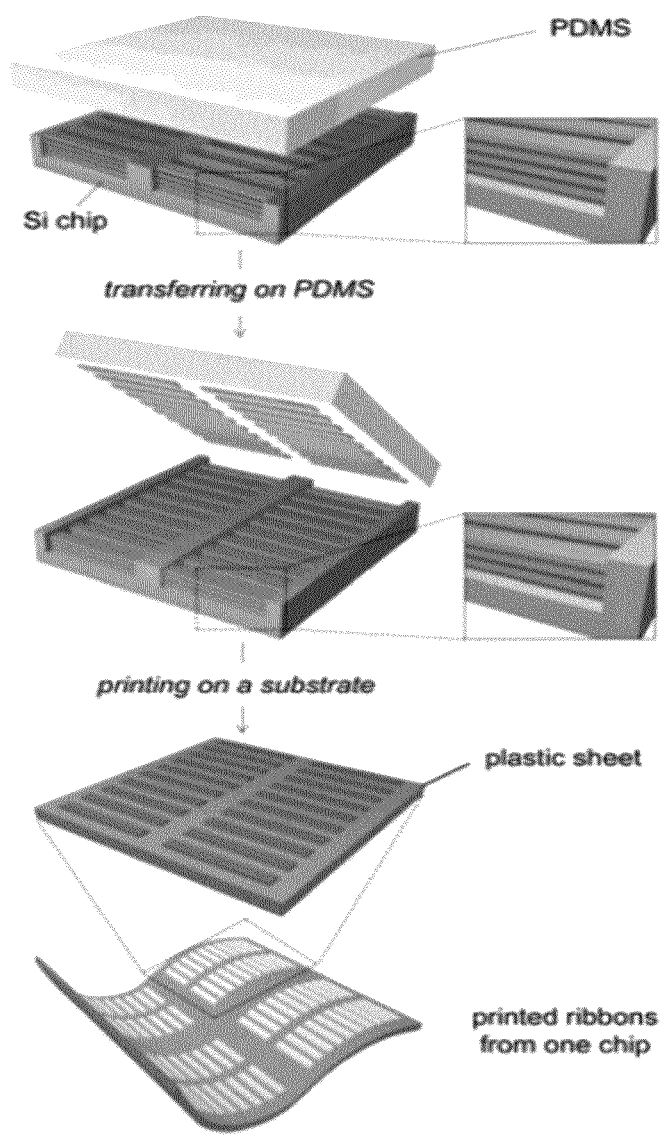
FIG. 17 is a schematic illustration of steps for transfer printing, one layer at a time, organized arrays of silicon micro-/nanoribbons from multilayer stacks created on the surface of a silicon wafer. The arrays of ribbons can be printed onto a wide range of substrates, including flexible plastics as illustrated here. The dashed boxes on the left illustrate the zoomed regions that appear on the right
Figure 18:
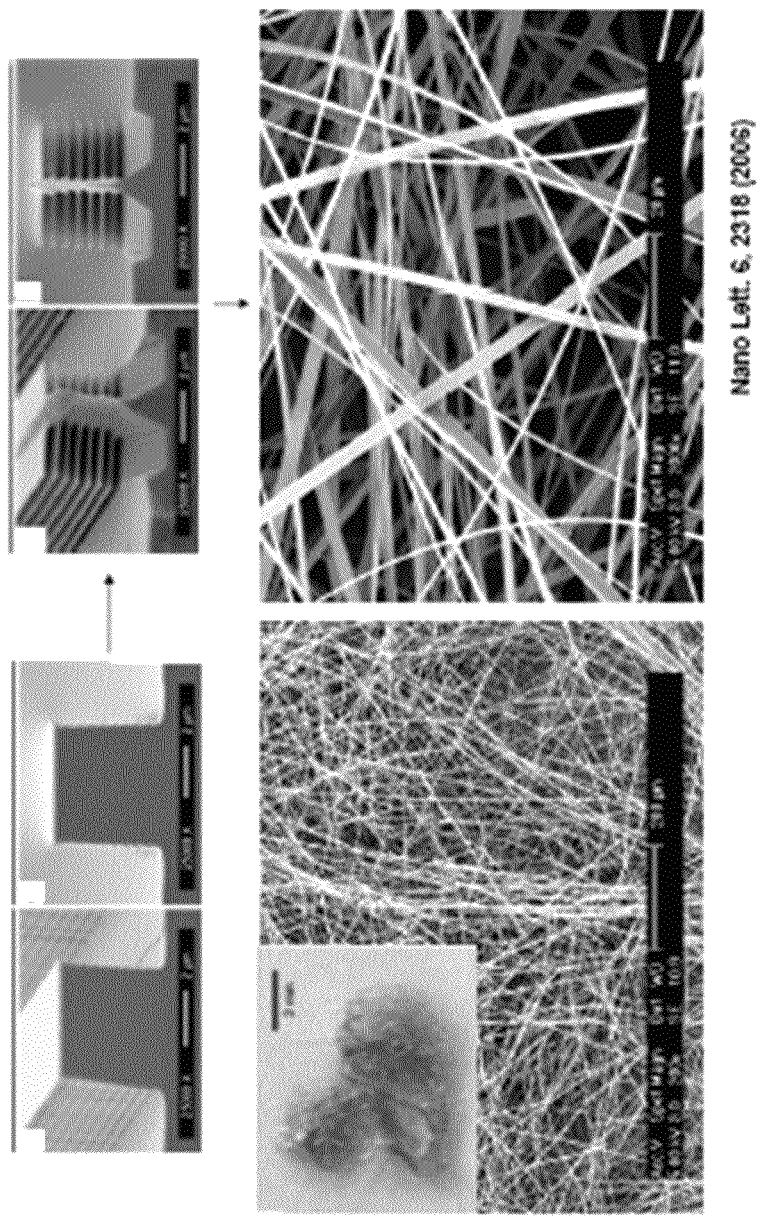
FIG. 18 is scanning electron micrographs of a Si (111) wafer (top panels) supporting a multilayer stack of ribbons (top panel). The bottom panel are SEM of ribbons with the inset an optical photograph (scale bar 2 mm).

To facilitate integration of these elements into devices, it is valuable to maintain their lithographically defined alignments and positions. For this purpose, we introduced breaks (width=10-20 μm) in the $SiO_2$ lines such that the ends of each ribbon remain anchored to the Si wafer even after complete undercut etching with KOH. Soft printing techniques that use elastomeric elements of poly(dimethylsiloxane) (PDMS) can lift up organized arrays of such anchored Si ribbons,[7,15] one layer at a time, from the source wafer for transfer to a target substrate. FIG. 17 schematically illustrates this process, as applied to a flexible plastic substrate. Applying slight pressure on the PDMS to enable contact with progressively lower Si ribbon layers and quickly peeling it away released ribbon arrays with the highest transfer efficiencies (>~90% up to a third layer).[15] Using small pressures allowed conformal contact but at the same time avoided breaking and/or distorting the ribbons. In this approach, the ribbons adhere to the PDMS through van der Waals interactions that are, as integrated along the lengths of the ribbons, sufficiently strong to fracture the ribbon anchors upon peelback. Contacting the Si ribbon-coated stamps to a substrate (thickness=0.2 mm, PET, -Delta Technologies) with a thin, spin cast adhesive layer (thickness=135 nm, SU-8, Microchem) and heating at 70° C. for 1 min produced strong bonding between the ribbons and the substrate. Peeling away the PDMS removed the ribbons from the PDMS. Flood exposing the adhesive (photopolymer) layer to ultraviolet light (λ=365 nm, 13 mW/cm², 10 s) and further heating (120° C., 5 min) enhanced the adhesion between the ribbons and the substrate. Multiple cycles of transfer printing with a single wafer source of ribbons can produce large area coverage (compared to the wafer) on plastic, as illustrated in FIG. 17, or other substrates.

FIG. 26A-26H shows scanning electron microscope (SEM) images of a Si(111) wafer (Montco, Inc., n-type, 1-10 Ωcm) at various stages of the process illustrated in FIG. 25. The thicknesses, in the intermediate processing state corresponding to FIGS. 26G and 26H, were 100±10 nm. Fully released ribbons had thicknesses of 80±15 nm, due to extended exposure to the KOH etchant. The thickness uniformity is excellent in a given multilayer stack, as well as across the wafer, except for the top most ribbon which is somewhat thinner (by ~10 nm in this case) than the others due to a slight undercut in the ICPRIE below the $SiO_2$ mask. The lengths and widths of the ribbons are uniform within a variation of ±120 nm using conventional contact mode photolithography. For this range of thicknesses, widths of 3-5 μm, and lengths up to several centimeters, the ribbons did not collapse into contact with one another during the KOH etching, until they were completely undercut. By change of the amplitudes and periods of the sidewall ripples, thicknesses between 80 and 300 nm could be achieved, uniformly across the wafer. The variations in thicknesses of individual ribbons define the smallest thicknesses that can be achieved reliability. These variations have four main sources. The first two are the roughness on the edges of the $SiO_2$ masks and on the rippled sidewalls, both of which directly translate into thickness variations. Third, grain structure in the angle evaporated metal masks can cause similar effects. Fourth, slight misalignments of the ICPRIE etched trenches from the Si {110} planes and inhomogeneities (i.e., local temperature and concentration) in the KOH etching bath can also lead to variations.[16] These factors place practical bounds on the smallest reliably achievable ribbon thickness at ~80 nm, with the procedures described here. Widths as small as ~1 μm are possible using a standard contact mode photolithography tool. Combined improvements in the lithography (e.g., use of electron beam or imprint lithography), etching (e.g., temperature controlled ICPRIE), and deposition (e.g., smaller grain sizes in the metal resist lines) could substantially (i.e., by two times or more) reduce these minimum dimensions. The other limit associated with this process is on the ratio of width to thickness; ratios larger than ~60 are difficult to achieve, due to aspects associated with the KOH etching, such as its finite degree of anisotropy as well as mechanical collapse of the ribbons and/or delamination of the metal mask lines before complete undercut.

Figure 27:
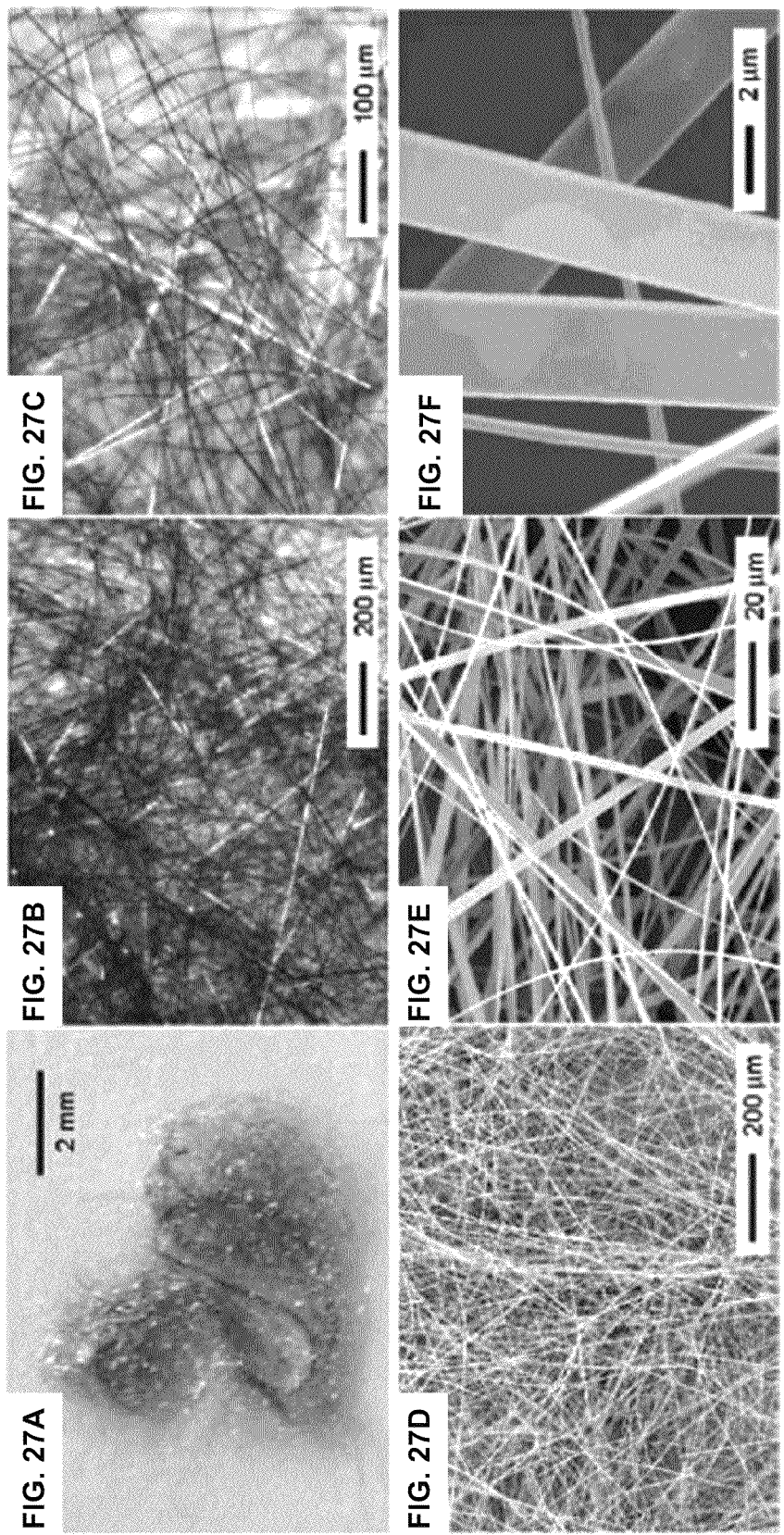
FIG. 27A is a photograph and FIGS. 27B and 27C are optical micrographs of Si(111) ribbons after release from the wafer.
FIGS. 27D-27F are scanning electron micrographs of the ribbons shown in FIG. 27A at various levels of magnification.

FIG. 27 shows collections of these ribbons deposited from solution onto a glass slide, after releasing them from the wafer by sonication. The uniformity in the widths and lengths of these ribbons is high (variation=±120 nm). The ~6×10³ ribbons (thickness=250 nm, width=3 μm, and length=~1.5 cm), shown here were collected from an area of 1.5×1.5 cm²; this sample represents 90 m of ribbons with a mass of 0.16 mg. Experimental data suggest that scaling the process up to as many as 10 layers, with wafers having diameters of up to 150 mm is readily possible. In this case, a single processing sequence (FIG. 25) would generate 32 mg of ribbons. It is important to note, in this case, that large substrates require some care in order to achieve uniform deposition angles for the metal masking layers. For a typical evaporator system, such as the one used for the studies reported here, variations in deposition angles are 0.72°, 1.36°, and 13.8° for substrate diameters of 8, 15, and 150 mm, respectively. Increasing the distance between the source and substrate, or other easily implementable strategies, can reduce these variations substantially.

The high level of disorder present in the ribbons shown in FIG. 27A-27F highlights the need to achieve well-defined configurations suitable for device integration.

Figure 28:
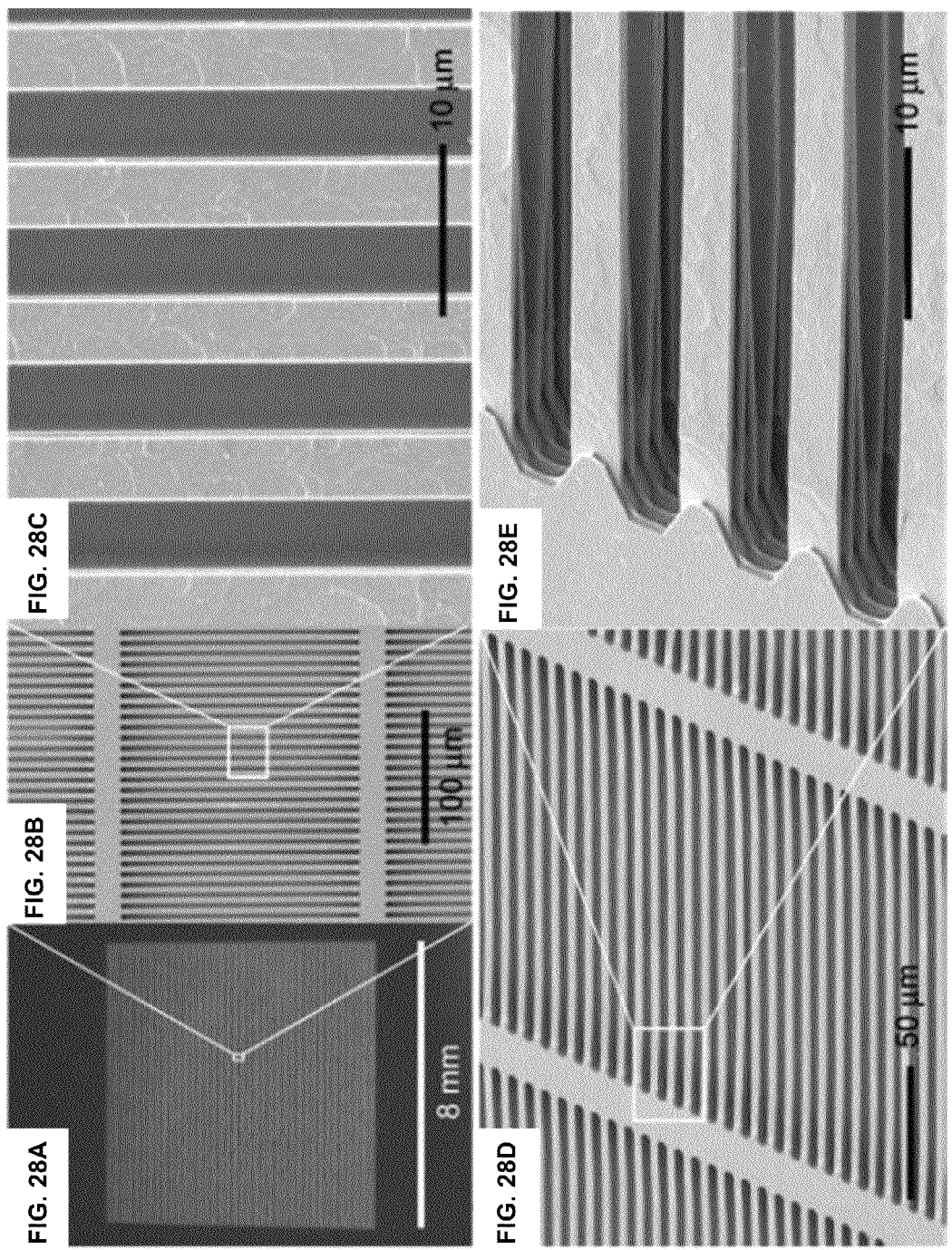
FIG. 28A is a photograph of a large, aligned array of a four-layer stack of Si(111) ribbons. Top view (FIGS. 28B and 28C) and angled view (FIGS. 28D and 28E) of scanning electron micrographs of the sample shown in FIG. 28A. The anchor structures at the ends of the ribbons leaves them attached to the underlying wafer, in a manner that preserves their lithographically defined positions, even after they have been completely undercut by the anisotropic etchant.
Figure 29:
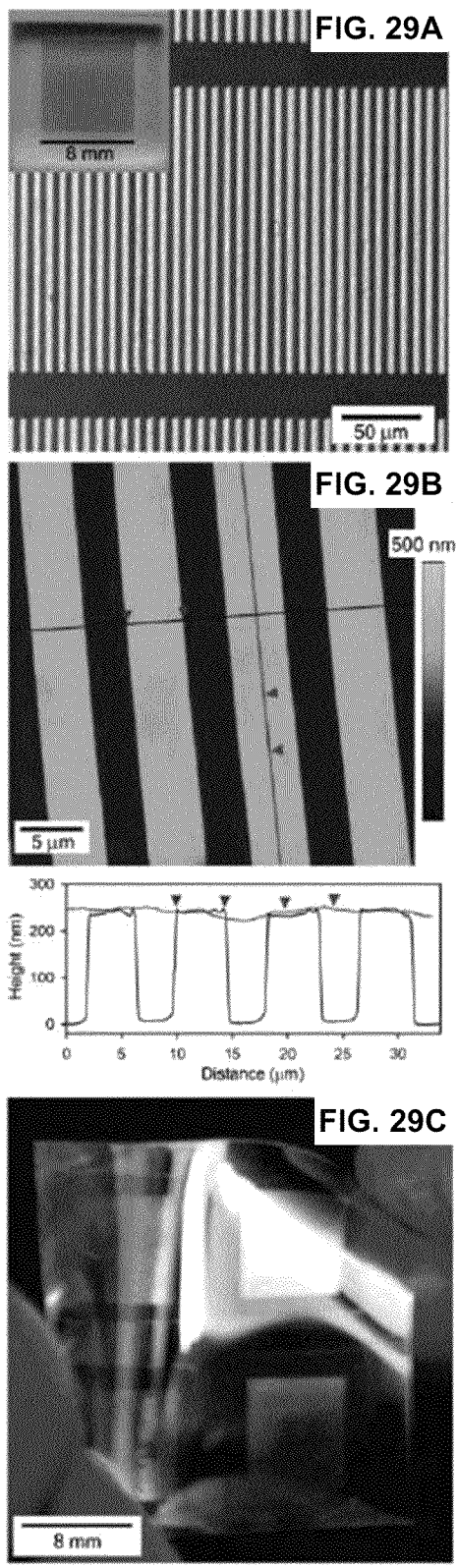
FIG. 29A is an image of aligned Si(111) ribbons transfer printed onto a substrate of poly(dimethylsiloxane).
FIG. 29B: Atomic force microscope image and line scan from four ribbons from the array shown in FIG. 29A.
FIG. 29C: Photograph of a flexible polyester film that supports four separate patches of Si(111) ribbon arrays produced by four cycles of transfer printing using a single processed Si chip.
Figure 31:
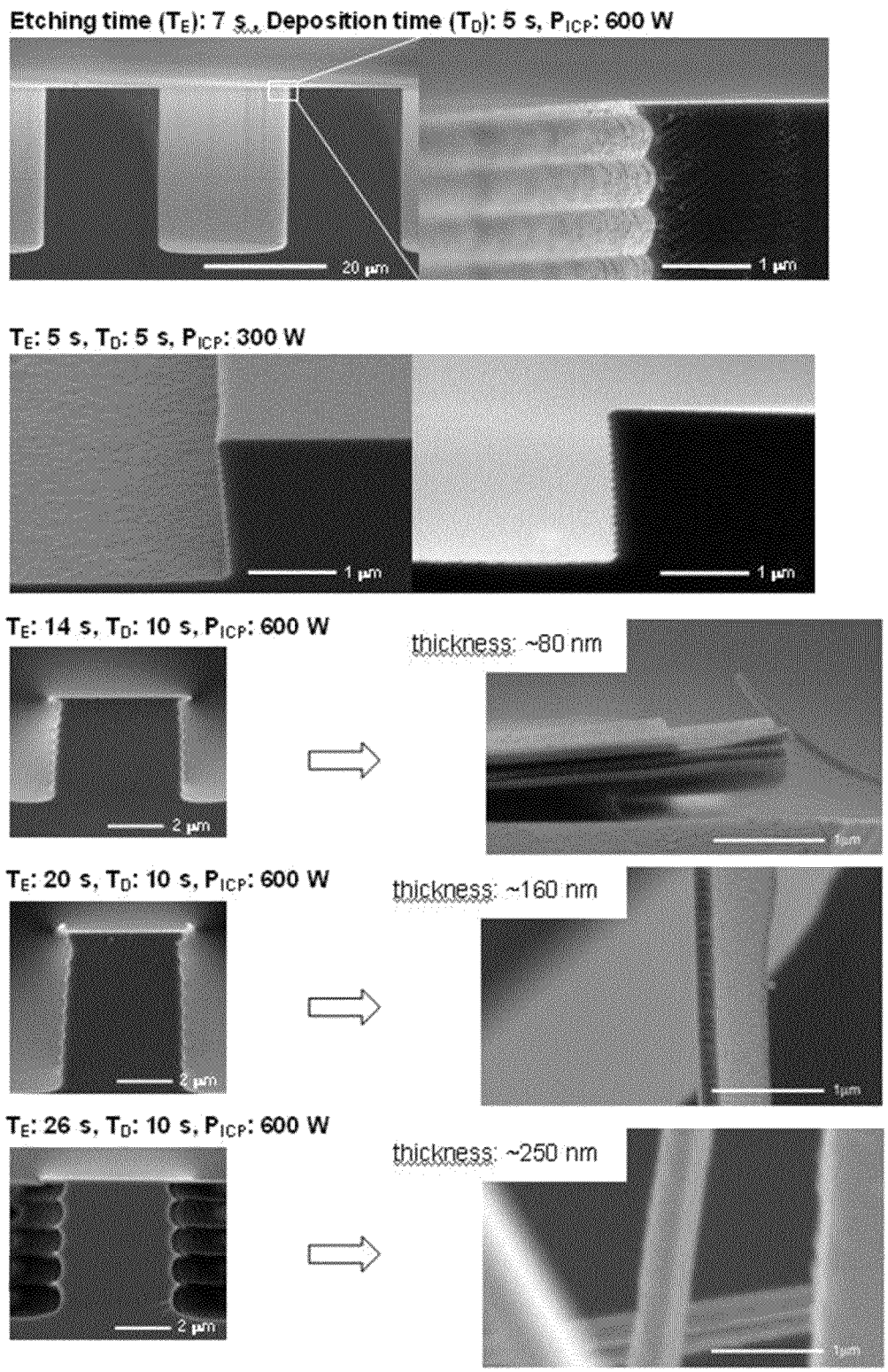
FIG. 31 shows various sidewalls according to different STS-ICPRIE conditions and silicon nanoribbons with different thicknesses.
Figure 32:
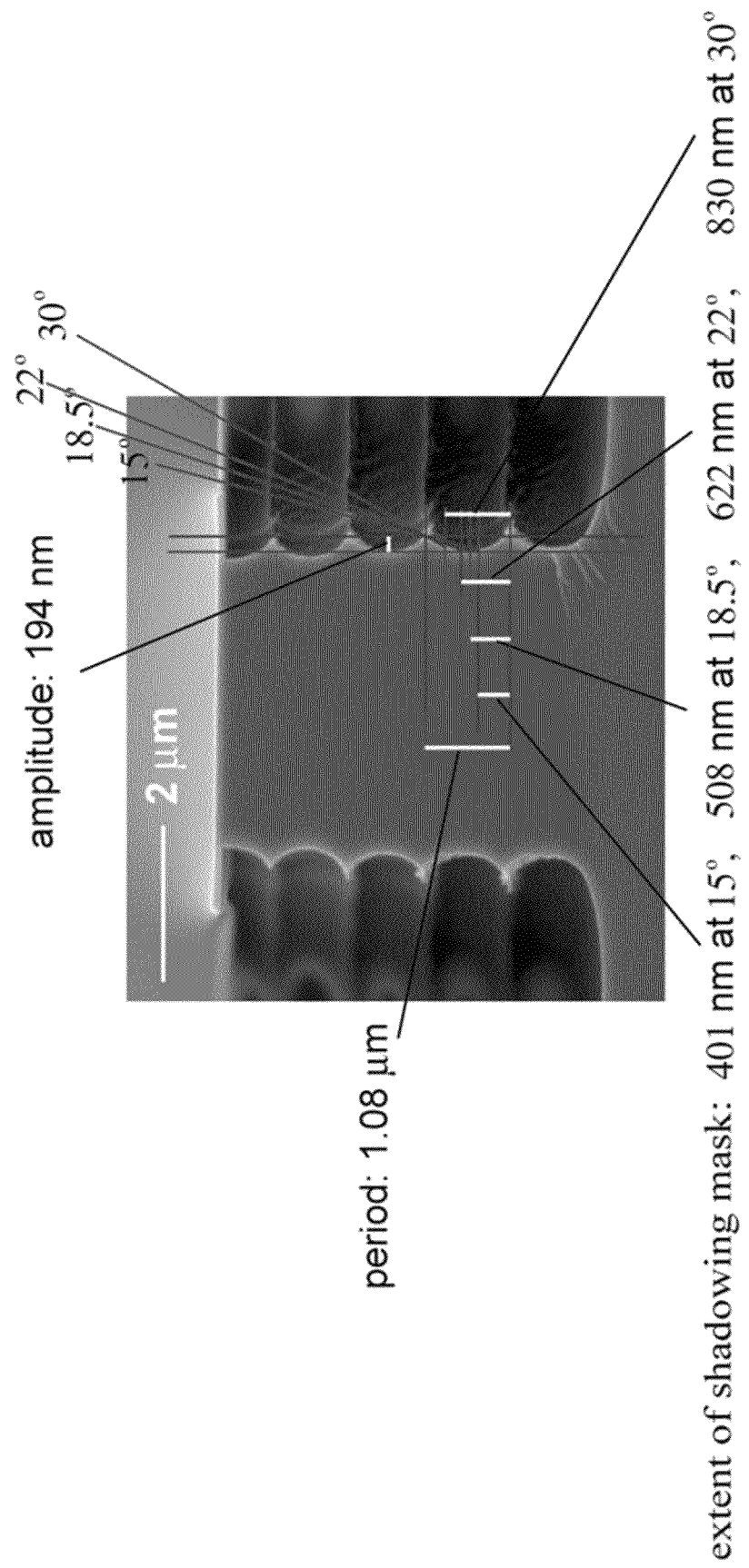
FIG. 32 shows the extent of shadowing mask vs. angles for electron beam evaporation.
Figure 33A:
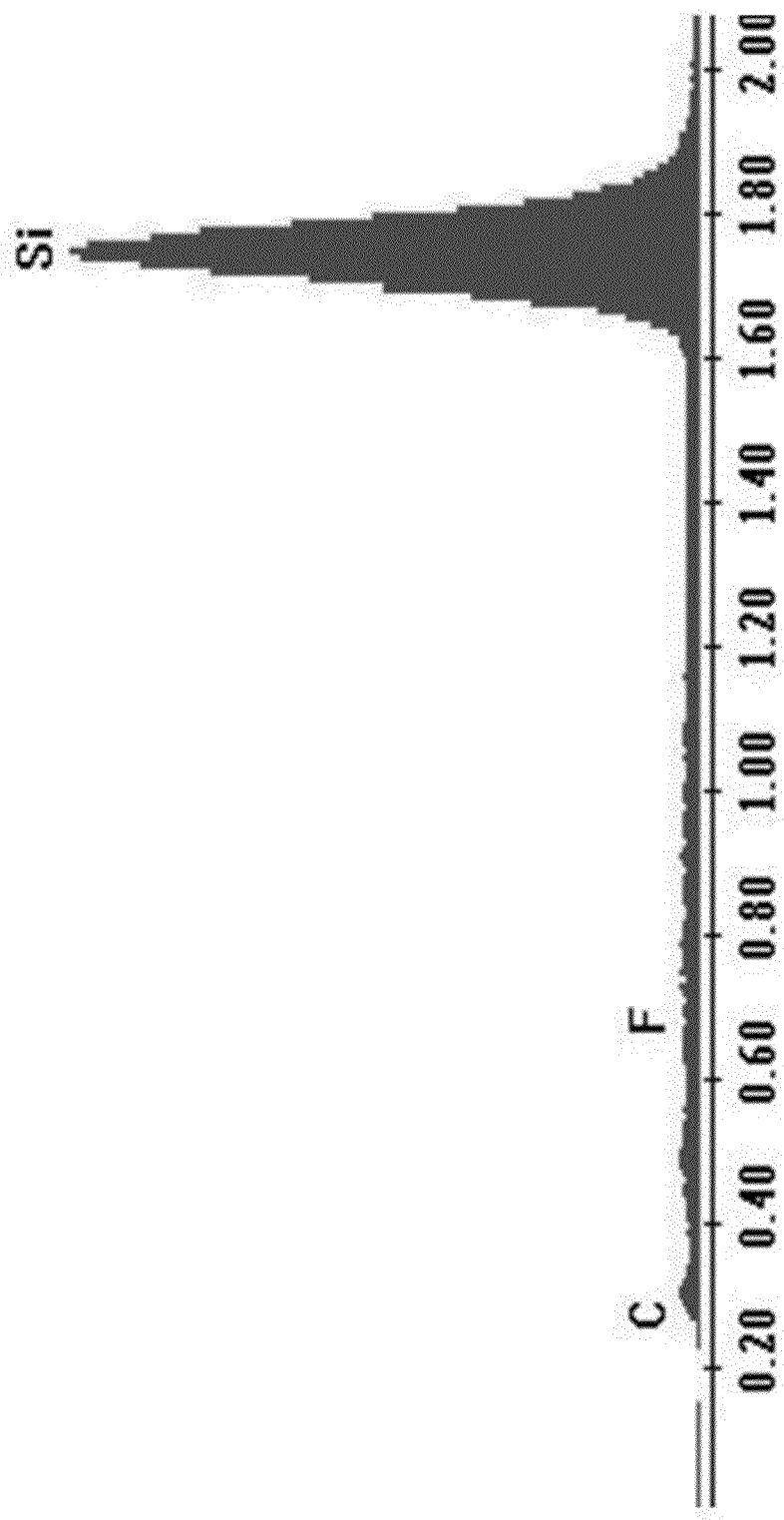
FIG. 33A-33C shows an EDAX energy dispersive spectroscopy (EDS) study.
Figure 33B:
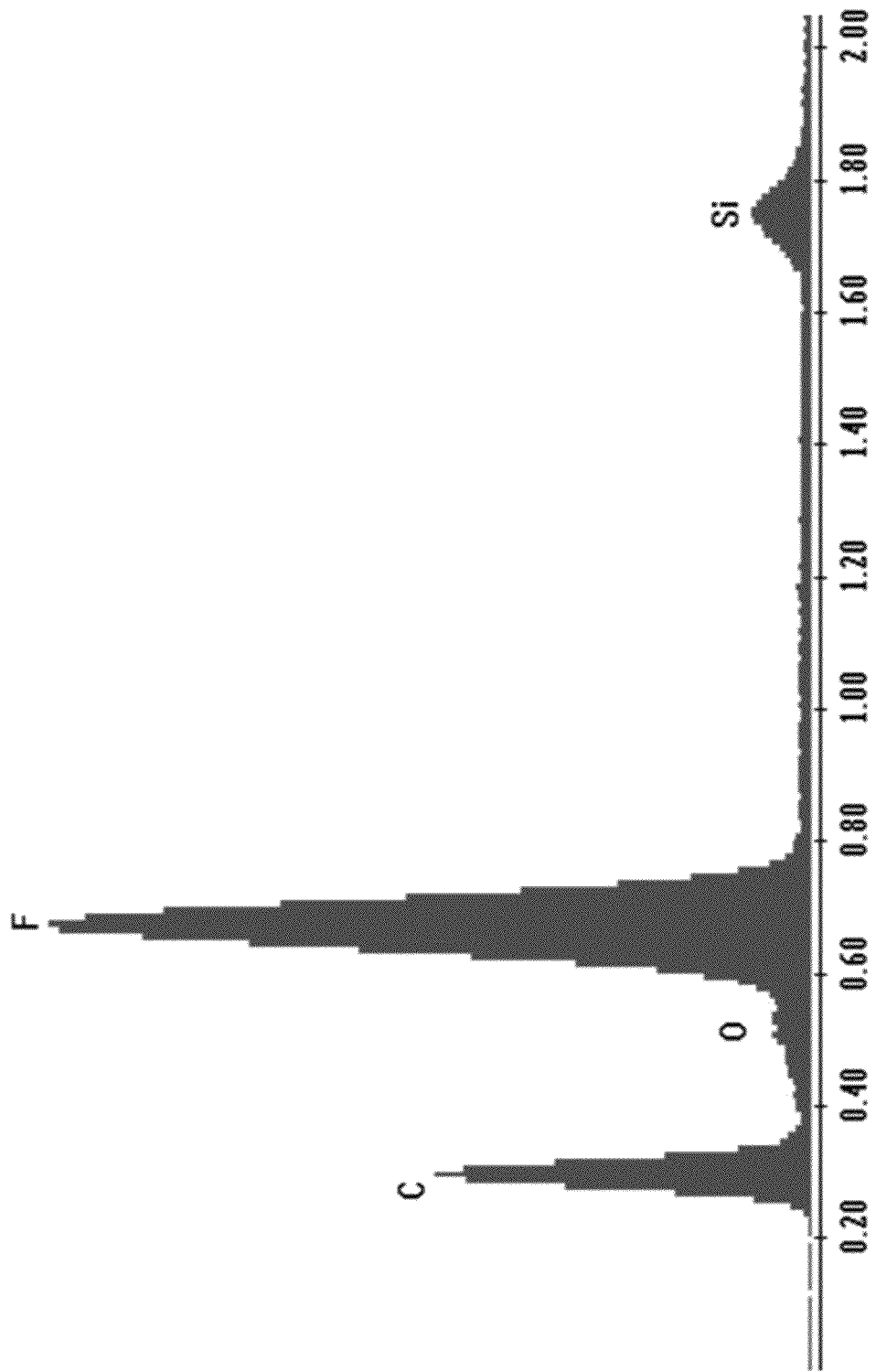
Figure 33C:
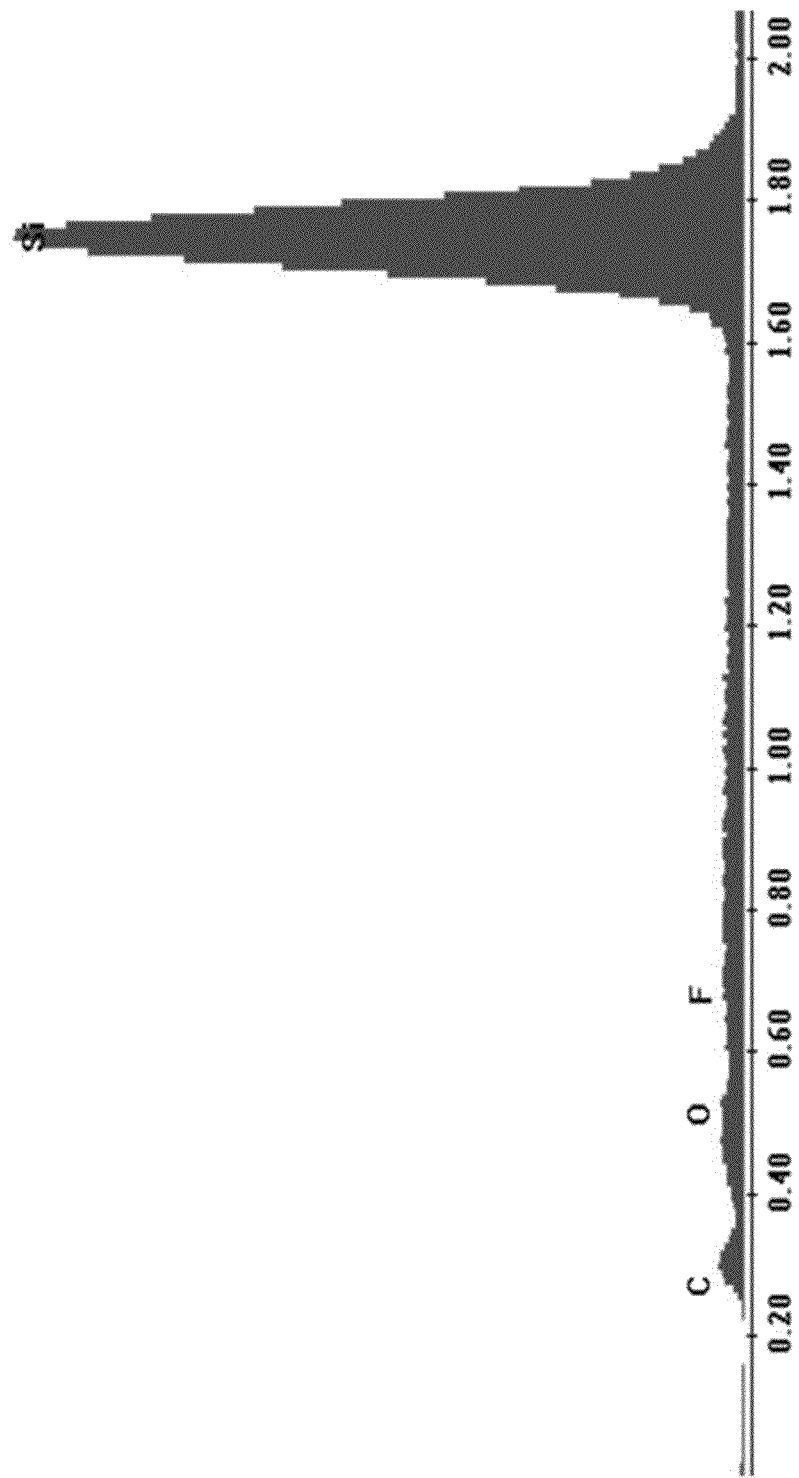
Figure 34:
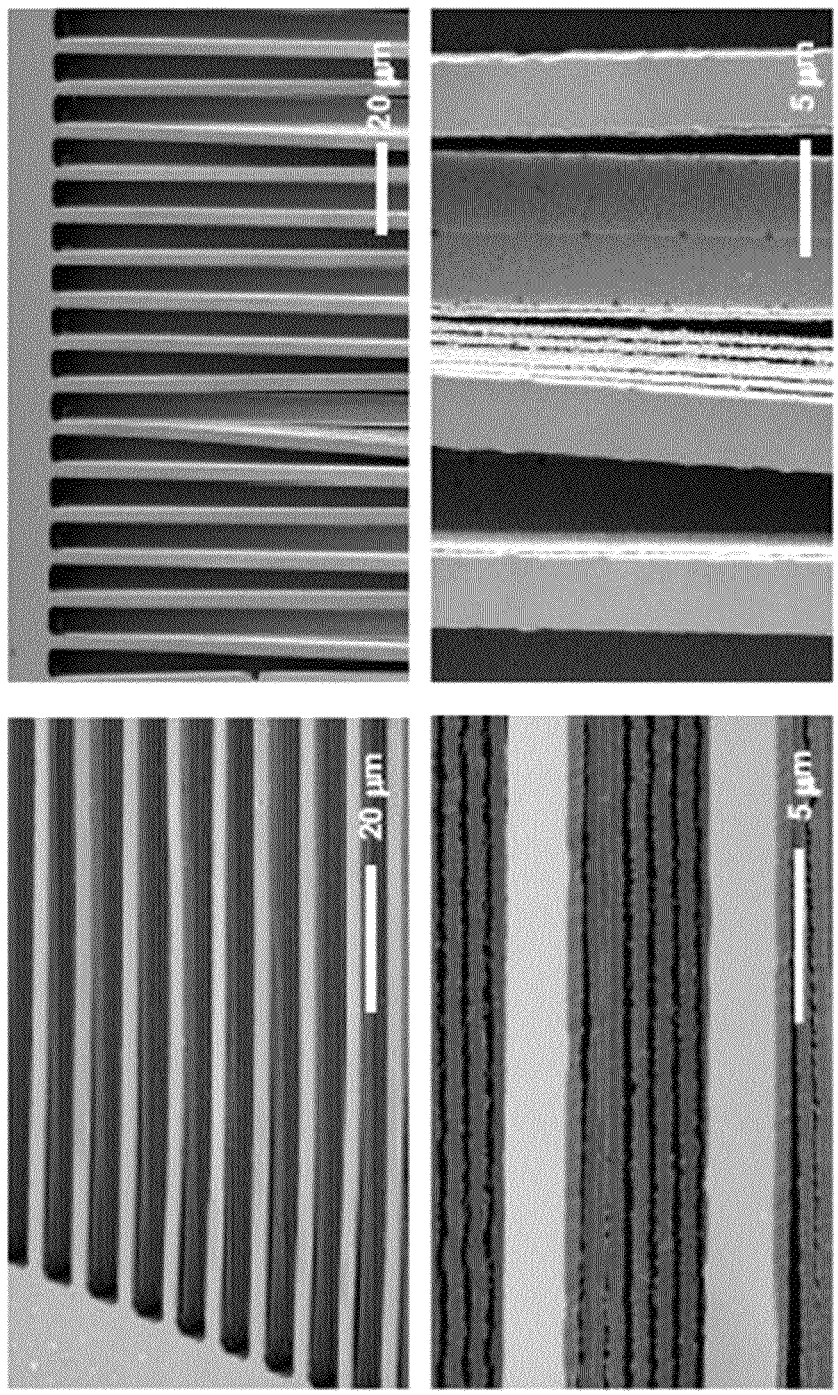
FIG. 34 shows a series of 7-layered Si ribbons.

The anchoring approach illustrated in FIG. 17 represents one possibility, in which the lithographically defined alignment and orientation of the ribbons are maintained throughout the fabrication and integration process. FIG. 28 shows images of a Si chip (total pattern size: 8×8 mm$^2$) with aligned four-layered stacks of ribbons (width=4 µm, length=190 µm, thickness=~250 nm) anchored to the wafer at their ends. The optical micrograph of FIG. 28A shows 1.5×10$^5$ ribbons. The scanning electron micrographs highlight the anchors and the etch planes (FIG. 28B-28E). The KOH etch front advances in the <110> direction, but the front terminates at {111} planes (i.e., slowest etching plane), as seen in FIG. 28E where the structure tapers into triangular-shaped anchors that meet at a point where two {111} planes intersect. Soft printing processes can transfer these ribbons, one layer at a time, onto other substrates, using the procedures of FIG. 17. FIG. 29A shows an example of Si ribbon arrays (thickness=235 nm, width=4.8 µm, length=190 µm) transferred from the top layer onto a PDMS substrate. The thickness variations arising from previously mentioned factors appear as color variations in the optical image of FIG. 29A, tapered thickness profiles in FIG. 29B, and discontinuities when the ribbons are very thin (e.g., lower than 40 nm). The atomic force microscopy (AFM) image reveals well-separated steps (or terraces, with heights of up to 10 nm) on the surfaces of the ribbons. The surface roughness of areas (1×1 µm$^2$) that do not include these steps is ~0.6 nm, compared to ~3 nm in similar sized areas that include these steps. Similar structures have been observed on the surfaces of Si(111) wafers etched by KOH.[15] Such structures cause some color variations in the optical images. The roughness value of 0.6 nm is somewhat larger than that of the top polished surface of the wafer (0.12 nm), of structures generated from a silicon-on-insulator (SOI) substrates (0.18 nm), or of ribbons generated from the top surface of a Si wafer (0.5 nm). The roughness originates from the same effects that determine the variations in thickness, as discussed previously. Thickness variations along typical ribbons were ~±15 nm. Variations in the average thicknesses of ribbons in a given array were ~±3 nm. FIG. 29C displays four areas of ribbon arrays formed on an ITO-coated PET substrate by four cycles of printing, using a single processed Si wafer. The yields on the printed ribbons were 98% for the first layer, 94% for the second layer, 88% for the third layer, and 74% for the fourth layer. The lower yield for the fourth layer was mainly due to imperfect transfer from the wafer to the PDMS. Incomplete transfer from an upper layer leaves partially detached ribbons on the wafer that can interfere with subsequent printing cycles.

To demonstrate one possible use of printed ribbon arrays in electronics, we fabricated field effect transistors (FIGS. 30A and 30B). The substrate was polyimide (PI, thickness=25 µm), the gate electrode was Cr/Au (thickness=3/40 nm), and the gate dielectric consisted of a layer of SiO$_2$ (thickness=170 nm) and the SU-8 adhesive coating from the procedures of FIG. 17. The transferred Si ribbon arrays sank approximately 35 nm into the SU-8, leaving a residual 100 nm of SU-8 between the bottom surface of the Si ribbons and the SiO$_2$ gate dielectric, as measured by AFM. Thick electrode pads (Ti, 250 nm) defined by photolithography (100 µm length× 100 µm width, spanning 10 Si ribbons) and wet etching with Ti etchant (TFTN, Transene Co.) formed Schottky barrier contacts for the source and drain. These bottom-gate devices showed n-type enhancement mode gate modulation (FIGS. 30C and 30D), consistent with similar devices formed on SOI wafers using similar processing conditions. The transistors exhibited on/off ratios of ~3×10$^4$. The linear regime, per ribbon mobilities (fill factor 35%) correspond to 190 cm$^2$V$^{-1}$s$^{-1}$ for the first layer and 130 cm$^2$V$^{-1}$s$^{-1}$ for the second layer. These values are somewhat lower than those that we have obtained using SOI wafers and otherwise similar device processing steps.[7,11] We speculate that the larger roughness in the ribbons used here is partly a cause of this difference. Also, it is well-known that the interface charge density on the (111) plane is almost 10 times larger than that on the (100) plane for the Si—SiO$_2$ interface; annealing in hydrogen can reduce the value significantly.[17]

In summary, this Example demonstrates a simple fabrication strategy for producing bulk quantities of single-crystal silicon micro-/nanoribbons from bulk silicon (111) wafers. Each layer in the multilayer stacks produced by this approach can be separately transfer printed onto other substrates, for integration into devices such as transistors. The simplicity of the procedures, the ability to form organized arrays for devices, the high quality of the materials, and the potential for other device possibilities such as sensors, photodetectors and perhaps photovoltaics, in addition to electronic circuits, suggest potential value for this type of approach to silicon ribbons.

Photomicrographs of various sidewalls according to different STS-ICPRIE conditions and silicon nanoribbons with different thicknesses, the extent of shadowing mask vs angles for electron beam evaporation, and seven-layered Si ribbons and spectra from a EDAX energy dispersive spectroscopy (EDS) study are provided in FIGS. 31-34.

REFERENCES (1) (a) Wagner, R. S.; Ellis, W. C. *Appl. Phys. Lett.* 1964, 4, 89. (b) Holmes, J. D.; Johnston, K. P.; Doty, R. C.; Korgel, B. A. *Science* 2000, 287, 1471. (c) Yu, J.-Y.; Chung, S.-W.; Heath, J. R. *J. Phys. Chem. B* 2000, 104, 11864. (d) Wu, Y.; Yang, P. J. *Am. Chem. Soc.* 2001, 123, 3165. (e) Wu, Y.; Fan, R.; Yang, P. *Nano Lett.* 2002, 2, 83. (f) Shi, W.-S.; Peng, H.-Y.; Zheng, Y.-F.; Wang, N.; Shang, N.-G.; Pan, Z.-W.; Lee, C.-S.; Lee, S.-T. *AdV. Mater.* 2000, 12, 1343. (g) Wu, Y.; Xiang, J.; Yang, C.; Lu, W.; Lieber, C. M. *Nature* 2004, 430, 61. (h) Lu, W.; Xiang, J.; Timko, B. P.; Wu, Y.; Lieber, C. M. *Proc. Natl. Acad. Sci.* U.S.A. 2005, 102, 10046. (i) Xiang, J.; Lu, W.; Hu, Y.; Wu, Y.; Yan, H.; Lieber, C. M. *Nature* 2006, 441, 489.

(2) (a) Shi, W.; Peng H.; Wang, N.; Li, C. P.; Xu, L.; Lee, C. S.; Kalish, R.; Lee, S.-T. *J. Am. Chem. Soc.* 2001, 123, 11095. (b) Zhang, R.-Q.; Lifshitz, Y.; Lee, S.-T. *AdV. Mater.* 2003, 15, 635. (c) Shan, Y.; Kalkan, A. K.; Peng, C.-Y.; Fonash, S. J. *Nano Lett.* 2004, 4, 2085.

(3) (a) Pan, Z. W.; Dai, Z. R.; Wang, Z. L. *Science* 2001, 291, 1947. (b) Li, Y. B.; Bando, Y.; Sato, T.; Kurashima, K. *Appl. Phys. Lett.* 2002, 81, 144. (c) Arnold, M. S.; Avouris, P.; Pan, Z. W.; Wang, Z. L. *J. Phys. Chem. B* 2003, 107, 659. (d) Dai, Z. R.; Pan, Z. W.; Wang, Z. L. *J. Phys. Chem. B* 2002, 106, 902. (e) Wen, X.; Wang, S.; Ding, Y.; Wang, Z. L.; Yang, S. *J. Phys. Chem. B* 2005, 109, 215. (f) Kong, X. Y.; Wang, Z. L. *Solid State Commun.* 2003, 128, 1.

(4) (a) Kar, S.; Satpati, B.; Satyam, P. V.; Chaudhuri, S. *J. Phys. Chem. B* 2005, 109, 19134. (b) Kar, S.; Chaudhuri, S. *J. Phys. Chem. B* 2006, 110, 4542. (c) Kar, S.; Chaudhuri, S. *J. Phys. Chem. B* 2005, 109, 3298. (d) Li, Y.; Zou, K.; Shan, Y. Y.; Zapien, J. A.; Lee, S.-T. *J. Phys. Chem. B* 2006, 110, 6759. (e) Zhang, Z.; Wang, J.; Yuan, H.; Gao, Y.; Liu, D.; Song, L.; Xiang, Y.; Zhao, X.; Liu, L.; Luo, S.; Dou, X.; Mou, S.; Zhou, W.; Xie, S. *J. Phys. Chem. B* 2005, 109, 18352. (f) Wang, Z.

Q.; Gong, J. F.; Duan, J. H.; Huang, H. B.; Yang, S. G.; Zhao, X. N.; Zhang, R.; Du, Y. W. *Appl. Phys. Lett.* 2006, 89, 033102.

(5) Bae, S. Y.; Seo, H. W.; Park, J.; Yang, H.; Park, J. C.; Lee, S. Y. *Appl. Phys. Lett.* 2002, 81, 126.

(6) (a) Ma, C.; Ding, Y.; Moore, D.; Wang, X.; Wang, Z. L. *J. Am. Chem. Soc.* 2004, 126, 708. (b) Ding, Y.; Ma, C.; Wang, Z. L. *AdV. Mater.* 2004, 16, 1740. (c) Joo, J.; Son, J. S.; Kwon, S. G.; Yu, J. H.; Hyeon, T. *J. Am. Chem. Soc.* 2006, 128, 5632. (d) Zhang, X. T.; Ip, K. M.; Liu, Z.; Leung, Y. P.; Li, Q.; Hark, S. K. *Appl. Phys. Lett.* 2004, 84, 2641. (e) Xie, Q.; Liu, Z.; Shao, M.; Kong, L.; Yu, W.; Qian, Y. *J. Cryst. Growth* 2003, 252, 570.

(7) (a) Menard, E.; Lee, K. J.; Khang, D.-Y.; Nuzzo, R. G.; Rogers, J. A. *Appl. Phys. Lett.* 2004, 84, 5398. (b) Menard, E.; Nuzzo, R. G.; Rogers, J. A. *Appl. Phys. Lett.* 2005, 86, 093507. (c) Zhu, Z.-T.; Menard, E.; Hurley, K.; Nuzzo, R. G.; Rogers, J. A. *Appl. Phys. Lett.* 2005, 86, 133507. (d) Khang, D.-Y.; Jiang, H.; Huang, Y.; Rogers, J. A. *Science* 2006, 311, 208. (e) Sun, Y.; Kumar, V.; Adesida, I.; Rogers, J. A. *AdV. Mater.* 2006, in press.

(8) (a) Zhang, P.; Tevaarwerk, E.; Park, B.-N.; Savage, D. E.; Geller, G. K.; Knezevic, I.; Evans, P. G.; Eriksson, M. A.; Lagally, M. G. *Nature* 2006, 439, 703. (b) Roberts, M. M.; Klein, L. J.; Savage, D. E.; Slinker, K. A.; Friesen, M.; Geller, G.; Eriksson, M. A.; Lagally, M. G. *Nat. Mater.* 2006, 5, 388.

(9) (a) Huang, M.; Boone, C.; Roberts, M.; Savage, D. E.; Lagally, M. G.; Shaji, N.; Qin, H.; Blick, R.; Nairn, J. A.; Liu, F. *AdV. Mater.* 2005, 17, 2860. (b) Zhang, L.; Ruh, E.; Grützmacher, D.; Dong, L.; Bell, D. J.; Nelson, B. J.; Schönenberger, C. *Nano Lett.* 2006, 6, 1311.

(10) (a) Desai, T. A.; Hansford, D. J.; Kulinsky, L.; Nashat, A. H.; Rasi, G.; Tu, J.; Wang, Y.; Zhang, M.; Ferrari, M. *Biomed. MicrodeVices* 1999, 2, 11. (b) Bhushan, B.; Kasai, T.; Nguyen, C. V.; Meyyappan, M. *Microsyst. Technol.* 2004, 10, 633.

(11) Mack, S.; Meitl, M. A.; Baca, A. J.; Zhu, Z.-T.; Rogers, J. A. *Appl. Phys. Lett.* 2006, 88, 213101.

(12) (a) Létant, S. E.; Hart, B. R.; Van Buuren, A. W.; Terminello, L. J. *Nat. Mater.* 2003, 2, 391. (b) Storm, A. J.; Chen, J. H.; Ling, X. S.; Zandbergen, H. W.; Dekker, C. *Nat. Mater.* 2003, 2, 537.

(13) (a) Gmbh, R. B. U.S. Pat. No. 4,855,017, U.S. Pat. No. 4,784,720, German Patent 424104501, 1994. (b) Ayo'n, A. A.; Braff, R.; Lin, C. C.; Sawin, H. H.; Schmidt, M. A. *J. Electrochem. Soc.* 1999, 146, 339. (c) Chen, K.-S.; Ayo'n, A. A. *J. Microelectromech. Syst.* 2002, 11, 264.

(14) (a) Madou, M. Fundamentals of Microfabrication; CRC Press LLC: Boca Raton, Fla., 1997; pp 177-187. (b) Chou, B. C. S.; Chen C.-N.; Shie, J.-S. *Sens. Actuators, A* 1999, 75, 271. (c) Lee, S.; Park, S.; Cho D. *J. Microelectromech. Syst.* 1999, 8, 409. (d) Ensell, G. *J. Micromech. Microeng.* 1995, 5, 1. (e) Kandall, D. L. *Annu. ReV. Mater. Sci.* 1979, 9, 373.

(15) Meitl, M. A.; Zhu, Z.-T.; Kumar, V.; Lee, K. J.; Feng, X.; Huang, Y. Y.; Adesida, I.; Nuzzo, R. G.; Rogers, J. A. *Nat. Mater.* 2006, 5, 33.

(16) Garcia, S. P.; Bao, H.; Hines, M. A. *Phys. ReV. Lett.* 2004, 93, 166102.

(17) (a) Streetman, B. G.; Banerjee, S. *Solid State Electronic Devices*, 5th ed.; Prentice Hall: Upper Saddle River, N.J., 2000; pp 274-275. (b) Razouk, R. R.; Deal, B. E. *J. Electrochem. Soc.* 1979, 126, 1573. (c) Kato, Y.; Takao, H.; Sawada, K.; Ishida, M. *Jpn. J. Appl. Phys.* 2004, 43, 6848.

U.S. patent application Ser. Nos. 11/115,954, now U.S. Pat. No. 7,195,733; Ser. No. 11/145,574, now U.S. Pat. No. 7,622,367; Ser. No. 11/145,542, now U.S. Pat. No. 7,557,367; 60/863,248, Ser. Nos. 11/465,317, 11/423,287, now U.S. Pat. No. 7,521,292; Ser. No. 11/423,192, now U.S. Pub. No. US-2009-0199960-A1; and Ser. No. 11/421,654, now U.S. Pat. No. 7,799,699 are hereby incorporated by reference to the extent not inconsistent with the present description.

All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

TABLE 1

Examples of selective etch materials systems

| Functional material | Sacrificial layer | Undercut agent | Application |
|---|---|---|---|
| GaAs, InP, $Al_xGa_{1-x}As$ (x < about 50%), InGaAlAsP with composition of AlAs < | $Al_xGa_{1-x}As$ with x greater than or equal to about 0.7, | Hydrofluoric acid, Hydrofluoric acid vapor, buffered oxide | LEDs, photovoltaics, electronics (transistors, diodes, etc.), photodiodes, |

TABLE 1-continued

Examples of selective etch materials systems

| Functional material | Sacrificial layer | Undercut agent | Application |
|---|---|---|---|
| about 50%, C, Si, Ge, SiC, SiGe, Au, Ag, Cu, Pd, Pt, assorted multiple layers of above materials (crystalline or amorphous; unsure about amorphous compound semiconductors) | AlSb, GaSb, $SiO_2$ | etch | waveguides etc. |
| Same as above | Organic polymer | Burn in air/oxygen at 300-500° C. | Same as above |
| GaAs | $GaAs_{1-x}N_y$ (y < x < 1), nitrogen implanted | Aqueous NaOH (1N) | Same as above |
| InGaAlN | Si | Warm strong aqueous base (TMAH, KOH, etc.) | Same as above |
| $In_{1-y}Ga_yAs_xP_{1-x}$ (x, y < about 0.05) | InGaAs | $HF:H_2O_2:H_2O$ | Same as above |
| $Al_xGa_{1-x}As$ (x > about 0.9) | GaAs | Citric Acid:$H_2O_2$:$H_2O$ | Same as above |

TABLE 2

Functional layer composition useful in producing LEDs (see FIG. 3E)

| | | | | |
|---|---|---|---|---|
| 1 | GaAs:C | 5 nm | 1019 | P-contact |
| 2 | Al0.45Ga0.55As:C | 800 nm | 1018 | P-spreader |
| 3 | Al0.5In0.5P:Mg | 200 nm | 1018 | Cladding |
| 4 | Al0.25Ga0.25In0.5P | 6 nm | Undoped | Barrier |
| 5 | Ga0.44In0.56P | 6 nm | Undoped | Q-well |
| 6 | Al0.25Ga0.25In0.5P | 6 nm | Undoped | Barrier |
| 7 | Ga0.44In0.56P | 6 nm | Undoped | Q-well |
| 8 | Al0.25Ga0.25In0.5P | 6 nm | Undoped | Barrier |
| 9 | Ga0.44In0.56P | 6 nm | Undoped | Q-well |
| 10 | Al0.25Ga0.25In0.5P | 6 nm | Undoped | Barrier |
| 11 | Ga0.44In0.56P | 6 nm | Undoped | Q-well |
| 12 | Al0.25Ga0.25In0.5P | 6 nm | undoped | Barrier |
| 13 | Al0.5In0.5P | 200 nm | 1018 | Cladding |
| 14 | Al0.45Ga0.55As:Te | 800 nm | 1018 | N-spreader |
| 15 | GaAs:Te | 500 nm | 1019 | N-contact |

We claim:

1. A method for making a device or device component, said method comprising the steps of:
   providing a sacrificial layer on at least a portion of a substrate surface, said sacrificial layer having a receiving surface;
   patterning said sacrificial layer to generate a pattern of exposed substrate surface;
   depositing a functional layer on at least a portion of said sacrificial layer receiving surface and exposed substrate surface pattern, thereby generating a plurality of functional layer anchors corresponding to said pattern of exposed substrate;
   releasing at least a portion of said functional layer, wherein the plurality of functional layer anchors remain at least partially anchored to said substrate and at least a portion of said functional layer not anchored to said substrate is released, thereby generating a plurality of transferable structures; and
   printing said plurality of transferable structures onto a device substrate or device component supported by a device substrate;
   wherein said functional layer is part of a multilayer structure, and the multilayer structure comprises a plurality of functional layers and adjacent functional layers are separated by a sacrificial layer.

2. The method of claim 1, wherein the releasing step comprises:
   contacting an elastomeric stamp to at least a portion of said functional layer; and
   removing said stamp from contact with said functional layer, thereby removing at least a portion of said functional layer that is not anchored to said substrate.

3. The method of claim 1, wherein the releasing step comprises:
   contacting said device substrate surface to at least a portion of said functional layer; and
   removing said device substrate surface from contact with said functional layer, thereby transferring at least a portion of said functional layer that is not anchored to said substrate to said device substrate or device component supported by said device substrate surface.

4. The method of claim 1, wherein the releasing step uses a technique selected from the group consisting of:
   etching said sacrificial layer;
   thermally shocking said sacrificial layer;
   ablating or decomposing by exposure of said sacrificial layer to radiation from a laser source; and
   decomposing said sacrificial layer by contacting said sacrificial layer with a chemical agent.

5. A method for generating a multilayer array of transferable semiconductor elements, said method comprising the steps of:
   providing a substrate having an external surface;
   providing a multilayer structure supported by said external surface of said substrate, wherein said multilayer structure comprises an alternating sequence of semiconductor layers and sacrificial layers;
   generating one or more recess features by removing material from said multilayer structure; and
   depositing or coating a heterogeneous anchor element in said one or more recess features, thereby anchoring at least a portion of each of said semiconductor layers to said substrate external surface, or one or more semiconductor layers beneath a semiconductor top-layer of said multilayer structure, or both.

6. The method of claim 5, wherein said recess feature traverses from a top layer of said multilayer structure to said substrate external surface thereby exposing regions of said substrate external surface, and said heterogeneous anchor element anchors each of said semiconductor layers to said substrate external surface.

7. The method of claim 5, wherein said recess feature traverses from a first semiconductor top layer of said multilayer structure to a second semiconductor layer beneath said top-layer, and said heterogeneous anchor element anchors said first semiconductor layer to said second semiconductor layer.

8. The method of claim 5 wherein said depositing or coating step is carried out using a technique selected from the group consisting of: vapor-phase epitaxy, molecular-beam epitaxy, evaporation deposition, metalorganic chemical vapor deposition, chemical vapor deposition, physical vapor deposition, sputtering deposition, sol-gel coating, electron beam evaporation deposition, plasma-enhanced chemical vapor deposition, atomic layer deposition, liquid phase epitaxy, electrochemical deposition, and spin coating.

9. The method of claim 7, further comprising:
selectively removing said sacrificial layer that is beneath said first semiconductor top-layer;
releasing said first semiconductor top layer;
removing said anchor element,
and repeating said generating and depositing steps, thereby anchoring said second semiconductor layer to a third semiconductor layer that is beneath said second semiconductor layer.

10. The method of claim 9, wherein the process is repeated until all the semiconductor layers are removed from said substrate external surface.

11. The method of claim 10, wherein said substrate comprises a wafer, and said substrate is reused to support a second multilayer structure.

12. The method of claim 6 further comprising:
removing said sacrificial layers;
releasing said semiconductor layers;
removing said anchor elements; and
reusing said substrate by providing a second multilayer structure supported by said external surface of said substrate and repeating said steps for generating an anchor that anchors each of said semiconductor layers to said substrate external surface.

13. A method of making a transferable semiconductor element anchored to a substrate, said method comprising:
generating said transferable semiconductor element supported by an external surface of said substrate;
providing a heterogeneous anchor element in physical contact with said transferable semiconductor element and in physical contact with said substrate or a structure provided thereon, thereby anchoring said semiconductor element to said substrate;
providing a release layer at least partially positioned between said transferable semiconductor element and said external surface of said substrate; and
releasing at least a portion of said transferable semiconductor element by selectively removing said release layer, wherein said releasing step comprises controlled lift-off of said transferable semiconductor element at a breakable tether point that connects said transferable semiconductor element to said heterogeneous anchor.

14. The method of claim 13, wherein said selectively removing further comprises applying an etchant that preferentially etches said release layer.

15. The method of claim 14, wherein said heterogeneous anchor element comprises a resist material.

16. The method of claim 13, wherein the generating step comprises:
providing a plurality of functional layers, each functional layer comprising a transferable semiconductor element, wherein adjacent functional layers are separated by a release layer; and
removing a top-most functional layer by selectively removing said release layers, wherein said functional layers underlying said top-most layer remain anchored to said substrate by said heterogeneous anchor elements.

17. The method of claim 1, wherein the releasing step comprises: physically separating at least a portion of said functional layer from said substrate or sacrificial layer.

18. The method of claim 1, wherein the releasing is a sequential layer-by-layer release of the plurality of functional layers.

19. The method of claim 1, wherein the releasing is a simultaneous release of the plurality of functional layers.

20. The method of claim 5, wherein the heterogeneous anchor element comprises a lateral etch stop.

21. The method of claim 5, wherein said heterogeneous anchor element is a photoresist.

22. The method of claim 5, wherein said heterogeneous anchor element comprises silicon nitride.

* * * * *